United States Patent
Mukherjee

(10) Patent No.: US 8,184,712 B2
(45) Date of Patent: May 22, 2012

(54) ROBUST AND EFFICIENT COMPRESSION/DECOMPRESSION PROVIDING FOR ADJUSTABLE DIVISION OF COMPUTATIONAL COMPLEXITY BETWEEN ENCODING/COMPRESSION AND DECODING/DECOMPRESSION

(75) Inventor: Debargha Mukherjee, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1778 days.

(21) Appl. No.: 11/415,258

(22) Filed: Apr. 30, 2006

(65) Prior Publication Data
US 2007/0253479 A1 Nov. 1, 2007

(51) Int. Cl.
*H04N 7/18* (2006.01)
(52) U.S. Cl. .......... 375/240.21; 375/240.25; 375/240.26
(58) Field of Classification Search . 375/240.01–240.29
See application file for complete search history.

(56) References Cited

U.S. PATENT DOCUMENTS

| | | | |
|---|---|---|---|
| 6,323,412 B1 | 11/2001 | Loo | |
| 7,583,730 B2 * | 9/2009 | Wu et al. | 375/240.12 |
| 7,738,739 B2 * | 6/2010 | Altunbasak et al. | 382/300 |
| 2004/0001547 A1 | 1/2004 | Mukherjee | |
| 2004/0068401 A1 | 4/2004 | Herre | |
| 2005/0031219 A1 | 2/2005 | Puri | |
| 2005/0217461 A1 | 10/2005 | Wang | |

FOREIGN PATENT DOCUMENTS

| | | |
|---|---|---|
| DE | 10123366 | 8/2002 |
| WO | WO 2004049733 | 6/2004 |

OTHER PUBLICATIONS

Aaron Anne et al.: "Wyner-Ziv residual Coding of Video" Proc. Of the Picture Coding Symposium, XX, XX, 2006 pp. 1-5.
Artigas X et al.: "Iterative Generation of Motion-Compensation Side Information for Distributed video Codinga" Image Proc., 2005 ICIP Sep. 2005. IEEE Intn'l I Conf. on Geno.
J Ascenso et al.: "Improving Frame Interpolation with Spatial Motion Smoothing for Pixel Domain Distributed Video Coding" Proc., of 5th Earasip Conf., Jun. 29, 2002.
Aaron A et al: "Transform-domain Wyner-Ziv codec for video." Proc. of the SPIE, SPIE, Bellingham, VA US, vol. 5308 No. 1, Jan. 2004.
Majumdar A et al: "Robust distribution video compression based on multilevel coset codes" Conf. Record of the 37th. Asilomar Conf. on Signals, Sys., & Comp., Nov. 12, 2003.
Puri et al: "PRISM: A New Robust Video Coding Architecture Based on Distributed Compression Principles." Proc. of the Annual Allerton Conf. on Comm., Control & Comp., XX, XX 2.
Adikari et al.: "Wyneer-Ziv Coding with Temporal & Spatial Correlations for Motion Video" Elect. & Comp. Engineering Canadian Conf. on, IEEE, PI, May 2006 pp. 1188-1191.
Weerakkody et al.: "Distributed Video Coding of Wyner-Ziv Frames using Trellis Coded Modulation" Elec. & Comp. Engineering Canadian Conf. on, IEEE, PI, May 2006, pp. 314-317.
Joao Ascenso et al.: "Content Adaptive Wyner-Ziv Video Copding Driven by Motion Activity" Image Proc. 2006 IEEE Internatinal Conf. pm IEEE, PI Oct. 2006.

* cited by examiner

*Primary Examiner* — Andy Rao

(57) ABSTRACT

Various embodiments of the present invention include compression/decompression methods, systems, and devices that adjust a division of a total computational complexity of compression and decompression between encoding and decoding. These embodiments include an encoder that encodes a received signal at a selectable level of computational complexity and a decoder that decodes a received, encoded signal at a selectable level computational complexity. Video-codec embodiments of the present invention may be incorporated into relatively inexpensive video-recording devices, including hand-held, video-recording consumer devices such as video recorders and cell phones.

22 Claims, 42 Drawing Sheets

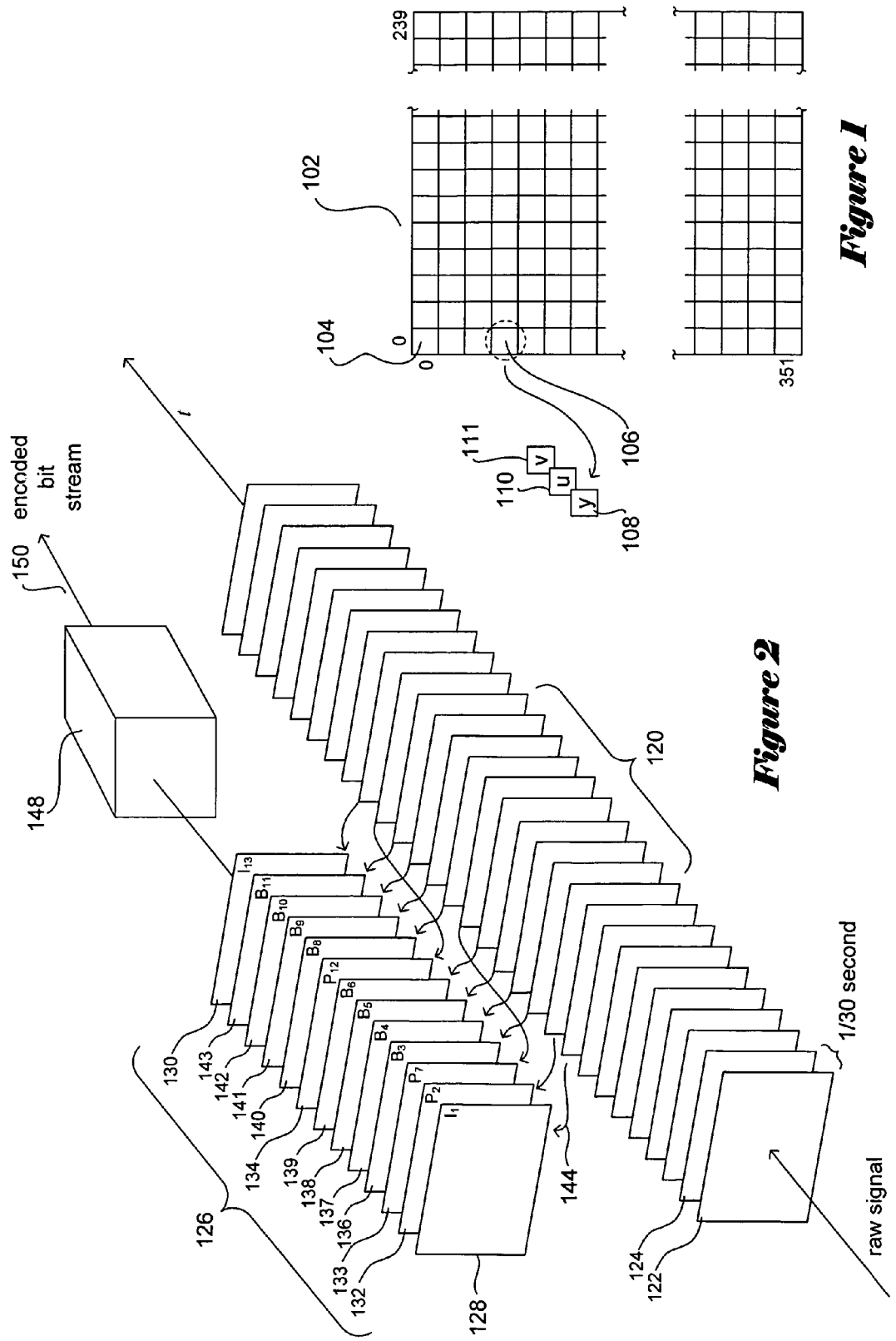

$$Q = \begin{matrix} [\phantom{0}8 & 16 & 19 & 22 & 26 & 27 & 29 & 34] \\ [16 & 16 & 22 & 24 & 27 & 29 & 34 & 37] \\ [19 & 22 & 26 & 27 & 29 & 34 & 34 & 38] \\ [22 & 22 & 26 & 27 & 29 & 34 & 37 & 40] \\ [22 & 26 & 27 & 29 & 32 & 35 & 40 & 48] \\ [26 & 27 & 29 & 32 & 35 & 40 & 48 & 58] \\ [26 & 27 & 29 & 34 & 38 & 46 & 56 & 69] \\ [27 & 29 & 35 & 38 & 46 & 56 & 69 & 83] \end{matrix}$$ ⎯702

$$QDCT = \frac{DCT_{(8x8)} * 8}{scale * Q}$$ ⎯704

*Figure 7*

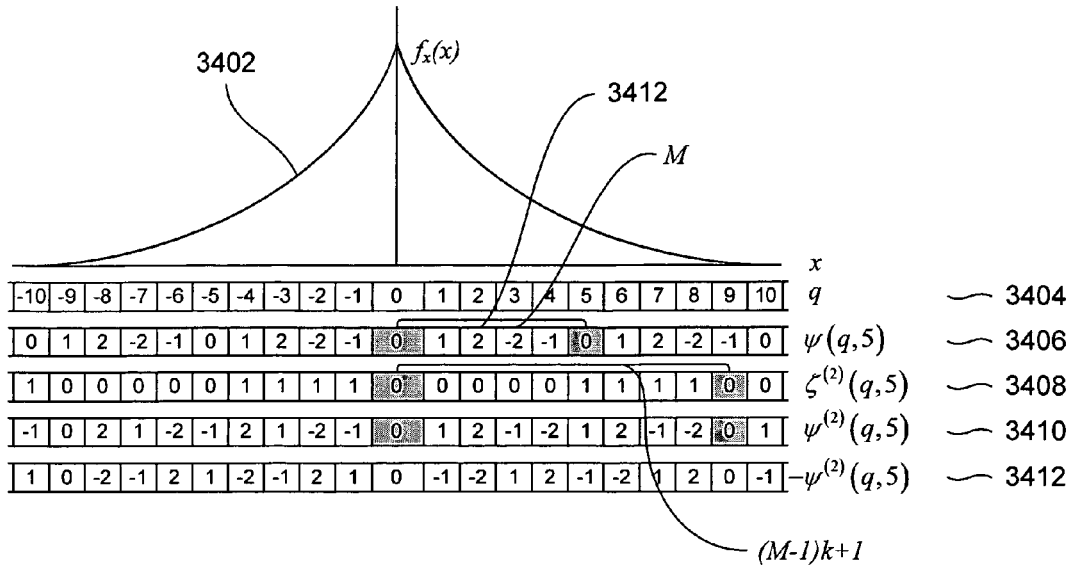

symbol function $\zeta^{(k)}(q,M)$ yields a $k$-$a$,$y$ symbol from $q$, and is defined as:

$$M^{(k)} = (M-1).k + 1$$
$$q^{(k)} = \left(|q| \bmod M^{(k)}\right)$$

$$\zeta^{(k)}(q,M) = \begin{cases} 0, & q^{(k)} = 0 \\ \left\lfloor (q^{(k)}-1)/(M-1) \right\rfloor & q > 0 \\ k-1-\left\lfloor (q^{(k)}-1)/(M-1) \right\rfloor & q < 0 \end{cases}$$

base coset function $\psi^{(k)}(q,M)$ is defined as:

$$M^{(k)} = (M-1).k + 1$$
$$q^{(k)} = \left(|q| \bmod M^{(k)}\right)$$
$$m = (M-1)/2$$

$$\psi^{(k)}(q,M) = \begin{cases} 0, & q^{(k)} = 0 \\ sign(q).\left\{\left(q^{(k)}-1\right) \bmod m + 1\right\}, & \left\lfloor \dfrac{q^{(k)}-1}{m} \right\rfloor \text{ is odd} \\ -sign(q).\left\{\left(q^{(k)}-1\right) \bmod m + 1\right\}, & \left\lfloor \dfrac{q^{(k)}-1}{m} \right\rfloor \text{ is even} \end{cases}$$

*Figure 34*

ROBUST AND EFFICIENT COMPRESSION/DECOMPRESSION PROVIDING FOR ADJUSTABLE DIVISION OF COMPUTATIONAL COMPLEXITY BETWEEN ENCODING/COMPRESSION AND DECODING/DECOMPRESSION

TECHNICAL FIELD

The present invention is related to compression/decompression, including compression/decompression methods, systems, and devices for encoding and decoding video signals, and, in particular, to a new class of compression/decompression methods, systems, and devices that can be tuned to a range of different divisions of the computational complexity of compression/decompression between the encoding/compression functionality and the decoding/decompression functionality.

BACKGROUND OF THE INVENTION

A variety of video compression/decompression methods and compression/decompression hardware/firmware modules and software modules ("codecs"), including the Moving Picture Experts Group ("MPEG") MPEG-1, MPEG-2, and MPEG-4 video coding standards and the more recent H.263+ video coding standard, have been developed to encode pixel-based and frame-based video signals into compressed bit streams, by lossy compression techniques, for compact storage in electronic, magnetic, and optical storage media, including DVDs and computer files, as well as for efficient transmission via cable television, satellite television, and the Internet. The compressed bit stream can be subsequently accessed, or received, and decompressed by a decoder in order to generate a reasonably high-fidelity reconstruction of the original pixel-based and frame-based video signal.

Because many of the currently available video coding methods have been designed for broadcast and distribution of compressed bit streams to a variety of relatively inexpensive, low-powered consumer devices, the currently used video coding methods generally tend to divide the total computational complexity of the encoding-compression/decoding-decompression process so that encoding, generally carried out once or a very few times by video distributors and broadcasters, is computationally complex and expensive, while decoding, generally carried out on relatively inexpensive, low-powered consumer devices, is computationally simple and inexpensive. This asymmetrical division of computational complexity correctly places the computational burden on the broadcaster or distributor, who generally encodes a pixel-based and frame-based video signal only once, or a few number of times, prior to distributing the encoded video signal to a potentially huge number of consumers. Consumers can reconstruct high-fidelity video signals using relatively inexpensive consumer devices, such as satellite-TV boxes, DVD players, and video-decoding software applications, because the decoding process is relatively computationally inexpensive and simple. However, with the emergence of a variety of hand-held video-recording consumer devices, including video cameras, cell phones, and other such hand-held, portable devices, a need has arisen for video codecs that place a relatively small computational burden on the encoding/compression functionality within the hand-held video recording device, and a comparatively high computational burden on the decoding device, generally a high-powered server or other computationally well-endowed encoded-video-signal-receiving entity. This division of computational complexity is referred to as "reversed computational complexity." Manufacturers, vendors, designers of, and users of portable, hand-held video-recording devices, codec designers, manufacturers, and vendors, and video-data-management providers have all recognized the need for new, efficient, and robust video codecs with reversed computational complexity.

SUMMARY OF THE INVENTION

Various embodiments of the present invention include compression/decompression methods, systems, and devices that adjust a division of a total computational complexity of compression and decompression between encoding and decoding. These embodiments include an encoder that encodes a received signal at a selectable level of computational complexity and a decoder that decodes a received, encoded signal at a selectable level computational complexity. Video-codec embodiments of the present invention may be incorporated into relatively inexpensive video-recording devices, including hand-held, video-recording consumer devices such as video recorders and cell phones.

BRIEF DESCRIPTION OF THE DRAWINGS

FIG. 1 illustrate a pixel-based video-signal frame.

FIG. 2 illustrates encoding of the video signal.

FIG. 7 illustrates an exemplary quantization of frequency-domain coefficients.

FIG. 34 illustrates a trellis-encoding technique used in various embodiments of the present invention.

DETAILED DESCRIPTION OF THE INVENTION

Figure 3:
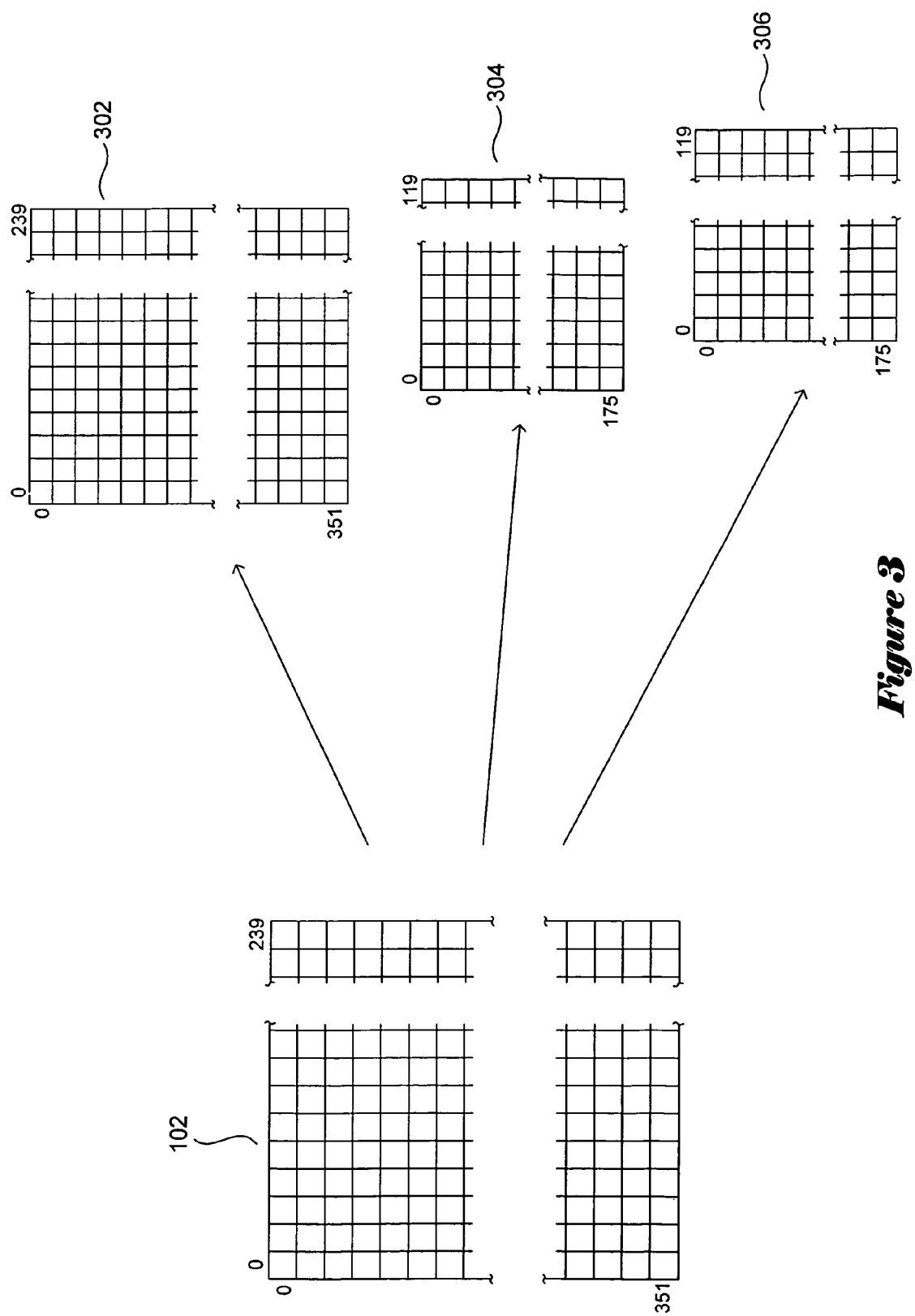
FIG. 3 illustrates a first, logical step in encoding of a frame.

Embodiments of the present invention provide compression/decompression methods, systems, and devices, generally referred to as "codecs," that allow for adjustment of the division of the total computational burden of compression/decompression between the encoding/compression functionality and the decoding/decompression functionality of the compression/decompression methods, systems, and devices over a range of computational-burden divisions. In a first subsection, below, a general overview of representative, currently available video codecs is provided, as a basis for understanding subsequent discussion of the present invention. Next, in a second subsection, a brief introduction to certain concepts in information science and coding theory are provided, as well as an overview of Slepian-Wolf and Wyner-Ziv coding theorems. In a third subsection, below, an overview of the present invention is provided. Finally, in a fourth, lengthy subsection, implementation details of codecs that comprise various embodiments of the present invention are provided.

Overview of Currently Available Video Codecs

FIG. 1 illustrates a pixel-based video-signal frame. The frame 102 can be considered to be a two-dimensional array of pixel values. Each cell of the two-dimensional array, such as cell 104, represents a pixel value for display by a corresponding pixel of an electronic display device, such as a television display or computer monitor. In one standard, a video-signal frame 102 represents display of an image containing 240×352 pixels. The digital representation of each pixel, such as pixel value 106, includes a luminance value 108 and two chrominance values 110-111. The luminance value 108 can be thought of as controlling the grayscale darkness or brightness of the pixel, and the chrominance values 110 and 111 specify the color to be displayed by the pixel.

FIG. 2 illustrates encoding of a frame-based video signal. A raw video signal can be considered to be a series, or sequence, of frames 120 ordered with respect to time. In one common standard, any two consecutive frames, such as frames 122 and 124 in FIG. 2, are separated by a time difference of of a second. The video encoding process divides the sequence of frames in the raw signal into a time-ordered sequence of subsequences, each subsequence referred to as a "GOP." Each GOP may overlap the previous and succeeding GOPS in the first and last frames. In FIG. 2, the 13 frames 126 comprise a single GOP. The number of frames in a GOP may vary, depending on the particular codec implementation, desired fidelity of reconstruction of the video signal, desired resolution, and other factors. A GOP generally begins and ends with intraframes, such as intraframes 128 and 130 in GOP 126. Intraframes, also referred to as "I frames," are reference frames that are spatially encoded. A number of P frames 132-134 and B frames 136-139 and 140-143 may occur within the GOP. P frames and B frames may be both spatially and temporally encoded. Encoding of a P frame relies on a previous I frame or P frame, while the encoding of a B frame relies on both a previous and subsequent I frame or P frame. In general, I frames and P frames are considered to be reference frames. As shown in FIG. 2 by arrows, such as arrow 144, the raw frames selected for P frames and B frames may occur in a different order within the GOP than the order in which they occur in the raw video signal. Each GOP is input, in time order, to an encoding module 148 which encodes the information contained within the GOP into a compressed bit stream 150 that can be output for storage on an electronic storage medium or for transmission via an electronic communications medium.

FIG. 3 illustrates a first, logical step in encoding of a frame. As discussed with reference to FIG. 1, above, a video frame 102 can be considered to be a two-dimensional array of pixel values, each pixel value comprising a luminance value and two chrominance values. Thus, a single video frame can be alternatively considered to be composed of a luminance frame 302 and two chrominance frames 304 and 306. Because human visual perception is more acutely attuned to luminance than to chrominance, the two chrominance frames 304 and 306 are generally decimated by a factor of two in each dimension, or by an overall factor of four, to produce lower-resolution, 120×175 frames.

Figure 4:
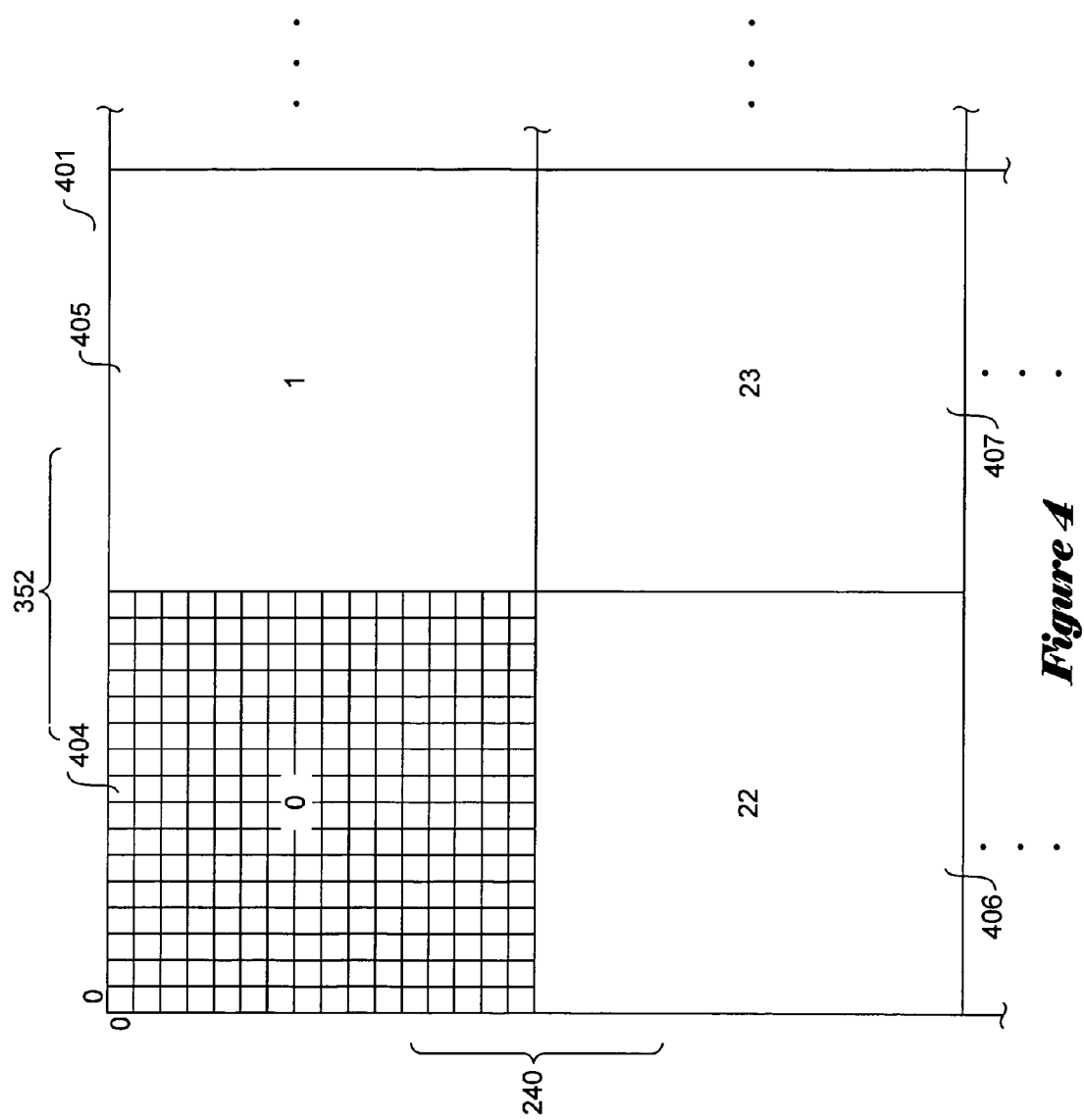
FIG. 4 illustrates composition of a video frame into macroblocks.

FIG. 4 illustrates composition of a video frame into macroblocks. As shown in FIG. 4, a video frame, such as the 240×352 video frame 401, only a small portion of which appears in FIG. 4, can be decomposed into a set of non-overlapping 16×16 macroblocks. This small portion of the frame shown in FIG. 4 has been divided into four macroblocks 404-407. When the macroblocks are numerically labeled by left-to-right order of appearance in successive rows of the video frame, the first macroblock 401 in FIG. 4 is labeled "0" and the second macroblock 405 is labeled "1." Twenty additional macroblocks, not shown in FIG. 4, follow macroblock 1 in the first row of the video frame, so the third macroblock 406 shown in FIG. 4, the first macroblock of the second row, is labeled "22," and the final macroblock 407 shown in FIG. 4 is labeled "23."

Figure 5:
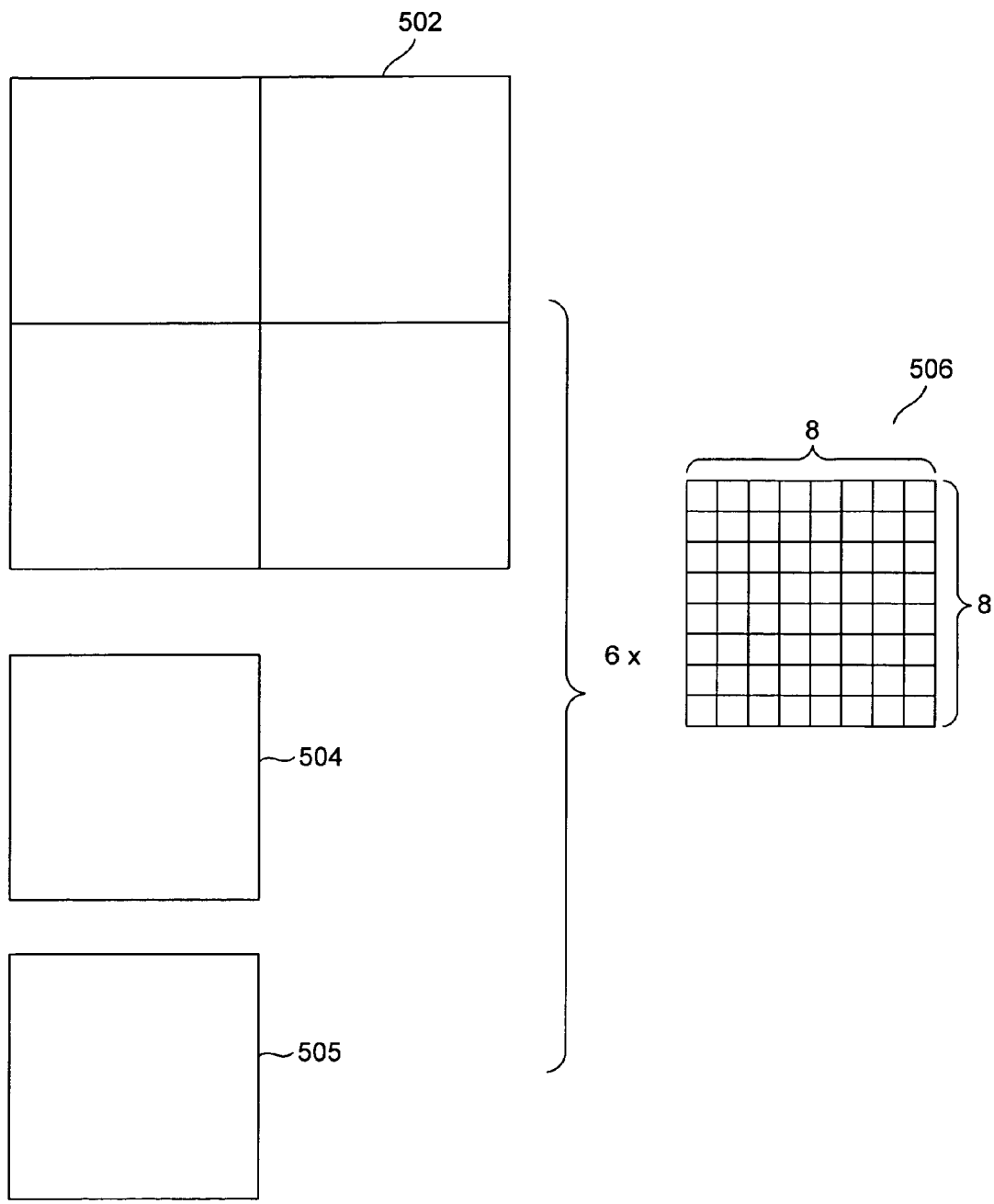
FIG. 5 illustrates decomposition of a macroblock into six 8×8 blocks.

FIG. 5 illustrates decomposition of a macroblock into six 8×8 blocks. As discussed above, a video frame, such as video frame 102 in FIG. 1, can be decomposed into a series of 16×16 macroblocks, such as macroblock 404 in FIG. 4. As discussed with reference to FIG. 3, each video frame, or macroblock within a video frame, can be considered to be composed of a luminance frame and two chrominance frames, or a luminance macroblock and two chrominance macroblocks, respectively. As discussed with reference to FIG. 3, chrominance frames and/or macroblocks are generally decimated by an overall factor of four. Thus, a given macroblock within a video frame, such as macroblock 404 in FIG. 4, can be considered to be composed of a luminance 16×16 macroblock 502 and two 8×8 chrominance blocks 504 and 505. The luminance macroblock 502 can be, as shown in FIG. 5, decomposed into four 8×8 blocks. Thus, a given macroblock within a video frame, such as macroblock 404 in video frame 401 shown in FIG. 4, can be decomposed into six 8×8 blocks 506, including four luminance 8×8 blocks and two chrominance 8×8 blocks. Spatial encoding of video frames is carried out on an 8×8 block basis. Temporal encoding of video frames is carried out on a 16×16 macroblock basis.

Figure 6:
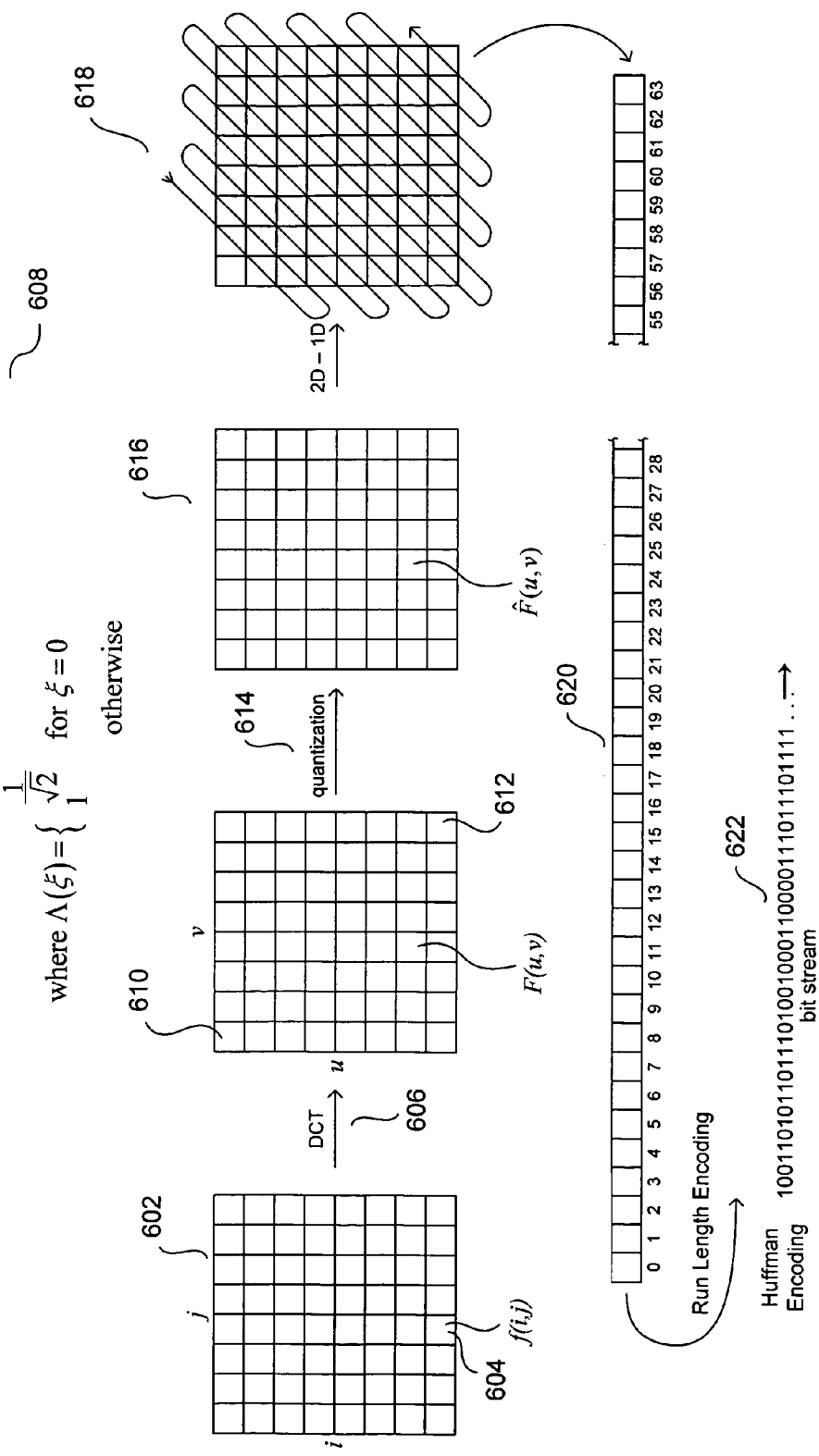
FIG. 6 illustrates spatial encoding of an 8×8 block extracted from a video frame, as discussed above with reference to FIGS. 1-5.

FIG. 6 illustrates spatial encoding of an 8×8 block extracted from a video frame, as discussed above with reference to FIGS. 1-5. Each cell or element of the 8×8 block 602, such as cell 604, contains a luminance or chrominance value $f(i,j)$, where i and j are the row and column coordinates, respectively, of the cell. The cell is transformed 606, in many cases using a discrete cosign transform ("DCT"), from the spatial domain represented by the array of intensity values $f(i,j)$ to the frequency domain, represented by a two-dimensional 8×8 array of frequency-domain coefficients $F(u,v)$. An expression for an exemplary DCT is shown at the top of FIG. 6 608. The coefficients in the frequency domain indicate spatial periodicities in the vertical, horizontal, and both vertical and horizontal directions within the spatial domain. The $F_{(0,0)}$ coefficient 610 is referred to as the "DC" coefficient, and has a value proportional to the average intensity within the 8×8 spatial-domain block 602. The periodicities represented by the frequency-domain coefficients increase in frequency from the lowest-frequency coefficient 610 to the highest-frequency coefficient 612 along the diagonal interconnecting the DC coefficient 610 with the highest-frequency coefficient 612.

Next, the frequency-domain coefficients are quantized 614 to produce an 8×8 block of quantized frequency-domain coefficients 616. FIG. 7 illustrates an exemplary quantization of frequency-domain coefficients. Quantization employs an 8×8 quantization matrix Q 702. In one exemplary quantization process, represented by expression 704 in FIG. 7, each frequency-domain coefficient $f(i,j)$ is multiplied by 8, and it is then divided, using integer division, by the corresponding value in quantization-matrix Q, $Q_{i,j}$, that may be first scaled by a scale factor. Quantized coefficients have small-integer values. Examination of the quantization-matrix Q reveals that, in general, higher frequency coefficients are divided by larger values than lower frequency coefficients in the quantization process. Since Q-matrix integers are larger for higher-frequency coefficients, the higher-frequency coefficients end up quantized into a smaller range of integers, or quantization bins. In other words, the range of quantized values for lower-frequency coefficients is larger than for higher-frequency coefficients. Because lower-frequency coefficients generally have larger magnitudes, and generally contribute more to a perceived image than higher-frequency coefficients, the result of quantization is that many of the higher-frequency quantized coefficients, in the lower right-hand triangular portion of the quantized-coefficient block 616, are forced to zero. Next, the block of quantized coefficients 618 is traversed, in zig-zig fashion, to create a one-dimensional vector of quantized coefficients 620. The one-dimensional vector of quantized coefficients is then encoded using various entropy-encoding techniques, generally run-length encoding followed by Huffman encoding, to produce a compressed bit stream 622. Entropy-encoding techniques take advantage of a non-uniform distribution of the frequency of occurrence of symbols within a symbol stream to compress the symbol stream. A final portion of the one-dimensional quantized-coefficient vector 620 with highest indices often contains only zero values. Run-length encoding can represent a long, consecutive sequence of zero values by a single occurrence of the value "0" and the length of the subsequence of zero values. Huffman encoding uses varying-bit-length encodings of symbols, with shorter-length encodings representing more frequently occurring symbols, in order to compress a symbol string.

Spatial encoding employs only information contained within a particular 8×8 spatial-domain block to encode the spatial-domain block. As discussed above, I frames are encoded by using only spatial encoding. In other words, each I frame is decomposed into 8×8 blocks, and each block is spatially encoded, as discussed above with reference to FIG. 6. Because the encoding of I frames is not dependant on any other frames within a video signal, I frames serve as self-contained reference points that anchor the decoding process at regularly spaced intervals, preventing drift in the decoded signal arising from interdependencies between encoded frames.

Because a sequence of video frames, or video signal, often encodes a dynamic image of people or objects moving with respect to a relatively fixed background, a video camera panned across a background, or of a scene that is relatively static over a period of time, a sequence of video frames often contains a large amount of redundant information, some or much of which is translated or displaced from an initial position, in an initial frame, to a series of subsequent positions across subsequent frames. For this reason, detection of motion of images or sub-images within a series of video frames provides a means for relatively high levels of compression. Techniques to detect motion of images and sub-images within a sequence of video frames over time and use the redundant information contained within these moving images and sub-images is referred to as temporal compression.

Figure 8:
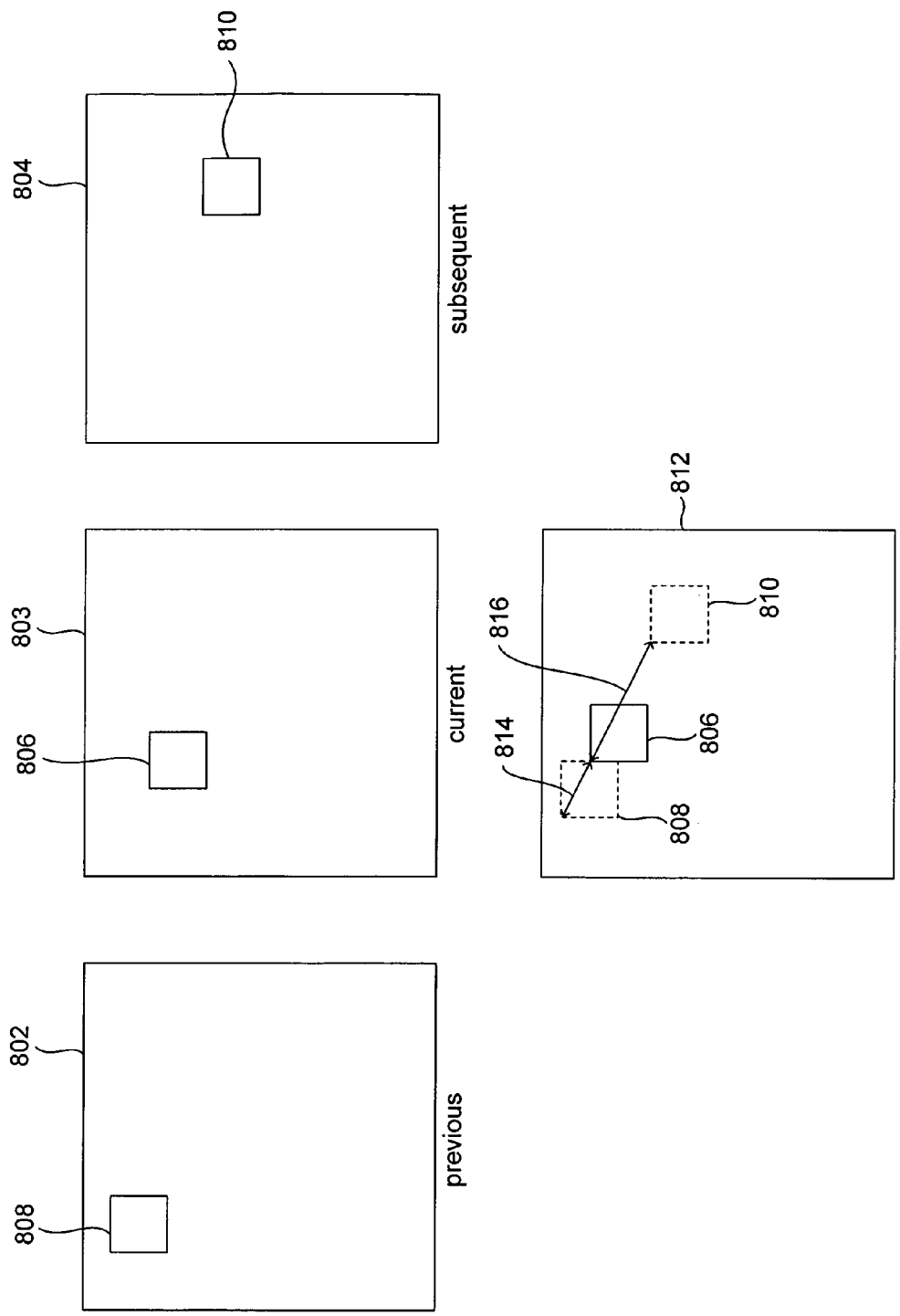
FIG. 8 illustrates sub-image movement across a sequence of frames and motion vectors that describe sub-image movement.

FIG. 8 illustrates sub-image movement across a sequence of frames and motion vectors that describe sub-image movement. In FIG. 8, three video frames 802-804 selected from a GOP are shown. Frame 803 is considered to be the current frame, or frame to be encoded and compressed. Frame 802 occurred in the original video-signal sequence of frames earlier in time than the current frame 803, and frame 804 follows frame 803 in the original video signal. A particular 16×16 macroblock 806 in the current frame 803 is found in a first, and different, position 808 in the previous frame 802 and in a second and different position 810 in the subsequent frame 804. Superimposing the positions of the macroblock 806 in the previous, current, and subsequent frames within a single frame 812, it is observed that the macroblock appears to have moved diagonally downward from the first position 808 to the second position 810 through the current position 806 in the sequence of frames in the original video signal. The position of the macroblock in the current frame 806 and two displacement, or motion, vectors 814 and 816 describe the temporal and spatial motion of the macroblock 806 in the time period represented by the previous, current, and subsequent frames. The basic concept of temporal compression is that macroblock 806 in the current frame can be encoded as either one or both of the motion vectors 814 and 816, since the macroblock will have been encoded in encodings of the previous and subsequent frames, and therefore represents redundant information in the current frame, apart from the motion-vector-based information concerning its position within the current frame.

Figure 9:
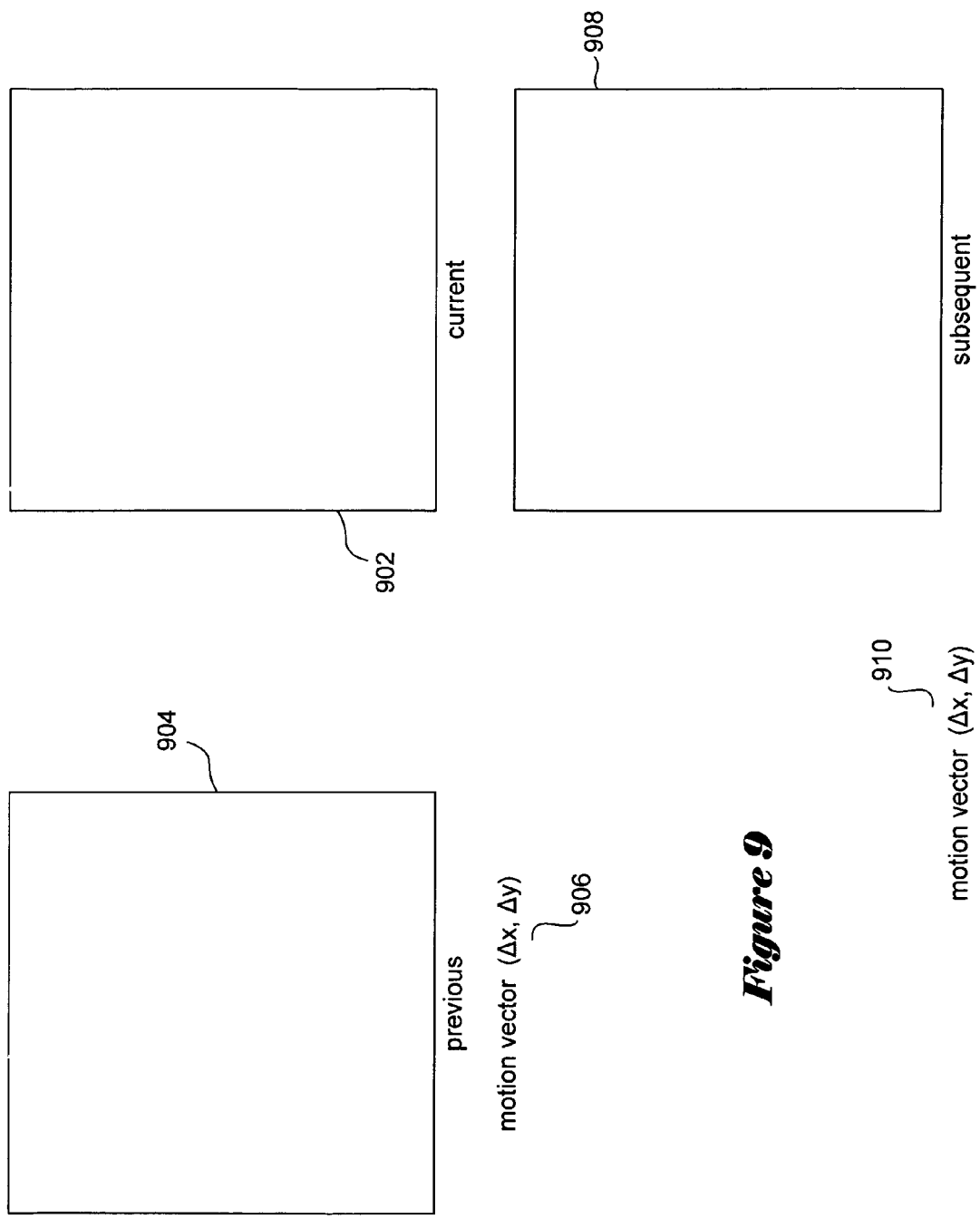
FIG. 9 shows the information used for temporal encoding of a current frame.

FIG. 9 shows the information used for temporal encoding of a current frame. Temporal encoding of a current frame uses the current frame 902 and either a single previous frame 904 and single motion vector 906 associated with the previous frame or both the previous frame and associated motion vector 904 and 906 and a subsequent frame 908 and associated motion vector 910. P-frame temporal encoding may use only a previous frame and a previous I frame or P frame, and B-frame encoding may use both a previous and subsequent I frame and/or P frame.

Figure 10:
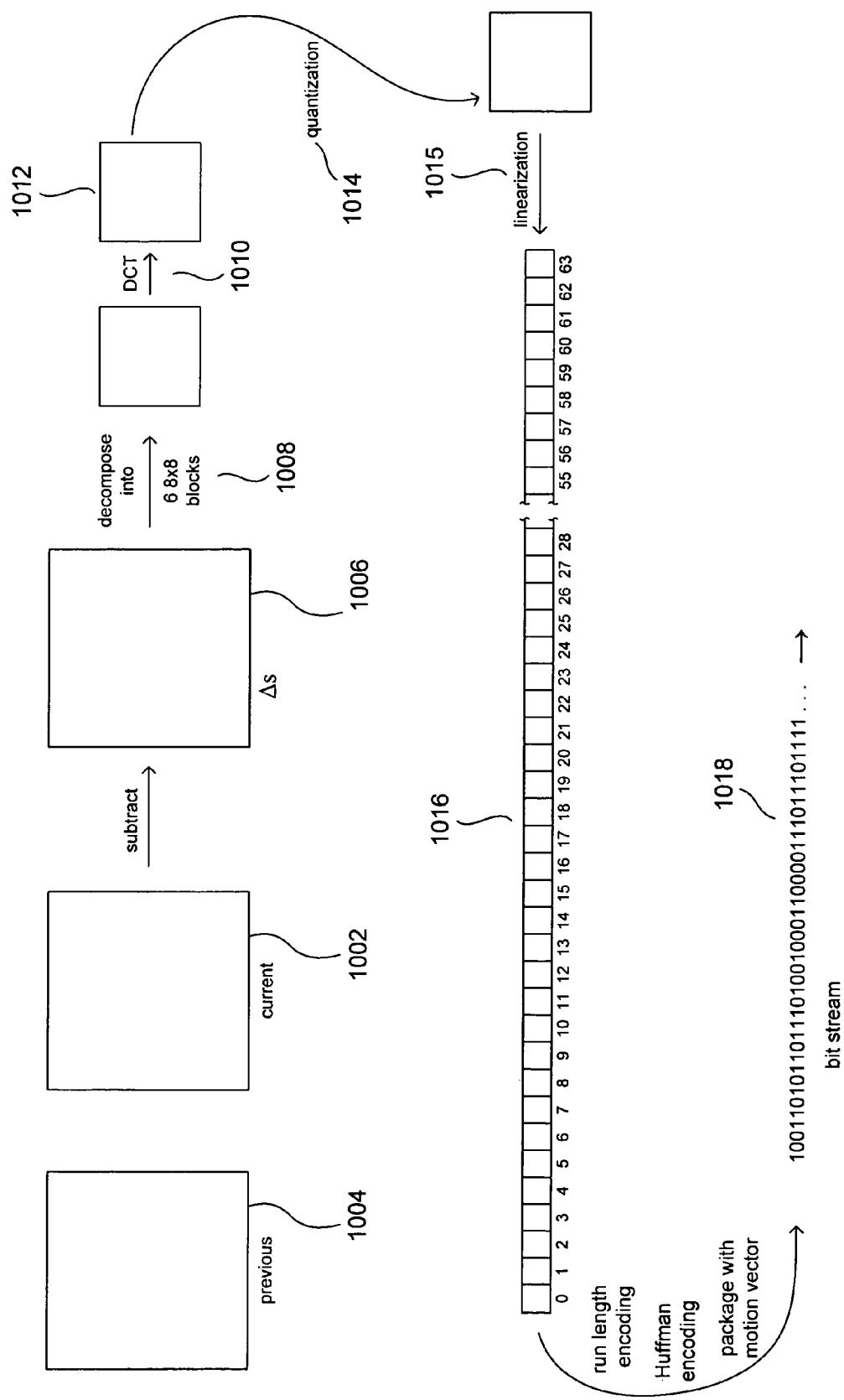
FIG. 10 illustrates P-frame temporal encoding.

FIG. 10 illustrates P-frame temporal encoding. In P-frame temporal encoding, a 16×16 current-frame macroblock 1002 and a 16×16 matching macroblock 1004 found in the previous frame are used for encoding the 16×16 current-frame macroblock 1002. The previous-frame macroblock 1004 is identified as being sufficiently similar to the current-frame macroblock 1002 to be compressible by temporal compression, and as the macroblock most similar to the current-frame macroblock. Various techniques can be employed to identify a best matching macroblock in a previous frame for a given macroblock within the current frame. A best-matching macroblock in the previous frame may be deemed sufficiently similar if the sum of absolute differences ("SAD") or sum of squared differences ("SSD") between corresponding values in the current-frame macroblock and best-matching previous-frame macroblock are below a threshold value. Associated with the current-frame macroblock 1002 and best-matching previous-frame macroblock 1004 is a motion vector (906 in FIG. 9). The motion vector may be computed as the horizontal and vertical offsets Δx and Δy of the upper, left-hand cells of the current-frame and best-matching previous-frame macroblocks. The current-frame macroblock 1002 is subtracted from the best-matching previous-frame macroblock 1004 to produce a residual macroblock 1006. The residual macroblock is then decomposed into six 8×8 blocks 1008, as discussed above with reference to FIG. 5, and each of the 8×8 blocks is transformed by a DCT 1010 to produce an 8×8 block of frequency-domain coefficients 1012. The block of frequency-domain coefficients is quantized 1014 and linearized 1015 to produce the one-dimensional vector of quantized coefficients 1016. The one-dimensional vector of quantized coefficients 1016 is then run-length encoded and Huffman encoded, and packaged together with the motion vector associated with the current-frame macroblock 1002 and best-matching previous-frame macroblock 1004 to produce the compressed bit stream 1018. The temporal compression of a P block is carried out on a macroblock-by-macroblock basis. If no similar macroblock for a particular current-frame macroblock can be found in the previous frame, then the current-frame macroblock can be spatially encoded, as discussed above with reference to FIG. 6. Either a previous I frame or a previous P frame can be used for the previous frame during temporal encoding of a current frame.

Figure 11:
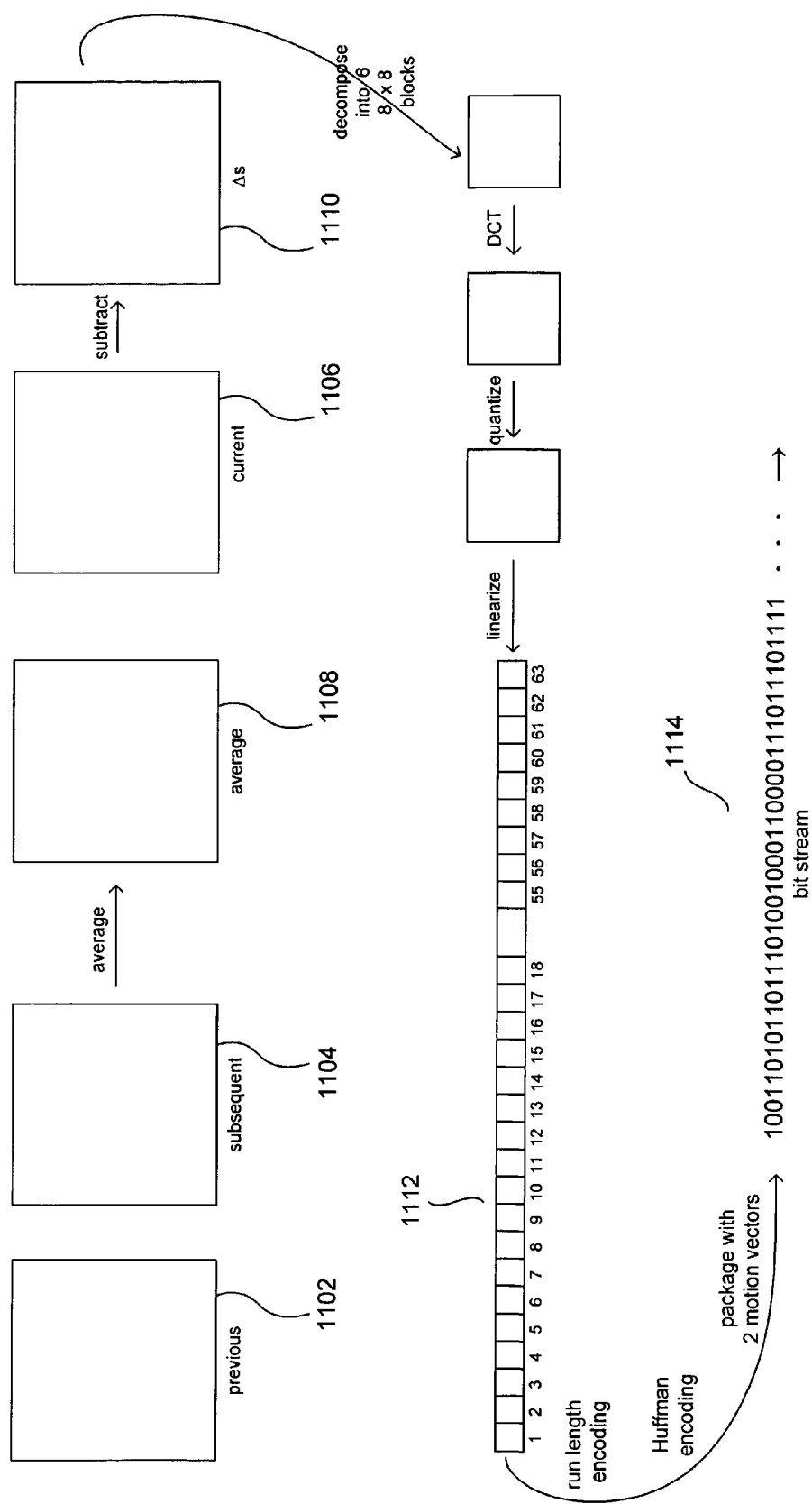
FIG. 11 illustrates B-frame temporal encoding.

FIG. 11 illustrates B-frame temporal encoding. Many of the steps in B-frame temporal encoding are identical to those in P-frame encoding. In B-frame encoding, a best-matching macroblock from a previous frame 1102 and a best-matching macroblock from a subsequent frame 1104 corresponding to a current-frame macroblock 1106 are averaged together to produce an average matching frame 1108. The current-frame macroblock 1106 is subtracted from the average matching macroblock 1108 to produce a residual macroblock 1110. The residual macroblock is then spatially encoded in exactly the same manner as the residual macroblock 1006 in P-frame encoding is spatially encoded, as described in FIG. 10. The one-dimensional quantized-coefficient vector 1112 resulting from spatial encoding of the residual macroblock is entropy encoded and packaged with the two motion vectors associated with the best-matching previous-frame macroblock 1102 and the best-matching subsequent-frame macroblock 1104 to produce a compressed bit stream 1114. Each macroblock within a B frame may be temporally compressed using only a best-matching previous-frame macroblock and associated motion vector, as in FIG. 10, only a best-matching subsequent-frame macroblock and associated motion vector, or with both a best-matching previous-frame macroblock and associated motion vector and a best-matching subsequent-frame macroblock and associated motion vector, as shown in FIG. 11. In addition, if no matching macroblock can be found in either the previous or subsequent frame for a particular current-frame macroblock, then the current-frame macroblock may be spatially encoded, as discussed with reference to FIG. 6. Previous and subsequent frames may be either P or I frames.

Figure 12:
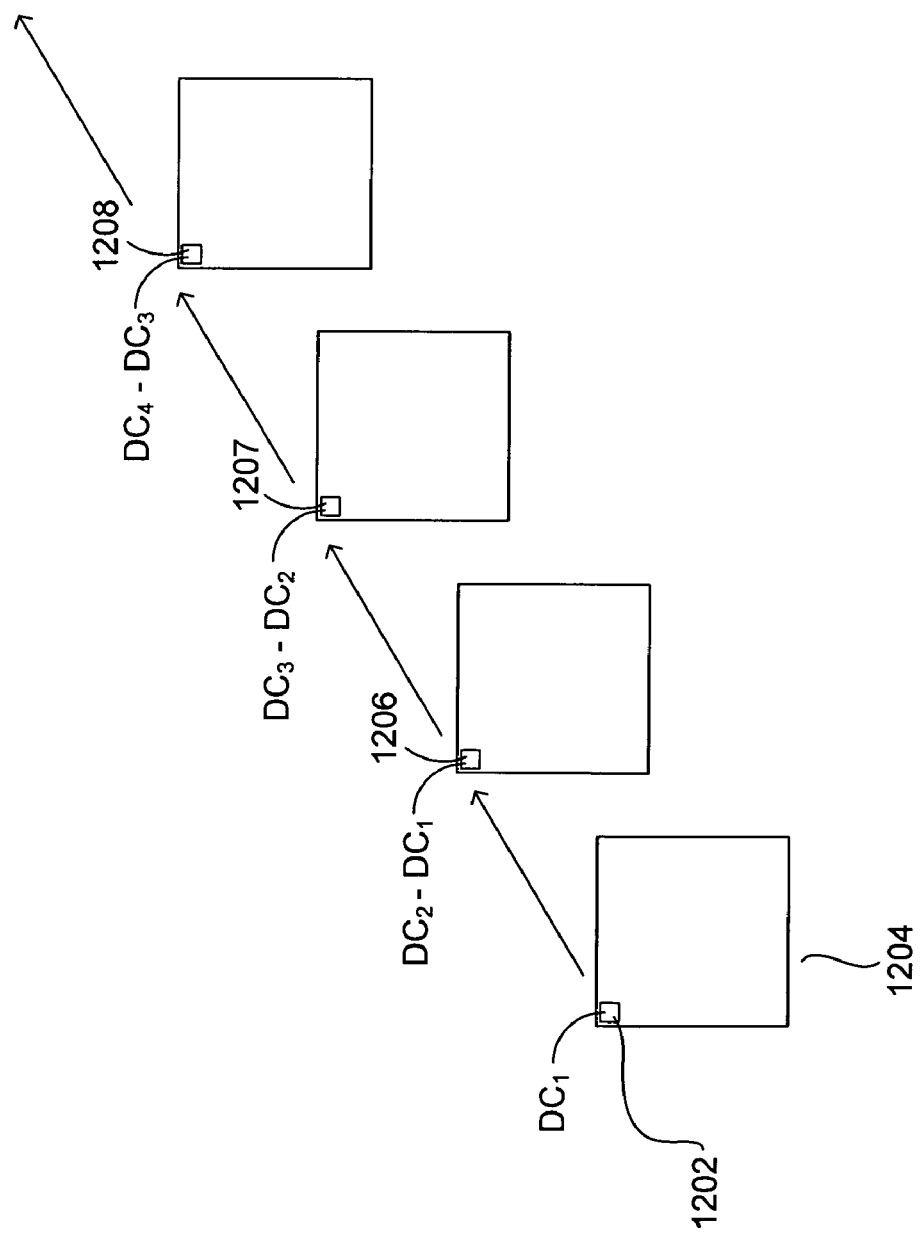
FIG. 12 illustrates DC encoding.

FIG. 12 illustrates DC encoding. As discussed above, the $F_{(0,0)}$ coefficient of the frequency domain represents the average intensity within the spatial domain. The DC coefficient is the single most important piece of information with respect to high-fidelity frame reconstruction. Therefore, the DC coefficients are generally represented at highest-possible resolution, and are encoded by DCPM encoding. In DCPM encoding, the DC coefficient 1202 of the first I frame 1204 is encoded into the bit stream, and, for each DC coefficient of subsequent frames 1206-1208, the difference between the subsequent-frame DC coefficient and the first reference frames DC coefficient 1202 is encoded in the bit stream.

Figure 13:
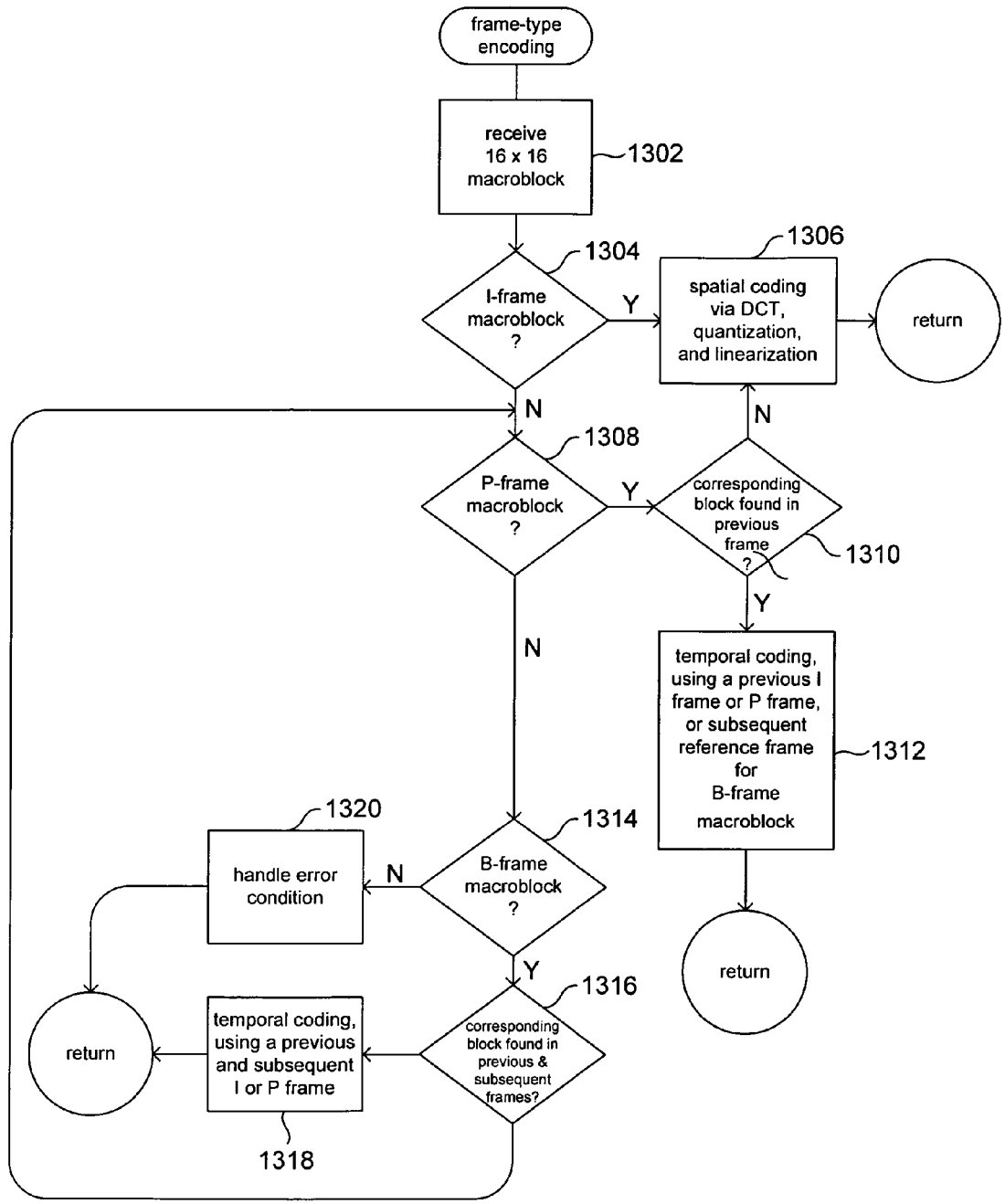
FIG. 13 summarizes I-frame, P-frame, and B-frame encoding.

FIG. 13 summarizes I-frame, P-frame, and B-frame encoding. In step 1302, a next 16×16 macroblock is received for encoding. If the macroblock was extracted from an I frame, as determined in step 1304, then the macroblock is decomposed, in step 1306, into six 8×8 blocks that are spatially encoded via DCT, quantization, linearization, and entropy encoding, as described above with reference to FIG. 6, completing encoding of the macroblock. Otherwise, if the received macroblock is extracted from a P frame, as determined in step 1308, then, if a corresponding macroblock can be found in a previous reference frame, as determined in step 1310, the macroblock is temporally encoded as described with reference to FIG. 10 in step 1312. If, by contrast, a similar macroblock is not found in the previous reference frame, then the received macroblock is spatially encoded in step 1306. If the received macroblock is extracted from a B frame, as determined in step 1314, then if a similar, matching macroblock is found in both the previous and subsequent reference frames, as determined in step 1316, the received macroblock is temporally encoded, in step 1318, using both previous and subsequent reference frames, as discussed above with reference to FIG. 11. Otherwise, the macroblock is encoded like a P-frame macroblock, with the exception that a single-best-matching-block temporal encoding may be carried out with a best matching block in either the previous or subsequent reference frame. If the received 16×16 macroblock is not one of an I-frame, P-frame, or B-frame macroblock, then either an error condition has arisen or there are additional types of blocks within a GOP in the current encoding method, and either of these cases is handled in step 1320.

Decoding of the compressed bit stream (150 in FIG. 2) generated by the video encoding method discussed above with reference to FIGS. 1-13, is carried out by reversing the encoding steps. Entropy decoding of the bit stream returns one-dimensional quantized-coefficient vectors for spatially-encoded blocks and for residual blocks generated during temporal compression. Entropy decoding also returns motion vectors and other header information that is packaged in the compressed bit stream to describe the encoded information and to facilitate decoding. The one-dimensional quantized-coefficient arrays can be used to generate corresponding two-dimensional quantized coefficient blocks and quantized residual blocks and the quantized-coefficient blocks and quantized residual blocks can be then converted into reconstructed frequency-domain coefficient blocks. Reconstruction of the frequency-domain coefficient blocks generally introduces noise, since information was lost in the quantization step of the encoding process. The reconstructed frequency-domain-coefficient blocks can then be transformed, using an inverse DCT, to the spatial domain, and reassembled into reconstructed video frames, with residual frames added back to macroblocks found by motion vectors in already reconstructed frames during inverse temporal encoding. The above-described codec is therefore based on lossy compression, since the reconstructed video frame contains noise resulting from loss of information in the quantization step of the encoding process.

Figure 14:
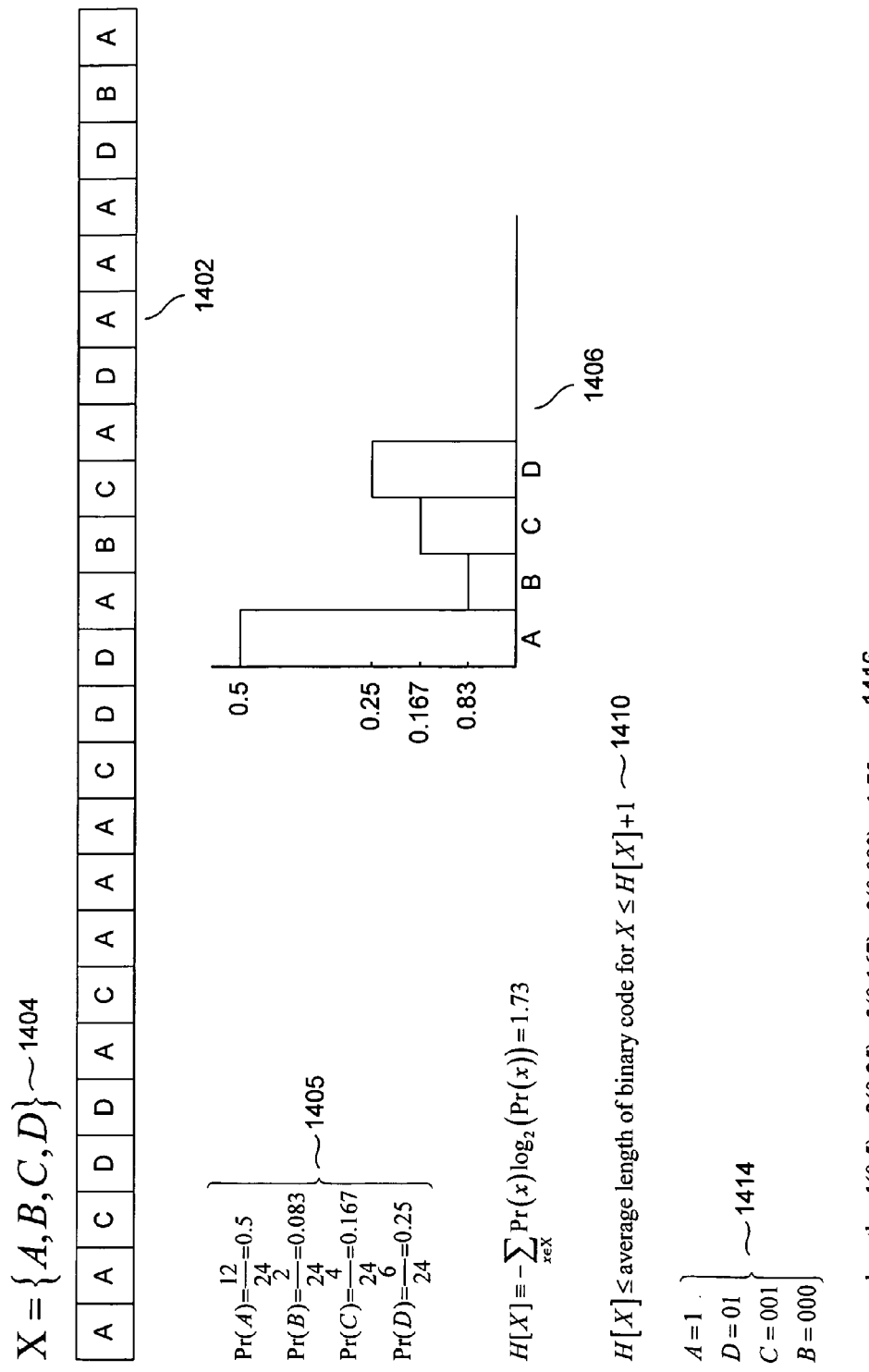
FIG. 14 illustrates calculation of the entropy associated with a symbol string and entropy-based encoding of the symbol string.

Brief Introduction to Certain Concepts in Information Science and Coding Theory and the Slepian-Wolf and Wyner-Ziv Theorems FIG. 14 illustrates calculation of the entropy associated with a symbol string and entropy-based encoding of the symbol string. In FIG. 14, a 24-symbol string 1402 is shown. The symbols in the 24-symbol string are selected from the set of symbols X that include the symbols A, B, C, and D 1404. The probability of occurrence of each of the four different symbols at a given location within the symbol string 1402, considering the symbol string to be the product of sampling of the random variable that can have, at a given point in time, one of the four values A, B, C, and D, can be inferred from the frequencies of occurrence of the four symbols in the symbol string 1402, as shown in equations 1405. A histogram 1406 of the frequency of occurrence of the four symbols is also shown in FIG. 14. The entropy of the symbol string, or of the random variable X used to generate the symbol string, is computed as:

$$H[X] \equiv -\sum_{x \in X} Pr(x)\log_2(Pr(x))$$

The entropy H is always positive, and, in calculating entropies, $\log_2(0)$ is defined as 0. The entropy of the 24-character symbol string can be calculated from the probabilities of occurrence of symbols 1404 to be 1.73. The smaller the entropy, the greater the predictability of the outcome of sampling the random variable X. For example, if the probabilities of obtaining each of the four symbols A, B, C, and D in sampling the random variable X are equal, and each is therefore equal to 0.25, then the entropy for the random variable X, or for a symbol string generated by repeatedly sampling the random variable X, is 2.0. Conversely, if the random variable were to always produce the value A, and the symbol string contained only the symbol A, then the probability of obtaining A from sampling the random variable would equal 1.0, and the probability of obtaining any of the other values B, C, D would be 0.0. The entropy of the random variable, or of an all-A-containing symbol string, is calculated by the above-discussed expression for entropy to be 0. An entropy of zero indicates no uncertainty.

Intermediate values of the entropy between 0 and 2.0, for the above considered 4-symbol random variable of symbol string, also referred to as string X, correspond to a range of increasing uncertainty. For example, in the symbol-occurrence distribution illustrated in the histogram 1406 and the probability equations 1404, one can infer that it is as likely that a sampling of the random variable X returns symbol A as any of the other three symbols B, C, and D. Because of the non-uniform distribution of symbol-occurrence frequencies within the symbol string, there is a greater likelihood of any particular symbol in the symbol string to have the value A than any one of the remaining three values B, C, D. Similarly, there is a greater likelihood of any particular symbol within the symbol string to have the value D than either of the two values B and C. This intermediate certainty, or knowledge gleaned from the non-uniform distribution of symbol occurrences, is reflected in the intermediate value of the entropy H[X] for the symbol string 1402. The entropy of a random variable or symbol string is associated with a variety of different phenomena. For example, as shown in the formula 1410 in FIG. 14, the average length of the binary code needed to encode samplings of the random variable X, or to encode symbols of the symbol string 1402, is greater than or equal to the entropy for the random variable or symbol string and less than or equal to the entropy for the random variable or symbol string plus one. Huffman encoding of the four symbols 1414 produces an encoded version of the symbol string with an average number of bits per symbol, or rate, equal to 1.75 1416, which falls within the range specified by expression 1410.

One can calculate the probability of generating any particular n-symbol symbol string with the symbol-occurrence frequencies of the symbol string shown in FIG. 14 as follows:

$$Pr(S_{24}) = Pr(A)^{nPr(A)} Pr(A)^{nPr(B)} Pr(A)^{nPr(C)} Pr(A)^{nPr(D)}$$

$$= [2^{\log_2 Pr(A)}]^{nPr(A)} [2^{\log_2 Pr(B)}]^{nPr(B)} [2^{\log_2 Pr(C)}]^{nPr(C)} [2^{\log_2 Pr(D)}]^{nPr(D)}$$

$$= 2^{n[Pr(A)\log_2 Pr(A) + Pr(B)\log_2 Pr(B) + Pr(C)\log_2 Pr(C) + Pr(D)\log_2 Pr(D)]}$$

$$= 2^{-nH[X]}$$

Thus, the number of typical symbol strings, or symbol strings having the symbol-occurrence frequencies shown in FIG. 14, can be computed as:

$$\frac{1}{2^{-24(1.73)}} = \frac{1}{3.17 \times 10^{-13}} = 3.153 \times 10^{12}$$

If one were to assign a unique binary integer value to each of these typical strings, the minimum number of bits needed to express the largest of these numeric values can be computed as:

$$\log_2(3.153 \times 10^{12}) = 41.521$$

The average number of bits needed to encode each character of each of these typical symbol strings would therefore be:

$$\frac{41.521}{24} = 1.73 = H[X]$$

Figure 15:
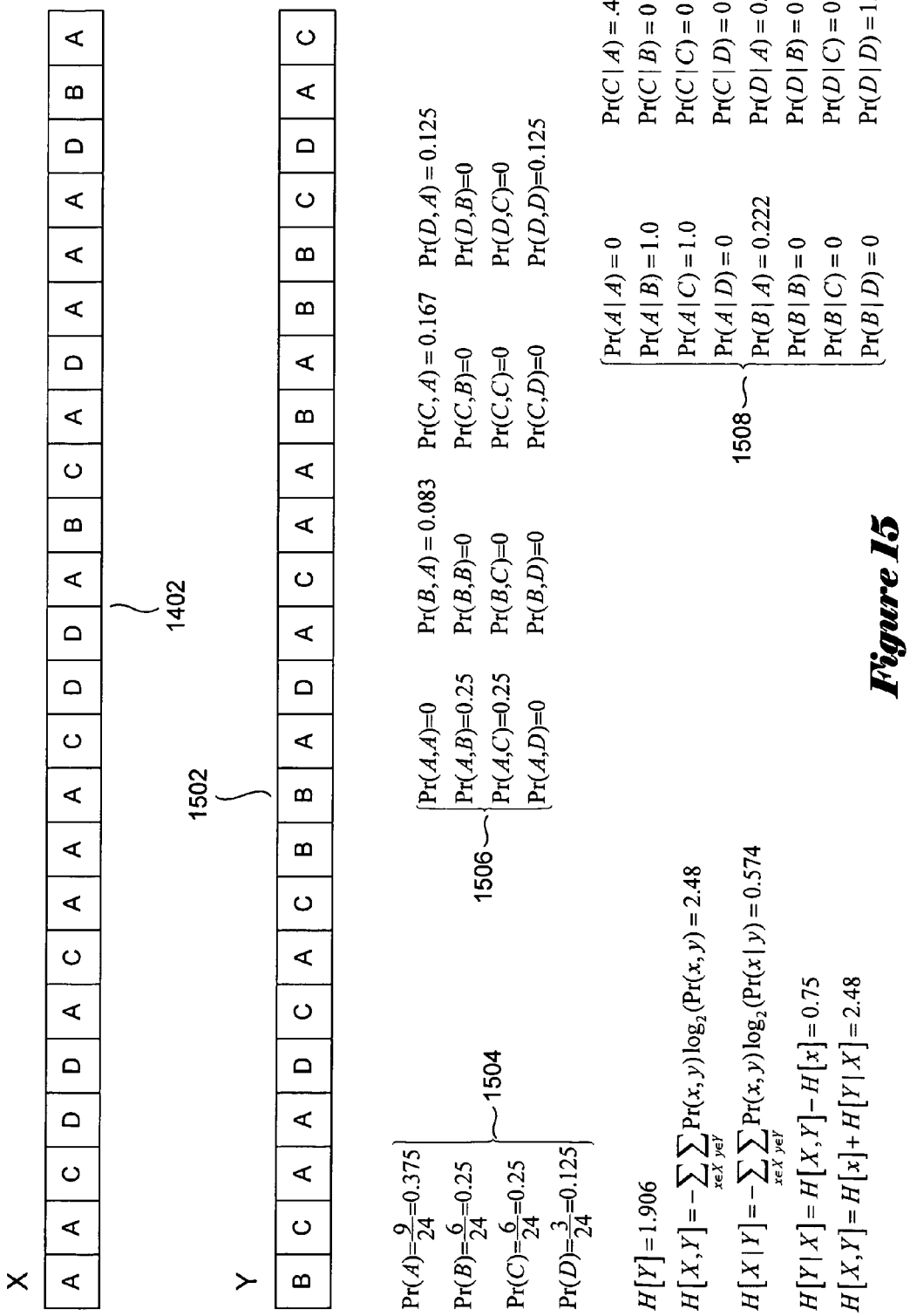
FIG. 15 illustrates joint and conditional entropies for two different symbol strings generated from two different random variables X and Y.

FIG. 15 illustrates joint and conditional entropies for two different symbol strings generated from two different random variables X and Y. In FIG. 15, symbol string 1402 from FIG. 14 is shown paired with symbol string 1502, also of length 24, generated by sampling a random variable Y that returns one of symbols A, B, C, and D. The probabilities of the occurrence of symbols A, B, C, and D in a given location within symbol string Y are computed in equations 1504 in FIG. 15. Joint probabilities for the occurrence of symbols at the same position within symbol string X and symbol string Y are computed in the set of equations 1506 in FIG. 15, and conditional probabilities for the occurrence of symbols at a particular position within symbol string X, given that the fact that a particular symbol occurs at the corresponding position in symbol string Y, are known in equations 1508. The entropy for symbol string Y, H[Y], can be computed from the frequencies of symbol occurrence in string Y 1504 as 1.906. The joint entropy for symbol strings X and Y, H[X,Y], is defined as:

$$H[X, Y] = -\sum_{x \in X} \sum_{y \in X} Pr(x, y) \log_2(Pr(x, y))$$

and, using the joint probability values 1506 in FIG. 15, can be computed to have the value 2.48 for the strings X and Y. The conditional entropy of symbol string X, given symbol string Y, H[X|Y] is defined as:

$$H[X | Y] = -\sum_{x \in X} \sum_{y \in X} Pr(x, y) \log_2(Pr(x | y))$$

and can be computed using the joint probabilities 1506 in FIG. 15 and conditional probabilities 1508 in FIG. 15 to have the value 0.574. The conditional probability H[Y|X] can be computed from the joint entropy and previously computed entropy of symbol string X as follows:

$$H[Y|X] = H[X,Y] - H[X]$$

and, using the previously calculated values for H[X, Y] and H[X], can be computed to be 0.75.

Figure 16:
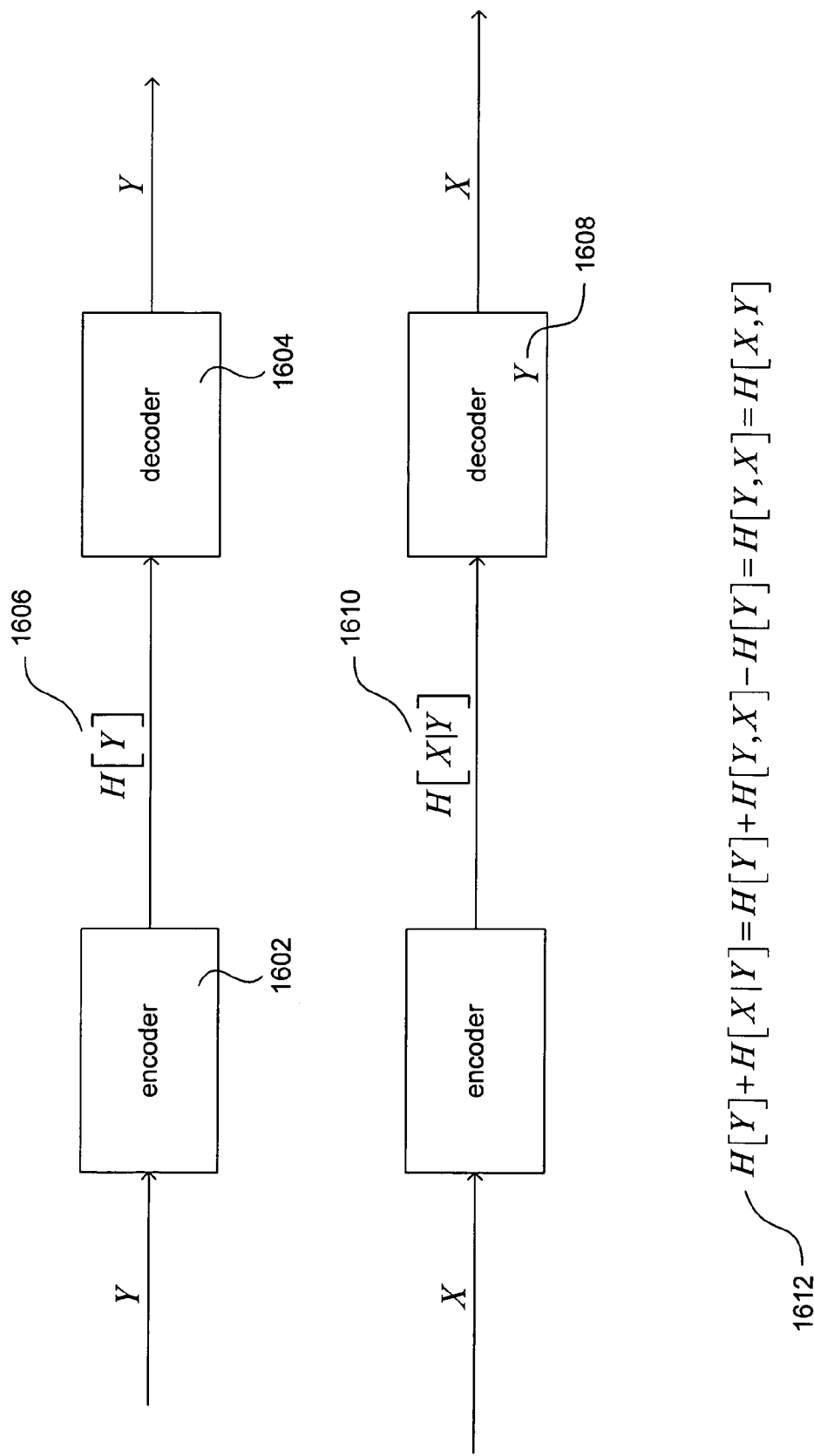
FIG. 16 illustrates lower-bound transmission rates, in bits per symbol, for encoding and transmitting symbol string Y followed by symbol string X.

FIG. 16 illustrates lower-bound transmission rates, in bits per symbol, for encoding and transmitting symbol string Y followed by symbol string X. Symbol string Y can be theoretically encoded by an encoder 1602 and transmitted to a decoder 1604 for perfect, lossless reconstruction at a bit/symbol rate of H[Y] 1606. If the decoder keeps a copy of symbol string Y 1608, then symbol string X can theoretically be encoded and transmitted to the decoder with a rate 1610 equal to H[X|Y]. The total rate for encoding and transmission of first symbol string Y and then symbol string X is then:

$$H[Y] + H[X|Y] = H[Y] + H[Y,X] - H[Y] = H[Y,X] = H[X,Y]$$

Figure 17:
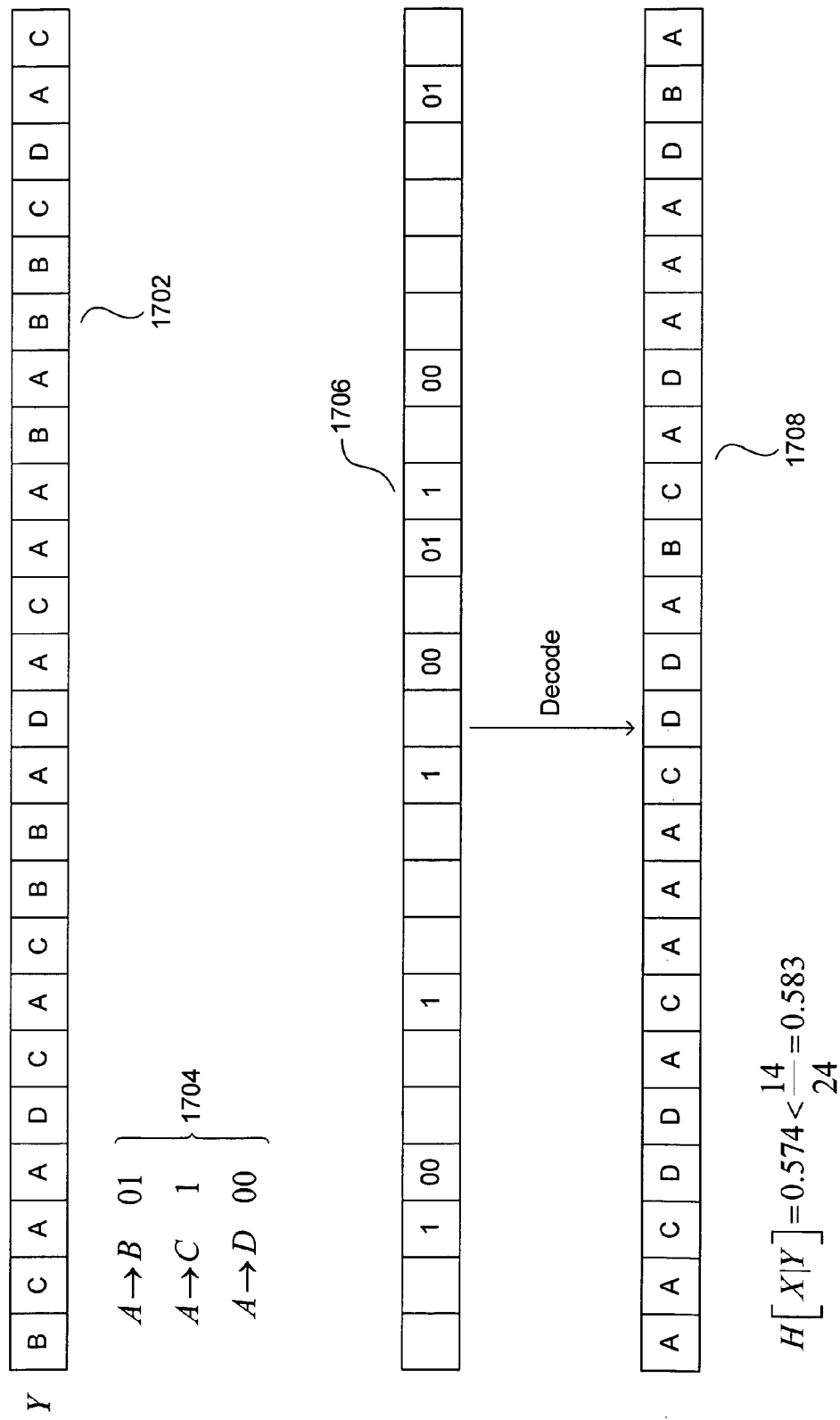
FIG. 17 illustrates one possible encoding method for encoding and transmitting symbol string X, once symbol string Y has been transmitted to the decoder.

FIG. 17 illustrates one possible encoding method for encoding and transmitting symbol string X, once symbol string Y has been transmitted to the decoder. As can be gleaned by inspection of the conditional probabilities 1508 in FIG. 15, or by comparing the aligned symbol strings X and Y in FIG. 15, symbols B, C, and D in symbol string Y can be translated, with certainty, to symbols A, A, and D, respectively, in corresponding positions in symbol string X. Thus, with symbol string Y in hand, the only uncertainty in translating symbol string Y to symbol string X is with respect to the occurrence of symbol A in symbol string Y. One can devise a Huffman encoding for the three translations 1704 and encode symbol string X by using the Huffman encodings for each occurrence of the symbol A in symbol string Y. This encoding of symbol string X is shown in the sparse array 1706 in FIG. 17. With symbol string Y 1702 in memory, and receiving the 14 bits used to encode symbol string X 1706 according to Huffman encoding of the symbol A translations 1704, symbol string X can be faithfully and losslessly decoded from symbol string Y and the 14-bit encoding of symbol string X 1706 to obtain symbol string X 1708. Fourteen bits used to encode 24 symbols represents a rate of 0.583 bits per symbol, which is slightly greater than the theoretical minimum bit rate H[X|Y]=0.574. However, while theoretical minimum bit rates are useful to understand the theoretical limits for encoding efficiency, they do not generally provide indications of how the theoretical limits may be achieved. Also, a variety of assumptions are made in developing the theorems that cannot be made in real-world situations.

Figure 18:
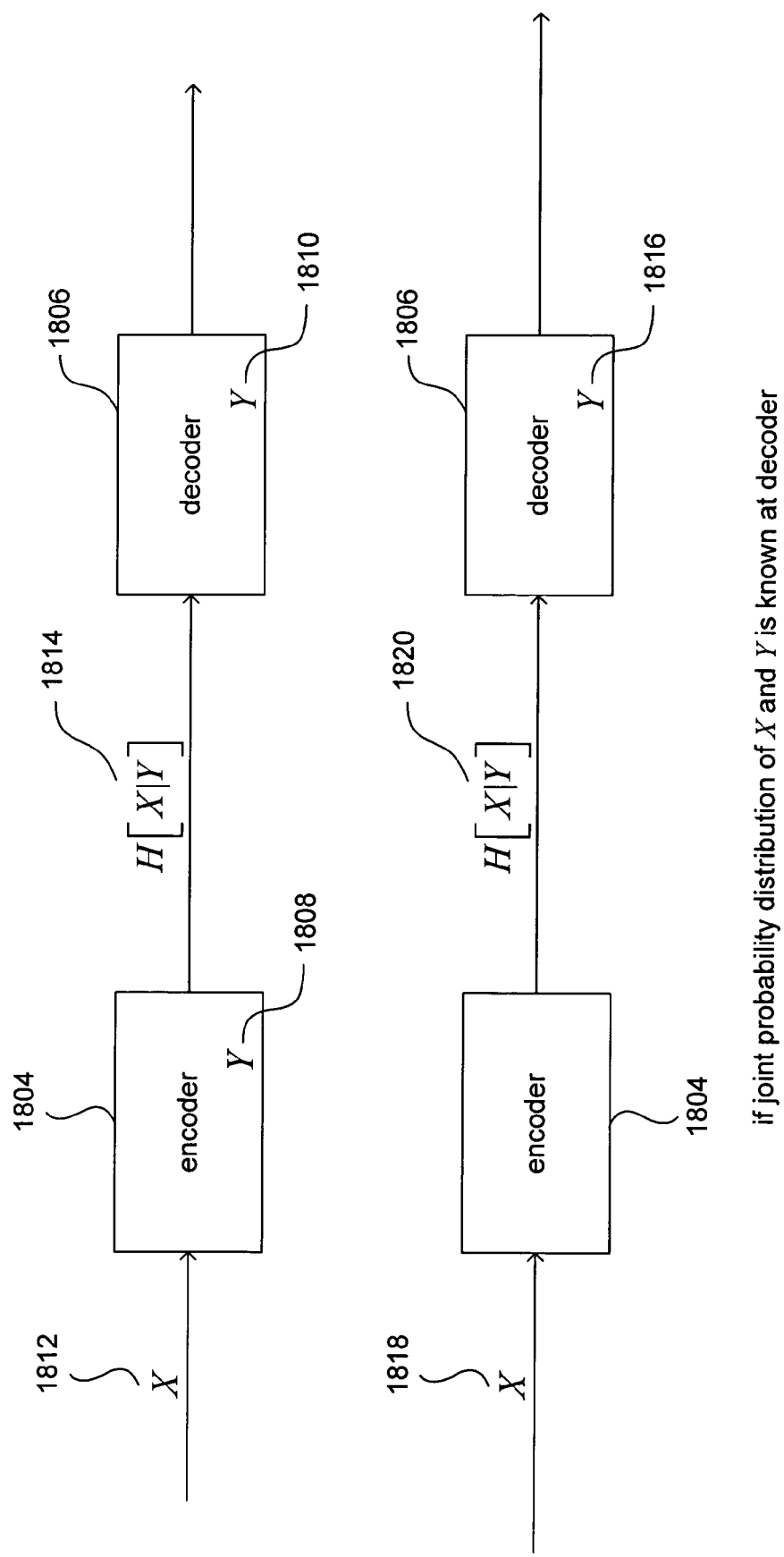
FIG. 18 illustrates the Slepian-Wolf theorem.

FIG. 18 illustrates the Slepian-Wolf theorem. As discussed with reference to FIGS. 16 and 17, if both the encoder and decoder of an encoder/decoder pair maintain symbol string Y in memory 1808 and 1810 respectively, then symbol string X 1812 can be encoded and losslessly transmitted by the encoder 1804 to the decoder 1806 at a bit-per-symbol rate of greater than or equal to the conditional entropy H[X|Y] 1814. Slepian and Wolf showed that, if the joint probability distribution of symbols in symbol strings X and Y is known at the decoder, but only the decoder has access to symbol string Y 1816 then, nonetheless, symbol string X 1818 can be encoded and transmitted by the encoder 1804 to the decoder 1806 at a bit rate of H[X|Y] 1820. In other words, when the decoder has access to side information, in the current example represented by symbol string Y, and knows the joint probability distribution of the symbol string to be encoded and transmitted and the side information, the symbol string can be transmitted at a bit rate equal to H[X\Y].

Figure 19:
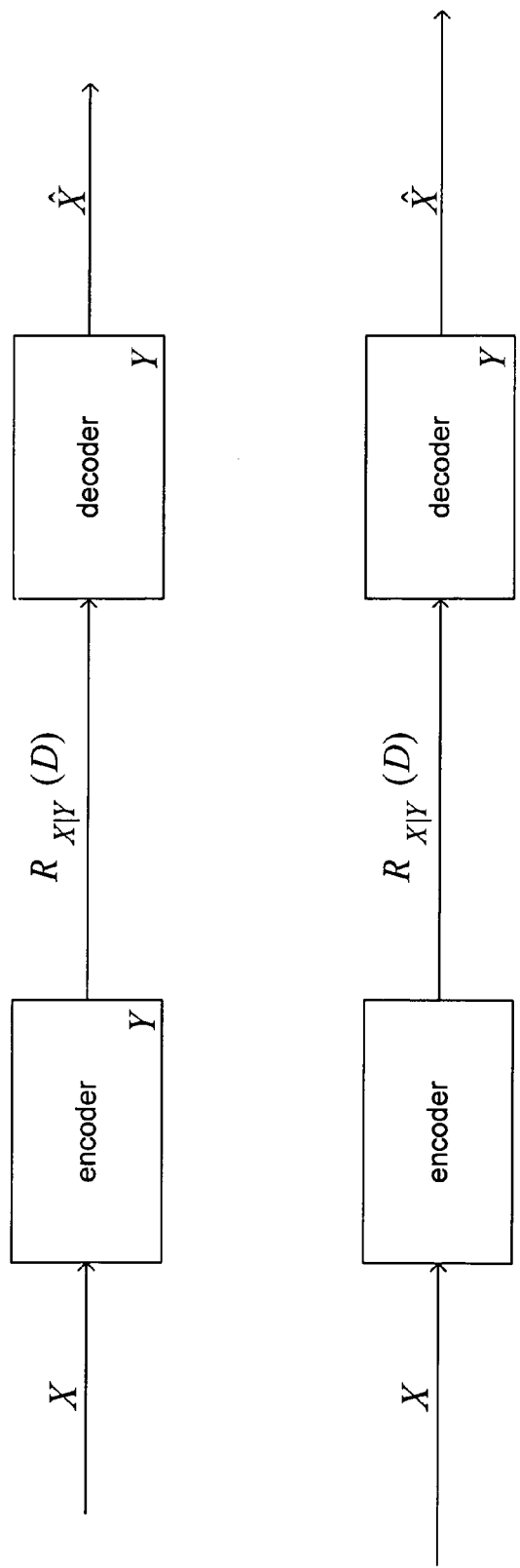
FIG. 19 illustrates the Wyner-Ziv theorem.

FIG. 19 illustrates the Wyner-Ziv theorem. The Wyner-Ziv theorem relates to lossy compression/decompression, rather than lossless compression/decompression. However, as shown in FIG. 19, the Wyner-Ziv theorem is similar to the Slepian-Wolf theorem, except that the bit rate that represents the lower bound for lossy encoding and transmission is the conditional rate-distortion function $R_{X|Y}(D)$ which is computed by a minimization algorithm as the minimum bit rate for transmission with lossy compression/decompression resulting in generating a distortion less than or equal to the threshold value D, where the distortion is defined as the variance of the difference between the original symbol string, or signal X, and the noisy, reconstructed symbol string or signal $\hat{X}$:

$$D = \sigma^2(x - \hat{x})$$
$$I(Y; X) = H[Y] - H[Y|X]$$
$$RD = \frac{\inf}{\text{conditional probability density function}} I(Y; X),$$
when $\sigma^2 \leq D$ This bit rate can be achieved even when the encoder cannot access the side information Y if the decoder can both access the side information Y and knows the joint probability distribution of X and Y. There are few closed-form expressions for the rate-distortion function, but when memoryless, Gaussian-distributed sources are considered, then the rate distortion has a lower bound:

$$R(D) \geq H[X] - H[D]$$

where H[D] is the entropy of a Gaussian random variable with $\sigma^2 \leq D$.

Thus, efficient compression can be obtained by the method of source coding with side information when the correlated side information is available to the decoder, along with knowledge of the joint probability distribution of the side information and encoded signal. As seen in the above examples, the values of the conditional entropy H[X|Y] and conditional rate-distortion function $R_{X|Y}(D)$ is significantly smaller than H[X] and $R_X(D)$, respectively, when X and Y are correlated.

Overview of the Present Invention

Figure 20:
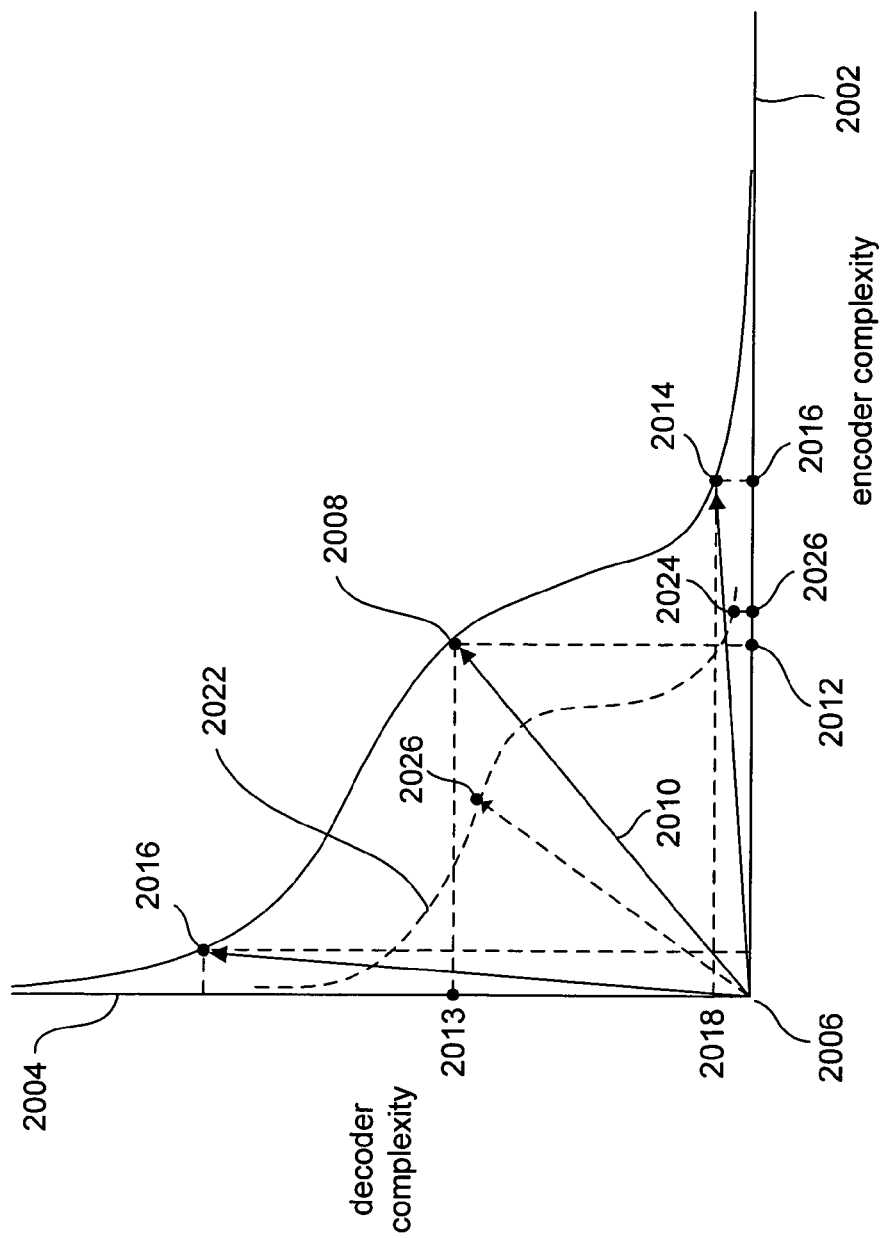
FIG. 20 graphically illustrates division of the computational burden, or computational complexity, between the encoder/compression and the decoder/decompression functionalities of a codec.

FIG. 20 graphically illustrates division of the computational burden, or computational complexity, between the encoder/compression and the decoder/decompression functionalities of a codec. In FIG. 20, encoder complexity is plotted along a horizontal axis 2002, and decoder complexity is plotted along a vertical axis 2004. The distance between the origin 2006 and a point on a complexity curve 2008, represented by the magnitude of vector 2010, corresponds to the total, overall computational burden of encoding/compression and decoding/decompression within a codec that provides a particular fidelity, or robustness. In general, the total computational burden, or computational complexity, can be divided somewhat arbitrarily between the encoder/compression functionality and decoder/decompression functionality. For example, point 2008 corresponds to a fairly even division of the computational burden between encoder/compression and decoder/decompression. In FIG. 20, the projection 2012 of vector 2010 onto the encoder complexity axis 2002 represents the computational burden allocated to the encoder/compression and a projection 2013 of vector 2010 on the vertical axis represents the portion of the computational complexity allocated to decoder/decompression. The complexity curve is generally circular over a wide range of complexity allocations, but, at complexity allocations, but, at the extremes, the overall complexity greatly increases in order to achieve additional shifting of computational burden to one of encoding/compression or decoding/decompression. For example, at point 2014, most of the computational burden is allocated to the encoder/compression functionality and very little of the computational burden 2018 is allocated to the decoder/decompression functionality. Further decrease in the computational burden allocated to the decoder/decompression functionality would require large increases in the overall computational complexity, represented by the magnitude of the vector pointing from the origin 2006 to a point further along the complexity curve.

The complexity curve corresponds to the range of codec implementations that guarantee a desired fidelity in the reconstructed signal, or robustness, at a desired bit rate. Thus each complexity curve represents a range of codec implementations that achieve a desired robustness and bit rate. If it is desired to decrease the computational burden of the encoder/compression functionality of a codec in which the bulk of computational burden is allocated to the encoder/compression functionality, a common situation in currently available codecs and represented by point 2014 in FIG. 20, then an alternative implementation, such as that represented by point 2016 in FIG. 20, may be selected, for which the computational burden is shifted from the encoder/compression functionality to the decoder/decompression functionality. Alternatively, a less robust implementation may be selected from a family of less-robust implementations represented by a complexity curve 2022, which results in a decrease of total computational burden, represented by a vector joining the origin 2006 and point 2024, and therefore a decreased encoder/compression computational burden, represented by the projection of that vector onto the horizontal axis 2026, while preserving the ratio of encoder/compression computational burden to decoder/decompression computational burden. Of course, both the allocation of computational burden as well as the total overall computational burden may be modified together in order to achieve a desired encoder/compression computational complexity and a desired decoder/decompression computational complexity.

Figure 21:
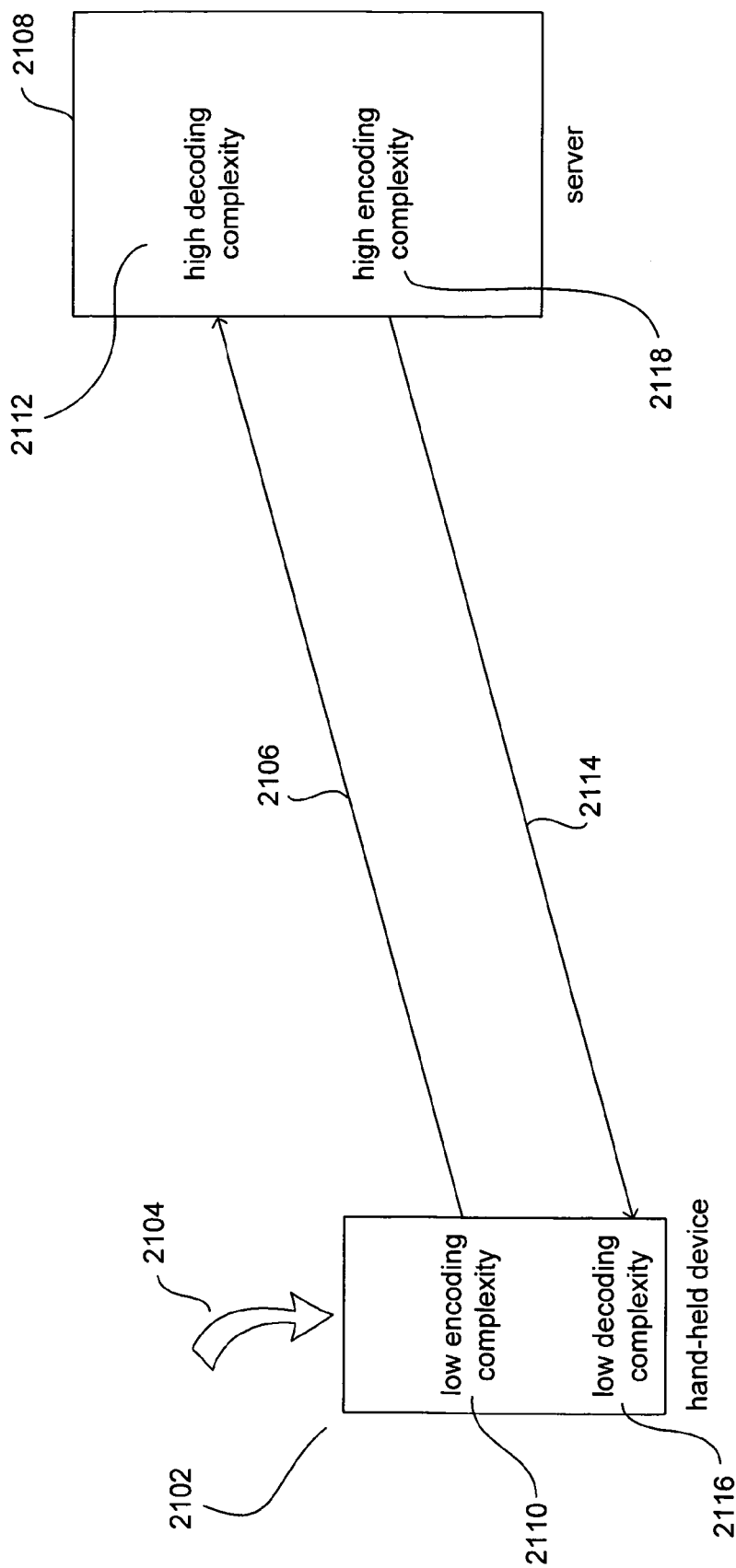
FIG. 21 illustrates a problem domain to which embodiments of the present invention may be applied.

FIG. 21 illustrates a problem domain to which embodiments of the present invention may be applied. As discussed above, the emergence of relatively inexpensive, consumer hand-held video recording devices with modest computational capabilities 2102 has created a need for reverse complexity codecs. The hand-held devices record signals 2104, such as motion images recorded via a video camera, encode the signals, and transmit the signals 2106 to a relatively high-powered server 2108, or other receiving entity, for storage, display, and processing. Because the hand-held device has modest computational capabilities, a low-complexity encoding functionality is needed 2110. In this application, low-complexity encoding can be achieved by shifting the computational burden to decoding functionality 2112 within the high-powered server. However, the hand-held device may also need to receive and decode encoded signals 2114 and 2116 in order to display video signals transmitted from remote sources. In this case, a low complexity decoder/decompression functionality is required within the hand-held device and, in many situations, the total computational burden can be shifted to a more complex encoding functionality 2118 within the remote source. Similarly, the hand-held device may need to be able to decode and display signals internally encoded and stored by the hand-held device. Although it might be possible to implement two different codecs, corresponding to points 2014 and 2016 in FIG. 20, within the hand-held device, employing multiple codecs adds significant cost and complexity to the hand-held device. As another approach, a less robust codec, such as that represented by point 2026 in FIG. 20, might be implemented to achieve reasonably low complexity in both the encoding/compression functionality and the decoding/decompression functionality within the hand-held device. However, the overall fidelity and robustness of signal reconstruction would significantly suffer.

Figure 22:
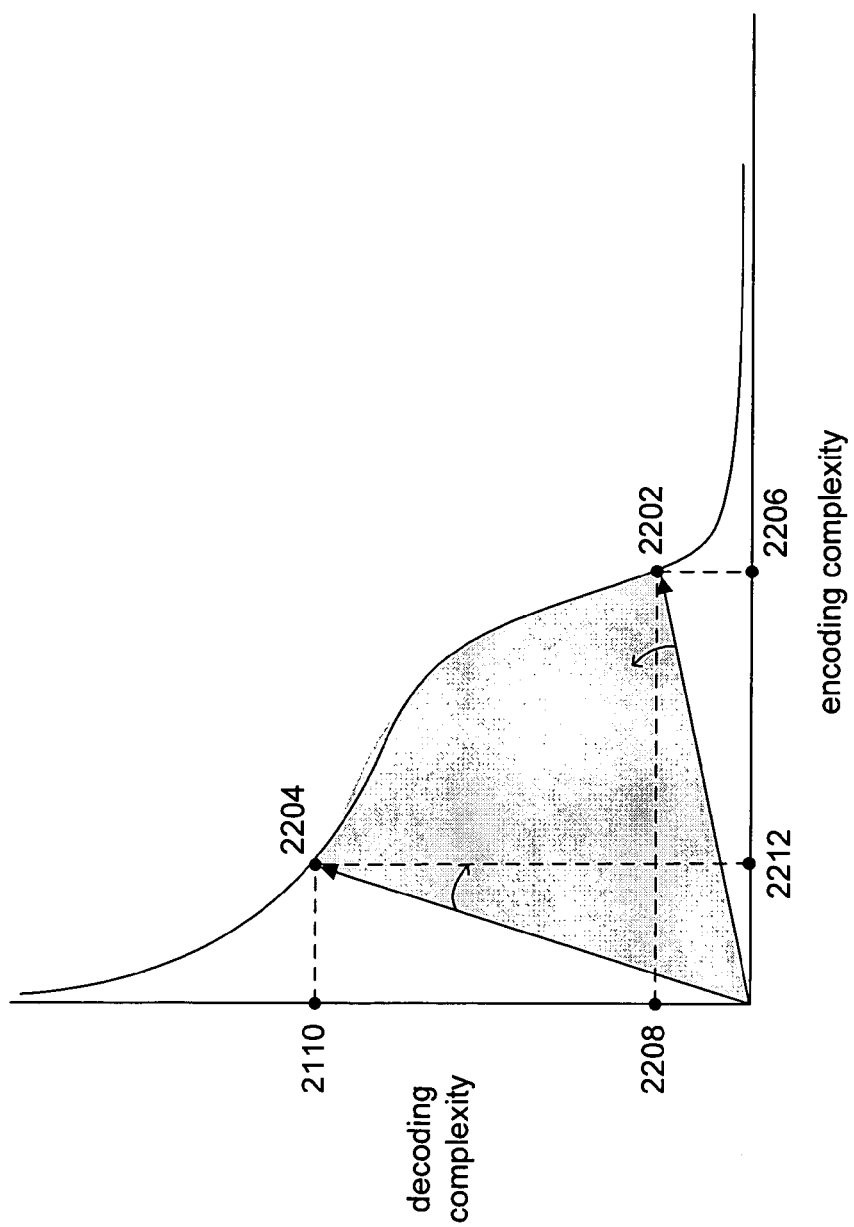
FIG. 22 illustrates a concept underlying embodiments of the present invention.

FIG. 22 illustrates a concept underlying embodiments of the present invention. FIG. 22 uses the same illustration conventions used in FIG. 20. Rather than using two codecs within hand-held video recording devices, and other consumer devices that need to both encode/compress and decode/decompress with low computational complexity, as discussed with reference to FIG. 21, a single codec may be used that provides for adjustment of the division of computational burden between encoding/compression and decoding/decompression functionality over a range of different divisions. As shown in FIG. 22, the partitioning of computational burden may be adjusted along the computational curve line segment from point 2202 to point 2204, preserving the same overall computational complexity. At one extreme, the bulk of computational burden falls on the encoding/compression functionality represented by point 2206 while the decoding/decompression functionality has relatively low computational complexity represented by point 2208. At the other extreme, the bulk of the computational burden is shifted to the decoding/decompression functionality, represented by point 2210, with relatively little computational burden imposed on the encoding/compression functionality, represented by point 2212. The adjustable codec of the present invention allows for maintenance of a desired robustness over the range of different computational-complexity divisions represented by the region of the complexity curve between points 2202 and 2204. In addition, in certain cases, the adjustable codec and be adjusted to provide decreased robustness, or, in other words, to a different complexity curve, in order to further decrease the computational burden imposed on the decoder/decompression functionality.

Figures 23A, 23B:
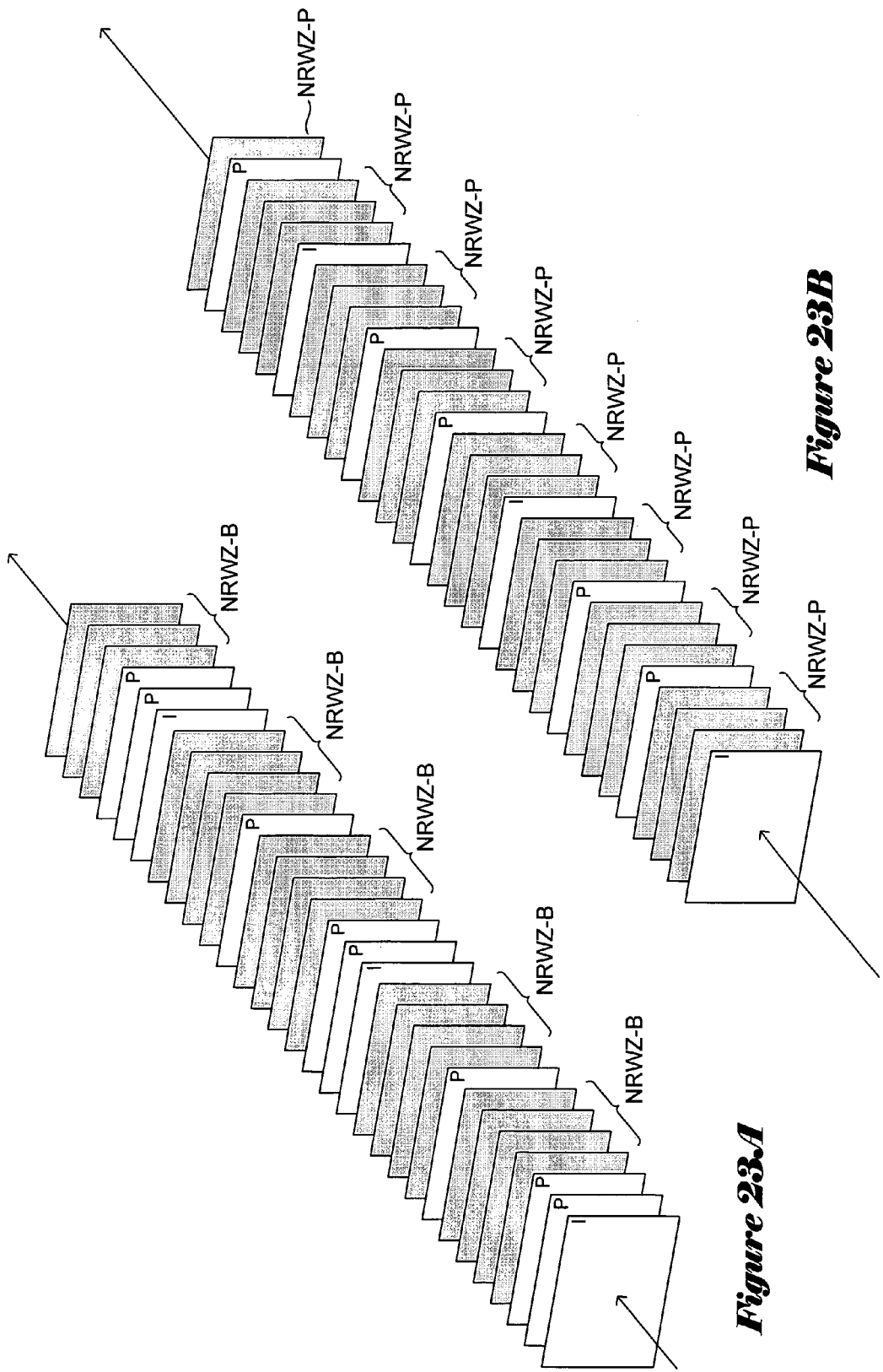
FIGS. 23A-B illustrate two different generalized embodiments of the present invention.

FIGS. 23A-B illustrate two different generalized embodiments of the present invention. As shown in FIG. 23A, a codec that operates according to current video compression standards is modified to encode B frames, shown shaded in FIG. 23A, by a Wyner-Ziv method, which shifts computational burden from the encoding/compression functionality to the decoding/decompression functionality, since the decoder/decompression functionality needs to employ more complex methods for utilizing side information and joint probability distributions to decode the Wyner-Ziv-encoded B frames. In this embodiment, the Wyner-Ziv encoding is directed to B-frame encoding to produce non-reference-frame, Wyner-Ziv-encoded B frames ("NRWZ-B frames"). In an alternative embodiment, shown in FIG. 23B, a number of non-reference P frames interleaved between regularly spaced I frames and P frames are encoded by non-reference-frame Wyner-Ziv P-frame encoding to produce non-reference Wyner-Ziv-encoded P frames ("NRWZ-P frames"). The alternative embodiment shifts less computational burden to the decoder/decompression functionality.

As discussed above, the number of non-reference frames used in each GOP is dynamically adjustable. For relatively low transmission rates, when excess processing cycles may be available at the receiving entity, a large number of non-reference frames can be employed to increase resolution. By contrast, when transmission rates are high, and fewer processing cycles are available at the receiving entity, the number of non-reference frames can be decreased. Thus, one way of adjusting the partitioning of computational burden is by adjusting the number of NRWZ-B frames or NRWZ-P frames included in each GOP. Another way of adjusting the computational burden allocated to the decoding/decompression functionality of codecs that represent embodiments of the present invention is for the decoding/decompression functionalities to ignore NRWZ-B frames and NRWZ-P frames, and decode only the reference frames. This both lowers the overall computational complexity of the codec, and decreases the fidelity of reconstruction of frames, but, at the same time, reallocates the overall computational complexity by shifting the computational burden more towards the encoding/compression functionality. A yet additional method for adjusting the division of computational complexity is to change the resolution at which NRWZ-B and NRWZ-P frames are encoded, as well as changing the nature of the side information employed by the decoder. Because there are so many adjustment techniques, and ranges of computational-burden divisions, a codec designed according to the present invention can, over a relatively wide range of divisions, provide a very fine adjustment of the division of computational complexity.

In summary, traditional and currently available codecs allocate significantly greater portions of computational burden to the encoder/compression functionality of a codec, but, by using NRWZ-B frames and NRWZ-P frames, rather than traditional B frames and P frames, embodiments of the present invention shift computational complexity towards the decoding/decompression functionality of a codec. However, the shifting of computational complexity can be adjusted more or less continuously by altering the number of non-reference frames used, by selectively ignoring non-reference frames at the decoder/decompression functionality, and by adjusting the nature of the side information used by the decoder/decompression functionality to decode NRWZ-B and NRWZ-P frames and the resolution at which NRWZ-B and NRWZ-P frames are encoded. By using Wyner-Ziv coding only for non-reference frames, drift arising from Wyner-Ziv encoding is constrained only to each subsequence of Wyner-Ziv-encoded non-reference frames, and is corrected with decoding of each reference frame. Only minimal changes to currently implemented codecs and encoding standards are needed, since non-reference frames are encoded by current techniques and standards. In addition, by restricting Wyner-Ziv encoding to non-reference frames, larger block-length channel codes can be used that potentially span multiple Wyner-Ziv-encoded frames.

Detailed Description of Various Embodiments of the Present Invention

As discussed in the previous subsection, embodiments of the present invention encode B frames as NRWZ-B frames or, alternatively, encode P frames as NRWZ-P frames. In the following discussion, standard encoding of B frames and Wyner-Ziv encoding of B frames to produce NRWZ-B frames is discussed. These methods, as discussed above with reference to FIG. 10, are similar to the methods for encoding standard P frames and NRWZ-P frames, the latter requiring use of only a previous frame, rather than both a previous and subsequent frame, and a single motion vector per macroblock, rather than two motion vectors per macroblock. In the interest of brevity, only B-frame encoding and NRWZ-B frame encoding is described in this subsection.

Figure 24:
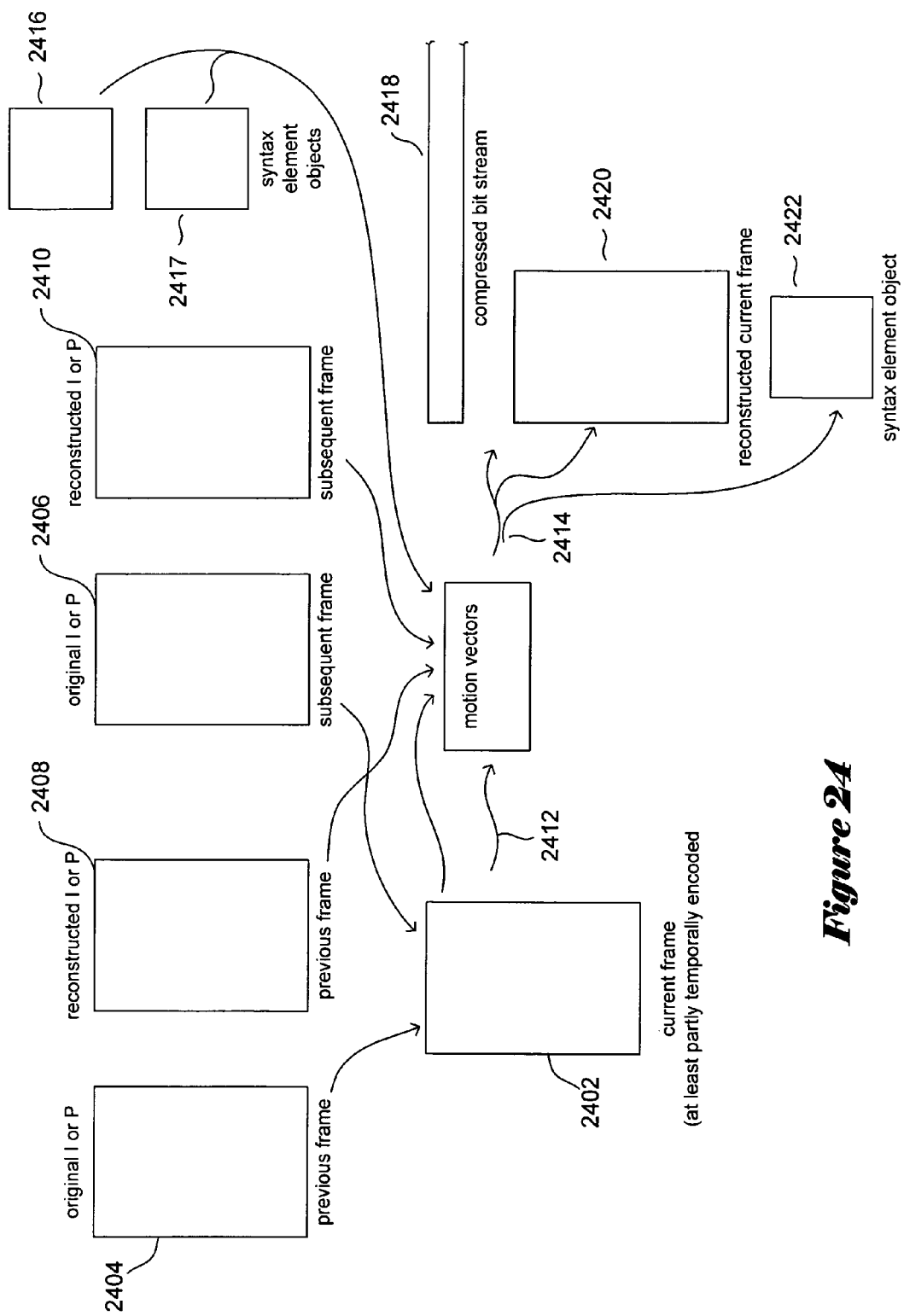
FIG. 24 illustrates standard encoding of a B frame.

FIG. 24 illustrates standard encoding of a B frame. In this discussion, it is assumed that at least some portion of the macroblocks within the B frame are temporally encoded using both a previous frame and subsequent frame. As discussed above, certain of the macroblocks may be only spatially encoded, and others may be temporally encoded using only a previous frame and single motion vector, as in the case of P-frame encoding. Thus, FIG. 24 assumes the more complex type of temporal encoding, in order to show the maximal amount of information needed for B-frame encoding, with the understanding that, in certain embodiments of the present invention, certain of the macroblocks within the B frame may be more simply encoded, and use less information.

In addition to the current frame that needs to be encoded 2402, B-frame encoding of the current frame generally uses an originally received previous frame 2404 and originally received subsequent frame 2406 in order to locate best-matching macroblocks and compute motion vectors, and also uses a reconstructed version of the previous frame 2408 and a reconstructed version of the subsequent frame 2410 for computing the residual frame during temporal encoding. The residual frame needs to be computed from reconstructed frames, since only reconstructed frames are available to the decoder. The reconstructed previous and subsequent frames 2408 and 2410 are produced during a prior encoding of the original previous and subsequent frames. As discussed with reference to FIG. 2, GOP frames are reordered with respect to the original video signal, in order that the reconstructed reference frames are available for B-frame encoding of B frames. As discussed above, reconstructed frames contain additional noise due to information lost in the compression/decompression cycle due to quantization of frequency-domain coefficients. In a first step 2412, best-matching blocks are found for each macroblock in the current frame within either or both of the original previous frame 2404 and original subsequent frame 2406 and motion vectors are computed. Then, in a second step 2414, the reconstructed previous frame 2408 and reconstructed subsequent frame 2410 are used, together with the motion vectors and syntax element objects 2416-17 for both the previous frame and subsequent frame, to produce the compressed bit stream 2418, a reconstructed version of the current frame 2420 that will be subsequently produced by the decoder/decompression during decompression, and a syntax element object 2422 for the current frame.

Figure 25A:
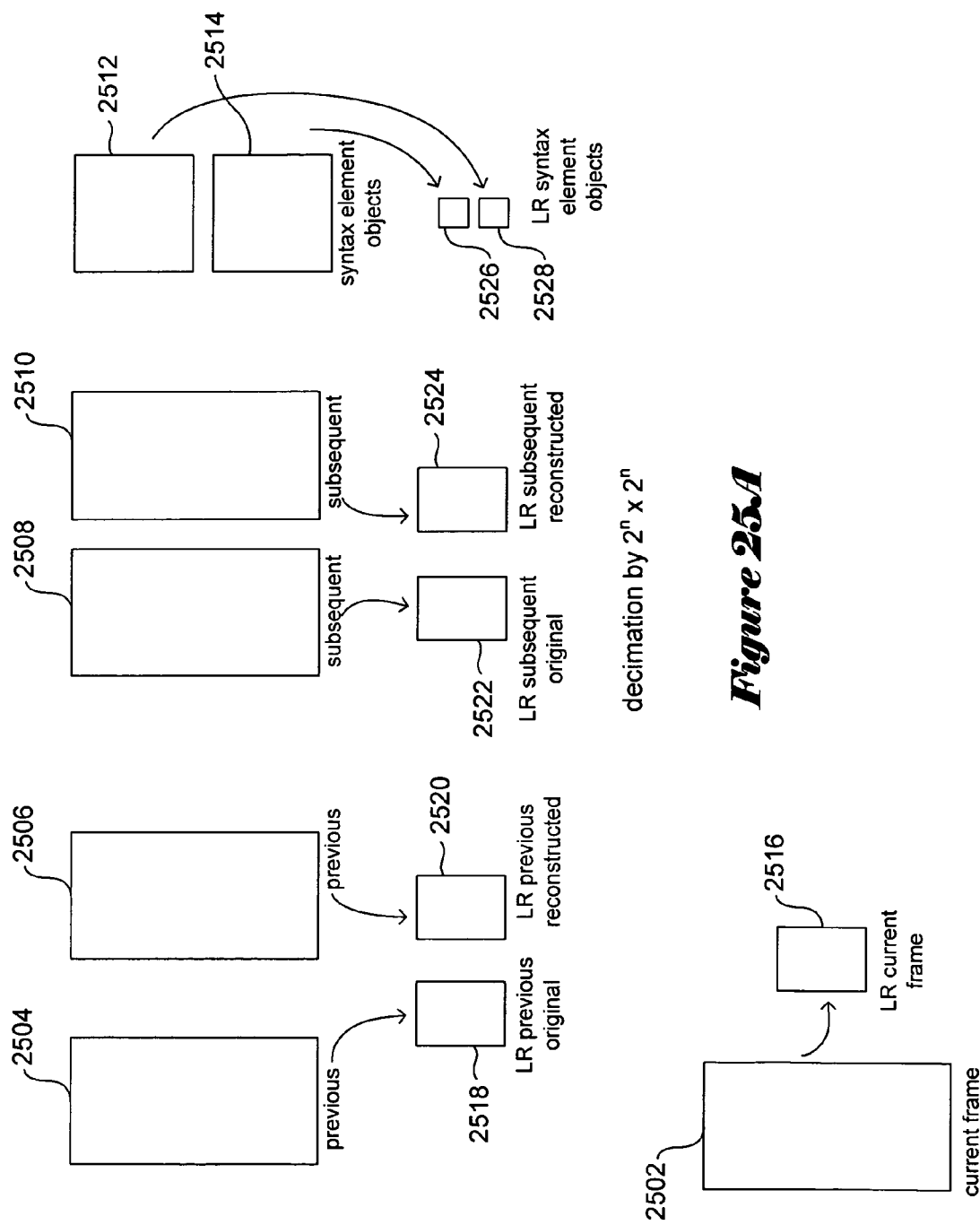
FIGS. 25A-C illustrate NRWZ-B-frame encoding according to an embodiment of the present invention.
Figure 25B:
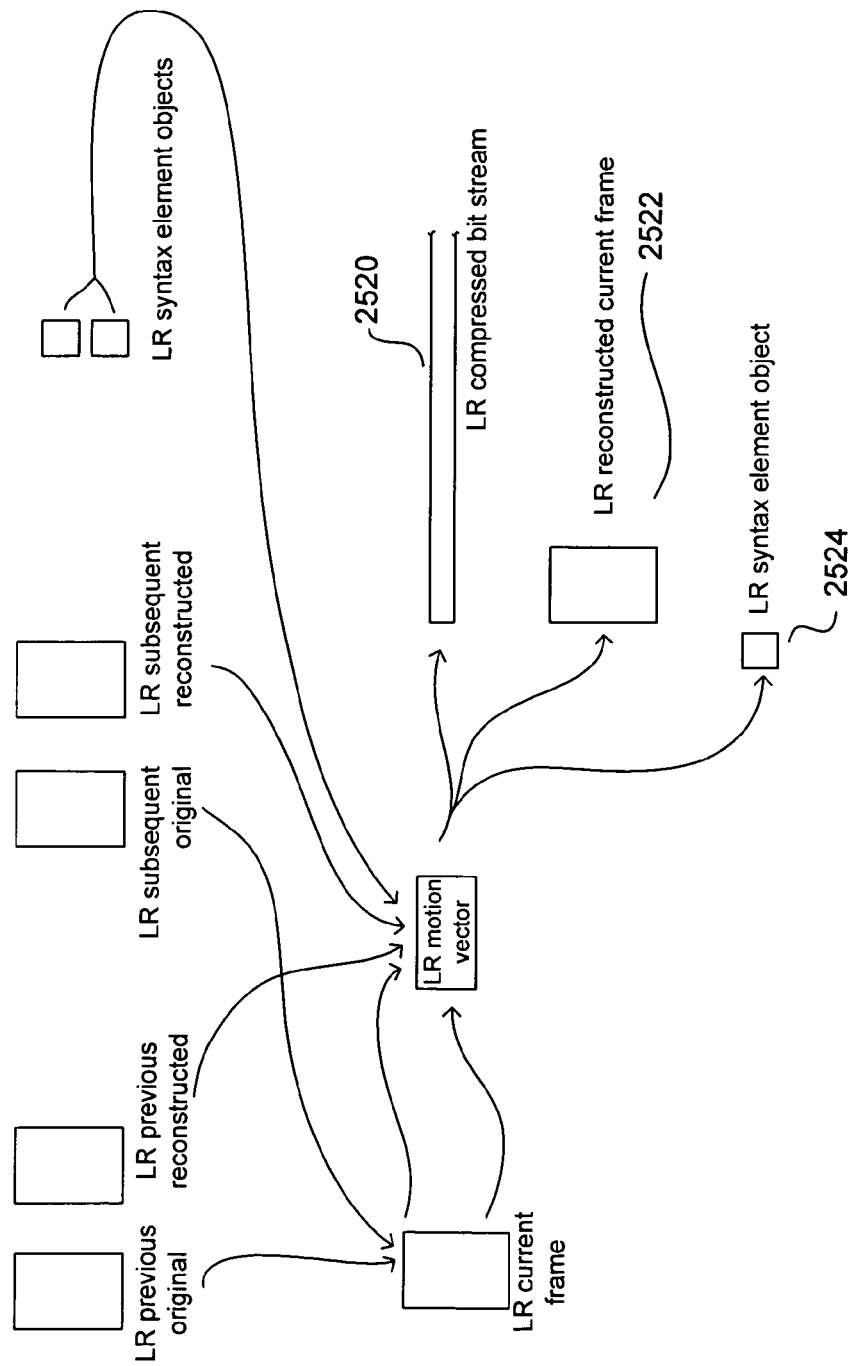
Figure 25C:
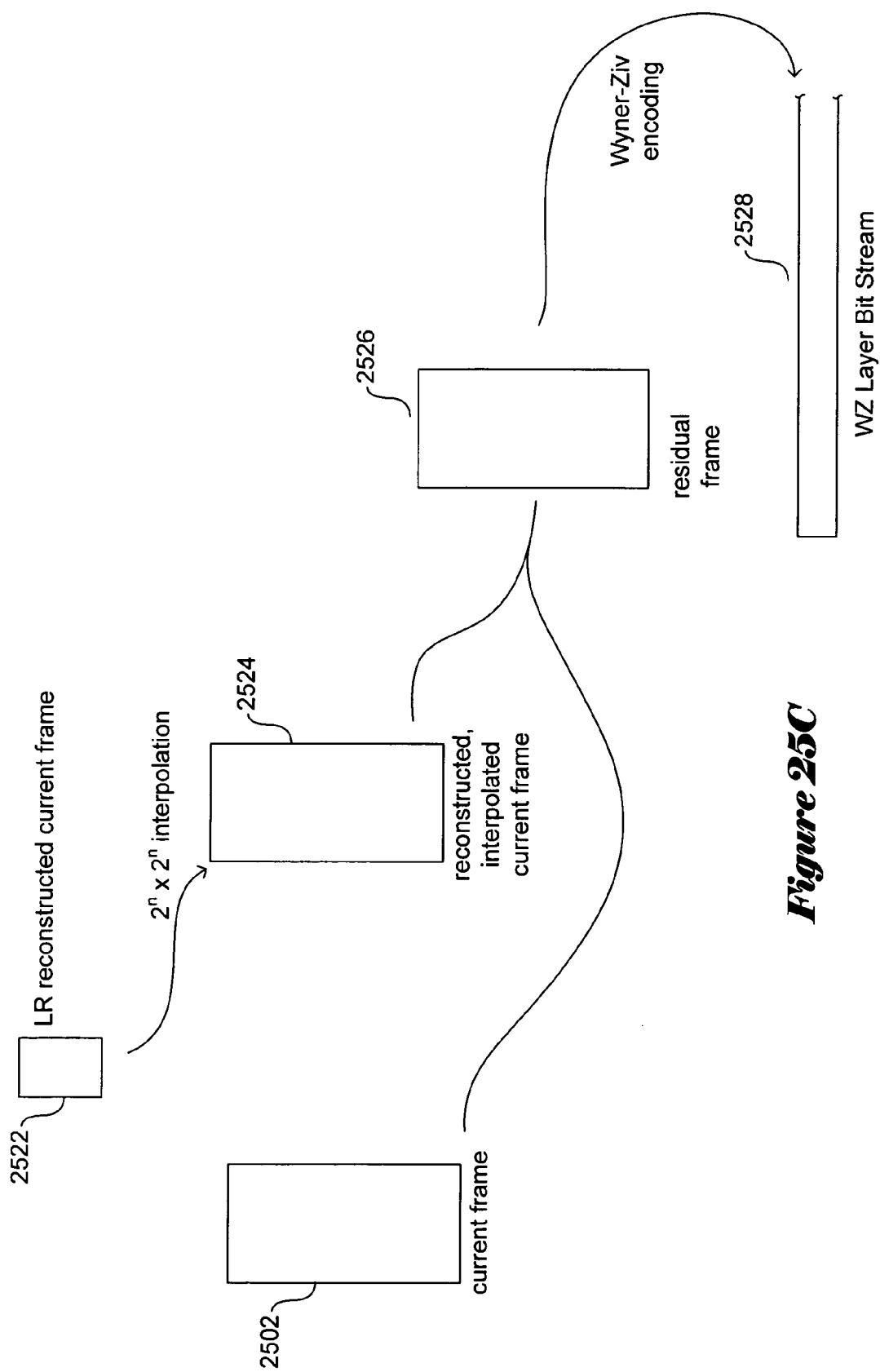

FIGS. 25A-C illustrate NRWZ-B-frame encoding according to an embodiment of the present invention. Again, NRWZ-B encoding is illustrated assuming that at least a portion of the macroblocks within the current frame are temporally encoded using a previous frame and current frame and two motion vectors. As with standard B-frame encoding, NRWZ-B-frame encoding encodes a current frame 2502 using a previous original frame 2504, a previous reconstructed frame 2506, a subsequent, original frame 2508, a reconstructed version of the subsequent frame 2510, and syntax-element objects 2512 and 2514 for both the previous and subsequent frames. In a first step, all of these frames and syntax-element objects are decimated by a factor of $2'' \times 2''$ to produce low resolution ("LR") versions of the current frame 2516, the previous original and previous reconstructed frames 2518 and 2520, the subsequent original frame and subsequent reconstructed frame 2522 and 2524, and the syntax element objects 2526 and 2528. Decimation of all of these objects may not be needed for NRWZ-B-frame encoding of each B frame, since two or more B frames may rely on the same previous and subsequent reference frames. Thus, encoding employs low-resolution versions of all of the data objects in order to produce a low-resolution encoded bit stream.

By encoding at low resolution, a relatively large amount of processing is avoided. However, the savings in processing overhead are obtained by additional computational burdens of $2'' \times 2''$ decimation of the data objects, generally a relatively straightforward task, and by the lower resolution of the compressed signal produced. However, as discussed later, the lower-resolution signal is compensated for, at the decoder, by using side information in order to produce reconstructed frames with near-original resolution. Thus, computational overhead is reallocated between the encoder/compression functionality and the decoder/decompression functionality. The encoder computational burden is significantly decreased by encoding frames at low resolution, but the decoder/decompression functionality's burden is significantly increased by need to return low-resolution reconstructed frames to near-original resolution using Wyner-Ziv channel decoding and side information.

As shown in FIG. 25B, low-resolution encoding of the low-resolution version of the current frame proceeds exactly as with standard B-frame encoding, discussed with reference to FIG. 24. Low-resolution current-frame encoding produces a low-resolution compressed bit stream 2520, a low-resolution reconstructed current frame 2522, and a low-resolution syntax-element object for the current frame 2524. Next, as shown in FIG. 25C, in a series of steps not encountered in standard B-frame encoding, the low-resolution reconstructed current frame 2522 is interpolated back to a full-sized, low-resolution, reconstructed, interpolated current frame 2524. The reconstructed, interpolated current frame 2524 is subtracted from the current frame, intensity-value-by-intensity-value to produce a residual current frame 2526 which is then encoded using Wyner-Ziv encoding to produce a Wyner-Ziv-layer bit stream ("WZ Layer bit stream") 2528 that is used by the decoder/decompression functionality to restore low resolution reconstructed frames to near-original-resolution reconstructed frames. Thus, NRWZ-B-frame encoding produces both a low resolution compressed bit stream 2520 and a WZ Layer bit stream 2528. Both bit streams are merged together to produce a merged, compressed bit stream from which the low resolution compressed bit stream 2520 and a WZ Layer bit stream can be recovered by the decoder.

Figure 26A:
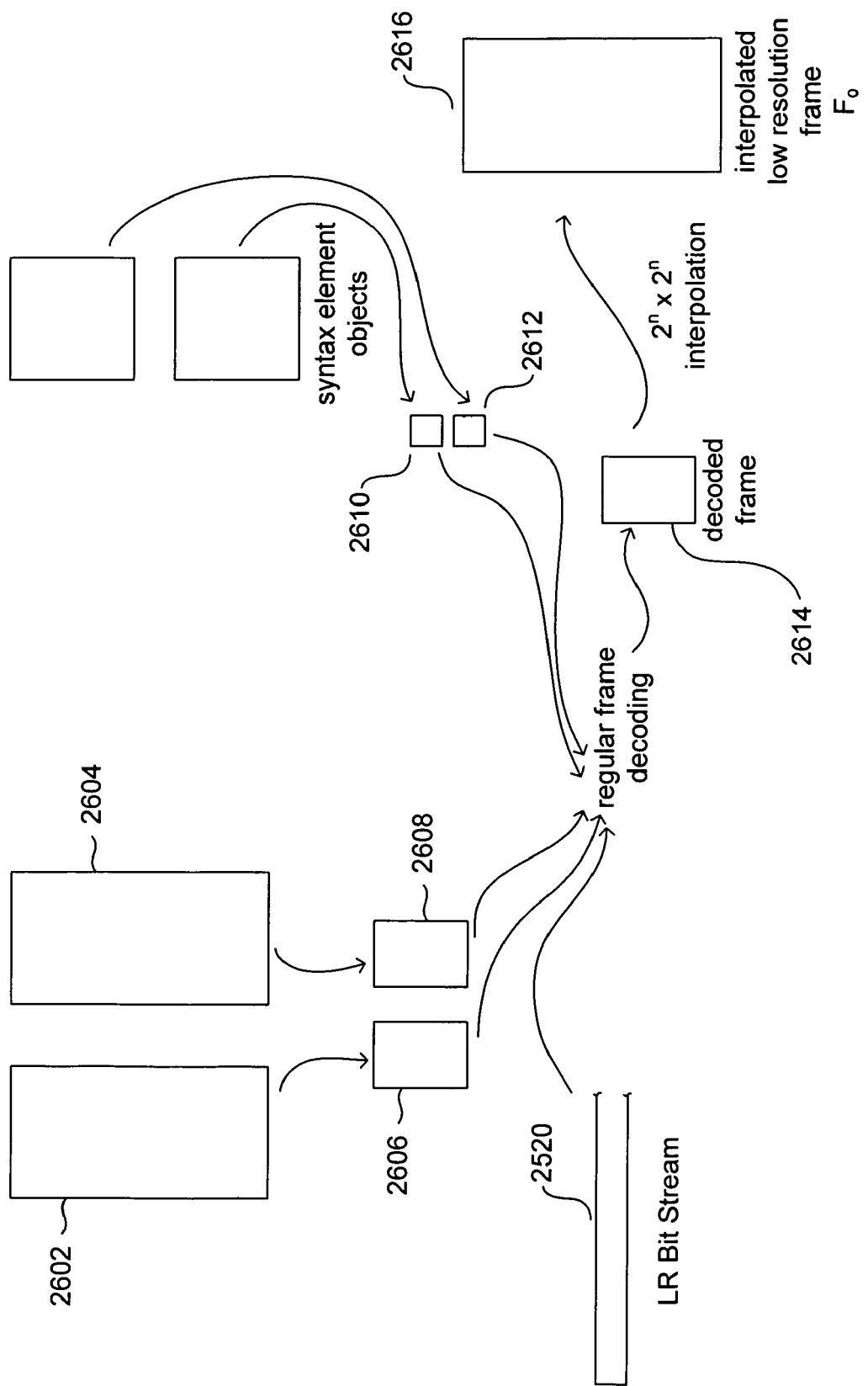
FIGS. 26A-D illustrate decoding of an NRWZ-B frame according to one embodiment of the present invention.
Figure 26B:
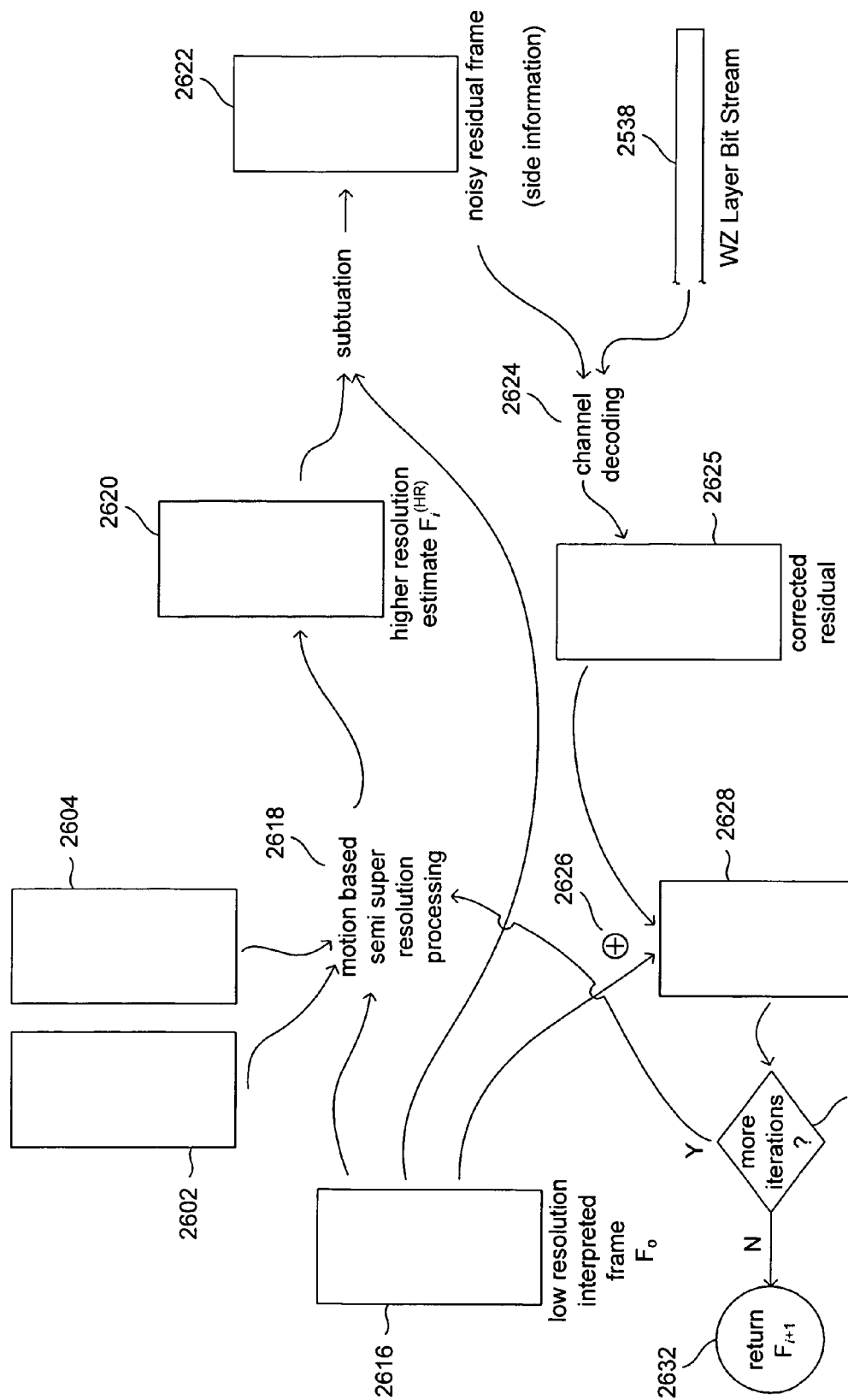

FIGS. 26A-D illustrate decoding of an NRWZ-B frame according to one embodiment of the present invention. The low-resolution compressed bit stream 2520 is partially decompressed to recover motion vectors and quantized residual frame coefficients. Reconstructed versions of the previous frame 2602 and the subsequent frame 2604 are decimated to produce low-resolution versions of the previous frame 2606 and subsequent frame 2608. Using the low-resolution versions of the previous and subsequent frames 2606 and 2608, and the motion vectors recovered from the low-resolution bit stream 2520, as well as low-resolution versions of the syntax-element objects 2610 and 2612 for the previous and subsequent frames, a low-resolution decoded frame 2614 corresponding to the currently decoded frame is produced. The low-resolution, decoded frame is then interpolated to produce an interpolated, low-resolution frame $F_0$ 2616 with the same number of intensity values as the original frame prior to encoding, but at low resolution due to loss of data during the decimation of the frame during encoding/compression. Next, as shown in FIG. 26B, the low-resolution interpolated frame $F_0$, and the full-size reconstructed previous and subsequent frames 2602 and 2604 are used in a motion-based semi-super resolution processing step 2618, to be described in more detail below, to produce an estimated higher-resolution frame $F_i^{(HR)}$ 2620. The estimated higher-resolution frame $F_i^{(HR)}$ 2620 is the first estimated higher-resolution frame produced in an iterative process that employs the WZ Layer bit stream produced during encoding/compression to gradually improve the resolution of the reconstructed current frame. In this iterative process, the current estimated higher-resolution frame $F_i^{(HR)}$ 2620 is subtracted from the low-resolution interpolated frame $F_0$ 2616 to produce a noisy residual frame 2622. The noisy residual frame is the side information used in Wyner-Ziv decoding of the WZ Layer bit stream.

Next, the noisy residual frame 2622 is used with the WZ Layer bit stream in a channel decoding process 2624 to produce a corrected residual frame that approximates the residual frame (2526 in FIG. 26) produced during the encoding/compression stage. The corrected residual frame is added to the low-resolution interpolated frame $F_0$ 2616 to produce a next reconstructed current frame $F_{i+1}$ 2628. In step 2630, the decoder determines whether or not additional iterations of resolution enhancement are needed. The determination may be made based on a desired, fixed number of enhancement steps, or by monitoring improvement of the current reconstructed frame $F_{i+1}$ with respect to the previous reconstructed frame $F_i$ to detect convergence of the enhancement process. However the termination determination is made, if an additional enhancement step is needed, as determined in step 2630, then the current reconstructed frame $F_{i+1}$ 2628 is fed back into the motion-based semi-super resolution processing step 2618 to initiate another iteration of resolution enhancement. When no further enhancement iterations are needed or desired, the current reconstructed frame $F_{i+1}$ is returned in step 2632 as the decoded/decompressed frame recovered from the low-resolution bit steam 2520 and WZ Layer bit stream 2628.

Figure 26C:
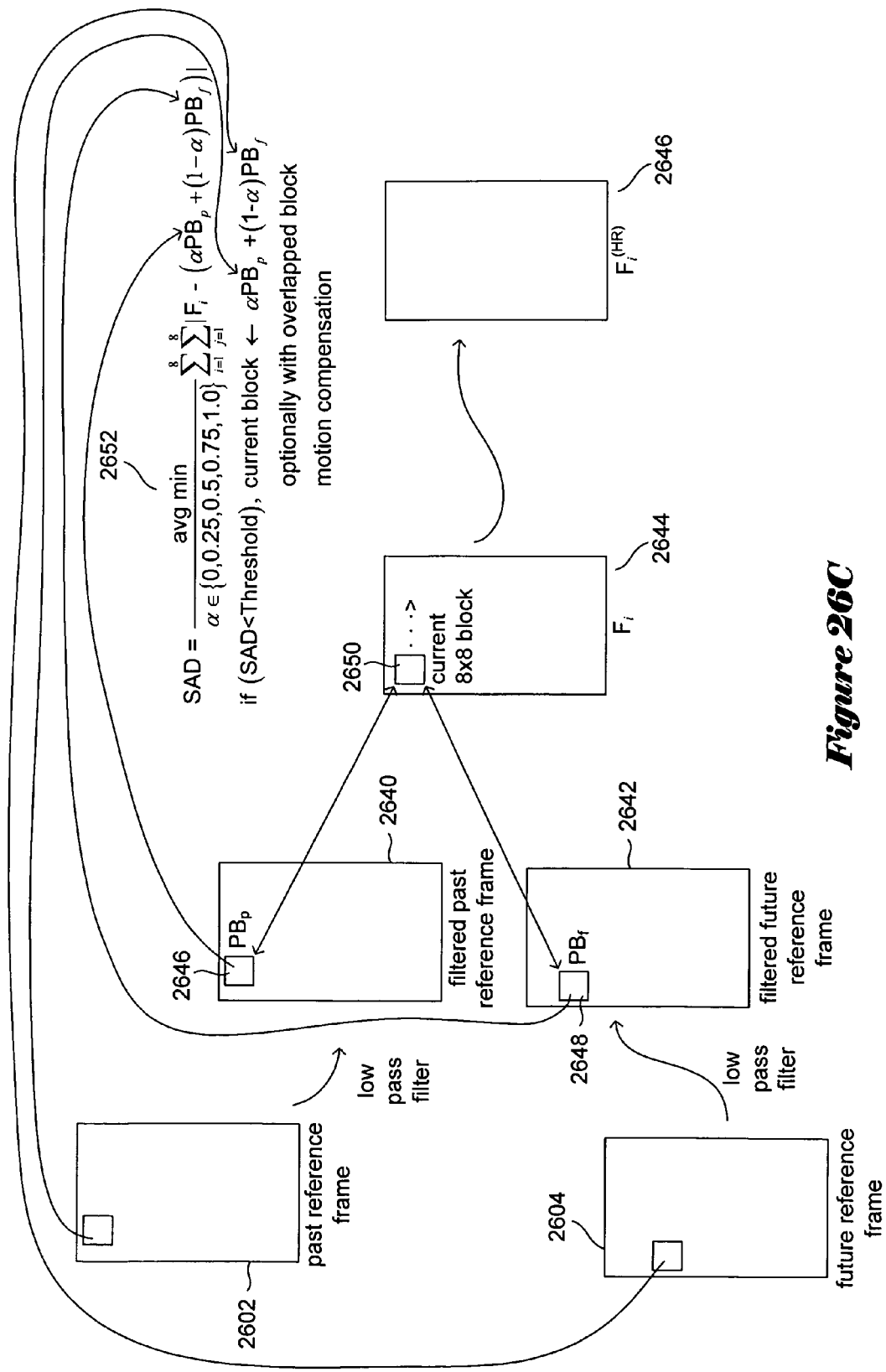

FIG. 26C illustrates the motion-based semi-super resolution processing step (2618 in FIG. 26B) used in various embodiments of the present invention. The reconstructed previous reference frame 2602 and reconstructed subsequent reference frame 2604 are low-pass filtered to produce a filtered previous reconstructed reference frame 2640 and a subsequent filtered reconstructed reference frame 2642. Low-pass filtering removes high-frequency details from the reconstructed frames. For each 8×8 block in the current reconstructed frame $F_i$ 2644, best matching blocks $PB_p$ and $PB_f$ 2646 and 2648, respectively, are found for the 8×8 block within the current reconstructed frame $F_i$ 2644. These two best matching blocks 2646 and 2648 are then variously combined in a minimization process 2652 that produces a best coefficient α for combining the two best-matching blocks 2646 and 2648. If the sum of absolute differences between the combination of the two matching blocks and the current block 2650 in the current reconstructed frame $F_i$ is less than a threshold value, 8×8 blocks at the same positions as the matching blocks in the unfiltered previous reference frame 2602 and unfiltered subsequent reference frame 2604 are extracted and combined using the coefficient a determined in the minimization procedure 2652 to produce a replacement block for the currently considered 8×8 block 2650 in the current reconstructed frame $F_i$ 2644. The replacement block is copied into the higher-resolution estimate frame $F_i^{(HR)}$ 2646 at the position of the currently considered 8×8 block. Otherwise, when suitable matching blocks cannot be found in the filtered previous and subsequent frames 2640 and 2642, currently considered 8×8 block 2650 is directly copied into the higher-resolution estimate of the current reconstructed block $F_i^{(HR)}$.

The motion-based semi-super resolution processing step illustrated in FIG. 26C is controlled by at least three parameters: (1) the strength of low-pass filtering of the previous and subsequent reconstructed frames; (2) the threshold for testing the combination of matching blocks with the currently considered block to determine whether or not to copy the currently considered block into the higher-resolution estimate $F_i^{(HR)}$ or to write the combination of matching blocks into the higher-resolution estimate $F_i^{(HR)}$; and (3) a grid-based offset for selecting 8×8 blocks in the current constructed frame $F_i$. During each iteration of the resolution enhancement portion of the decoding/decompression process, illustrated in FIG. 26B, these three parameters may be adjusted in order to additionally improve resolution. The low-pass filter strength is generally reduced for each additional iteration, because, as the current reconstructed frame $F_i$ increases in resolution with each iteration, 8×8 matching blocks 2646 and 2648 can be located with better precision in higher-resolution versions of the previous and subsequent reconstructed frames. The threshold may be decreased, so that with increasing iterations, the number of 8×8 block replacements decreases. Finally, the grid offset is changed, from iteration to iteration, in order to smooth the motion-based semi-super resolution processing over the reconstructed frames $F_i$ to prevent localized disparities arising between 8×8 blocks within the reconstructed frame $F_i$ over the course of resolution-enhancement iterations.

Figure 26D:
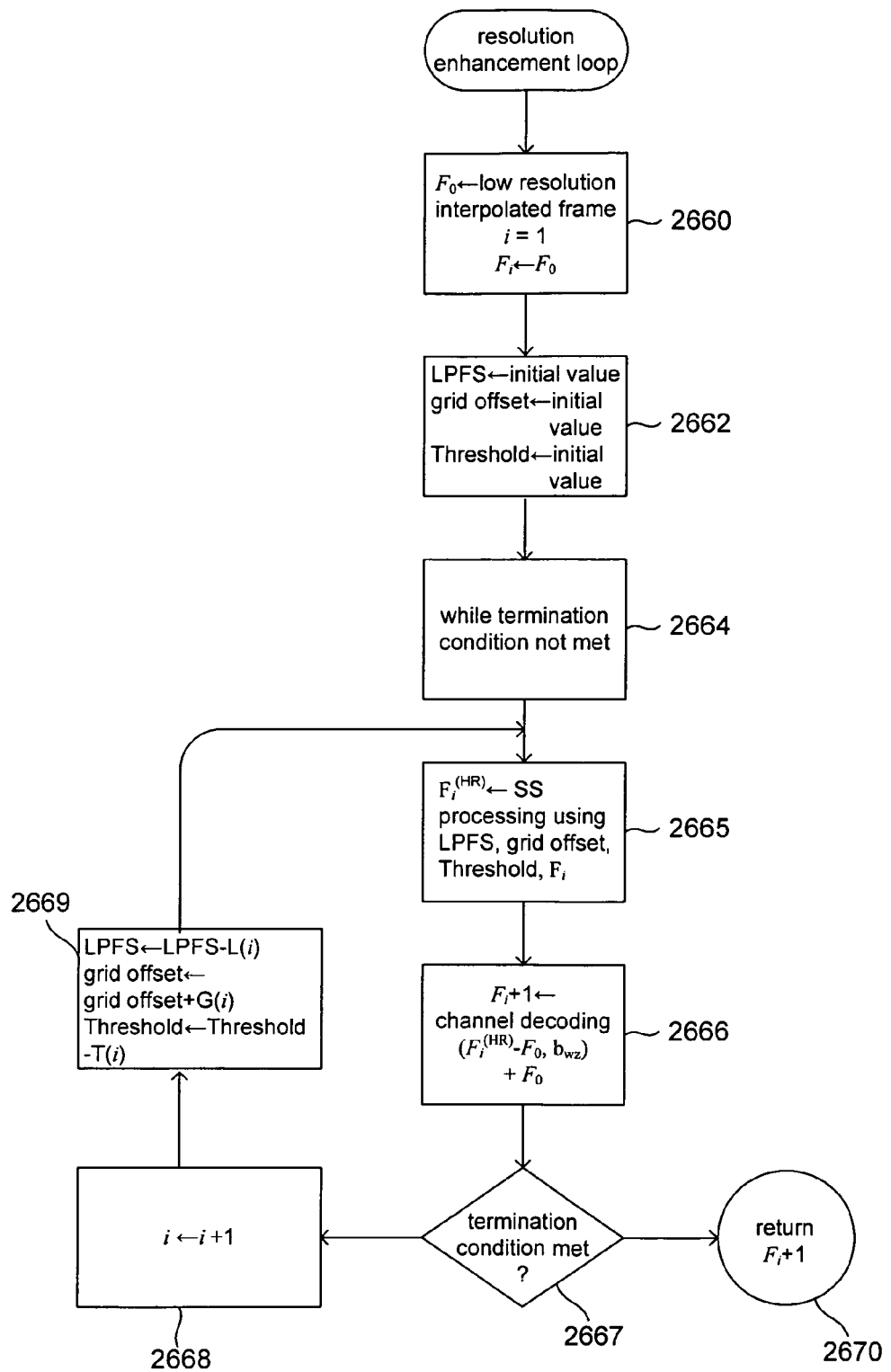

FIG. 26D is a control-flow diagram that describes the resolution-enhancement loop portion of NRWZ-B-frame decoding/decompression shown in FIG. 26B. In a first step 2660, the low resolution interpolated frame $F_0$ is produced by decoding the low resolution bit stream, the iteration variable I is set to one, and the current reconstructed frame $F_i$ is set to the low resolution interpolated frame $F_0$. Next, in step 2662, the low pass filter strength, grid offset, and threshold parameters, discussed above, are set to initial values. Then, in the while-loop of steps 2664-2669, the next higher-resolution estimate frame $F_i^{(HR)}$ is produced by motion-based semi-super solution processing using the current low pass filter strength, grid offset, and threshold parameters and the current reconstructed frame $F_i$. Next, in step 2666, a new reconstructed current frame $F_{i+1}$ is produced by channel decoding using the noisy-residual-frame site formation, the WZ Layer bit stream, and the low-resolution interpolated frame $F_0$. If the termination conditions for the resolution-enhancement loop are met, as determined in step 2667, then the current enhanced-resolution frame $F_{i+1}$ produced in step 2666 is returned in step 2670. Otherwise, the iteration variable I is incremented in step 2668, and the low-pass filter strength, grid offset, and threshold parameters are updated in step 2669.

Figure 27A:
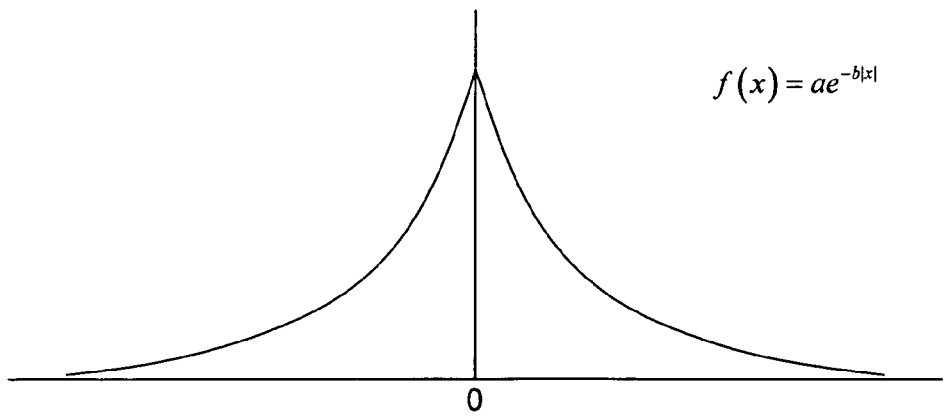
FIG. 27A shows a representative Laplacian distribution.
Figure 27B:
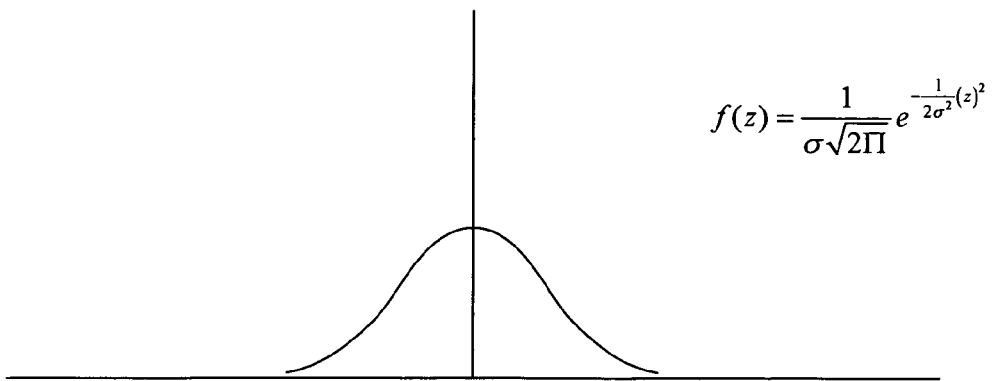
FIG. 27B shows a Gaussian distribution used in the first term of the noise model employed in various embodiments of the present invention.
Figure 27C:
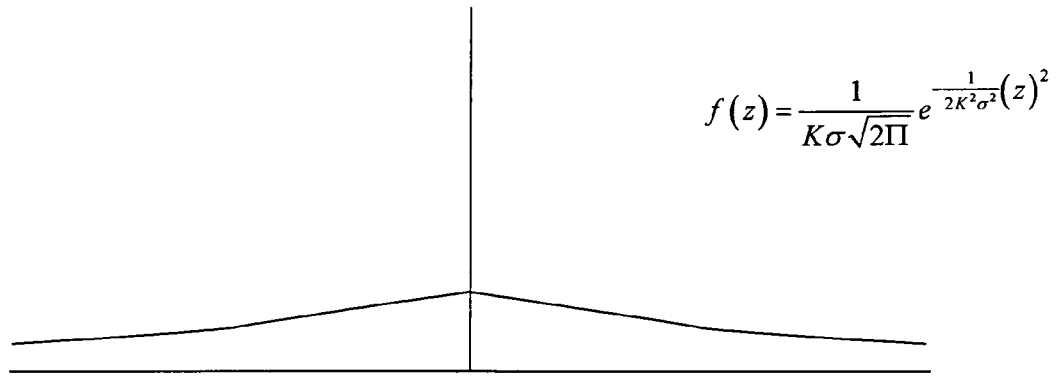
FIG. 27C shows a Gaussian distribution used in the second term of the noise model employed in various embodiments of the present invention.
Figure 27D:
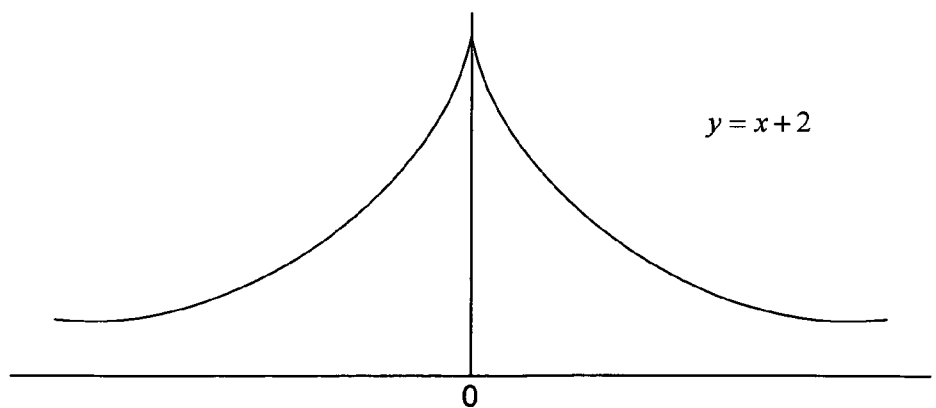
FIG. 27D shows the combined distributions that model the noisy-residual-frame coefficients y.

The Wyner-Ziv encoding and decoding portions of NRWZ-B-frame encoding and decoding are next described. As discussed above with reference to FIG. 26B, noisy-residual frame coefficients (2622 in FIG. 26B), y, are combined with residual frame (2526 in FIG. 25C) coefficients encoded in the WZ Layer bit stream (2528 in FIG. 25C), x, in a channel decoding process to produce a corrected residual frame 2625 used to generate a reconstructed current frame 2628 from the low resolution interpolated frame $F_0$ 2616. The noisy-residual frame coefficients, y, are obtained from subtraction of the high-resolution estimate frame $F_i^{(HR)}$ from the low resolution interpretive frame $F_0$. However, the residual frame coefficients, x, are obtained by subtracting a reconstructed, interpolated current frame 2524 from the original, current frame 2502. The residual-frame coefficients, x, can therefore be considered to be less noisy than the noisy-residual-frame coefficients y. Therefore, for each coefficient:

$$y_i = x_i + z_i$$

where z represents noise introduced in computing the noisy-residual-frame coefficients y. The noise z is modeled as a mixture of two Gaussians:

$$f_z(z) = p_z N(0, \sigma_z^2) + (1-p_z) N(0, K_z^2 \sigma_z^2)$$

where $N(\mu, \sigma^2)$ denotes the Gaussian distribution with mean μ and variance $\sigma^2$, $p_z$ is about 0.95, and $K_z$ is about 8. This noise model assumes that a small fraction of coefficients are corrupted during the motion-based semi-super-resolution processing step 2618 in FIG. 26B. The residual frame (2526 in FIG. 26C) coefficients, x, are modeled as being distributed according to a Laplacian distribution. FIG. 27A shows a representative Laplacian distribution. FIG. 27B shows a Gaussian distribution used in the first term of the noise model employed in various embodiments of the present invention. FIG. 27C shows a Gaussian distribution used in the second term of the noise model employed in various embodiments of the present invention. FIG. 27D shows the combined distributions that model the noisy-residual-frame coefficients y.

Figure 28:
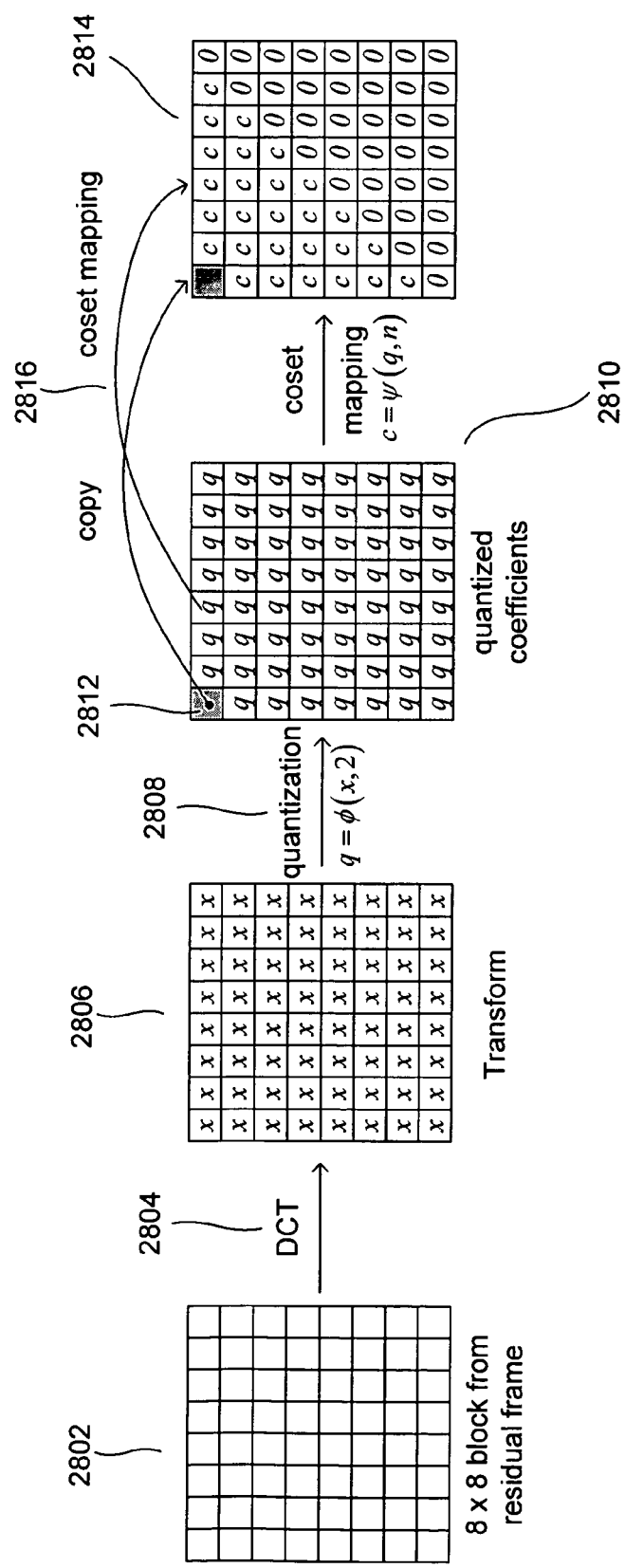
FIG. 28 illustrates the channel encoding of the residual-frame coefficients (2526 in FIG. 25C) to produce the WZ Layer bit stream according to an embodiment of the present invention.

FIG. 28 illustrates the channel encoding of the residual-frame coefficients (2526 in FIG. 25C) to produce the WZ Layer bit stream according to an embodiment of the present invention. Each 8×8 block from the residual frame (2526 in FIG. 25C) is transformed by a DCT 2804 to produce residual-frame frequency-domain coefficients x 2806. Next, the residual-frame frequency-domain coefficients x are quantized 2808 to produce an 8×8 block of quantized coefficients 2810. The quantization bin q for a frequency-domain coefficient x is computed as $q=\phi(x,Q)$. The DCM coefficient 2812 is copied directly into an 8×8 coset block 2814, and a number n of the remaining, quantized coefficients are mapped by coset mapping 2816, $c=\psi(q,M)$, in zig-zag order, to cosets c that are placed in corresponding positions in the coset block 2814.

The coset mapping function $\psi$ is defined as follows:

$$\psi(q, M) = \begin{cases} \text{sign}(q) \cdot [(|q| \bmod M)], & |q| \bmod M < M/2 \\ \text{sign}(q) \cdot [(|q| \bmod M) - M], & |q| \bmod M > M/2 \end{cases}$$

where M is the modulus used for the coset mapping.

Figure 29:
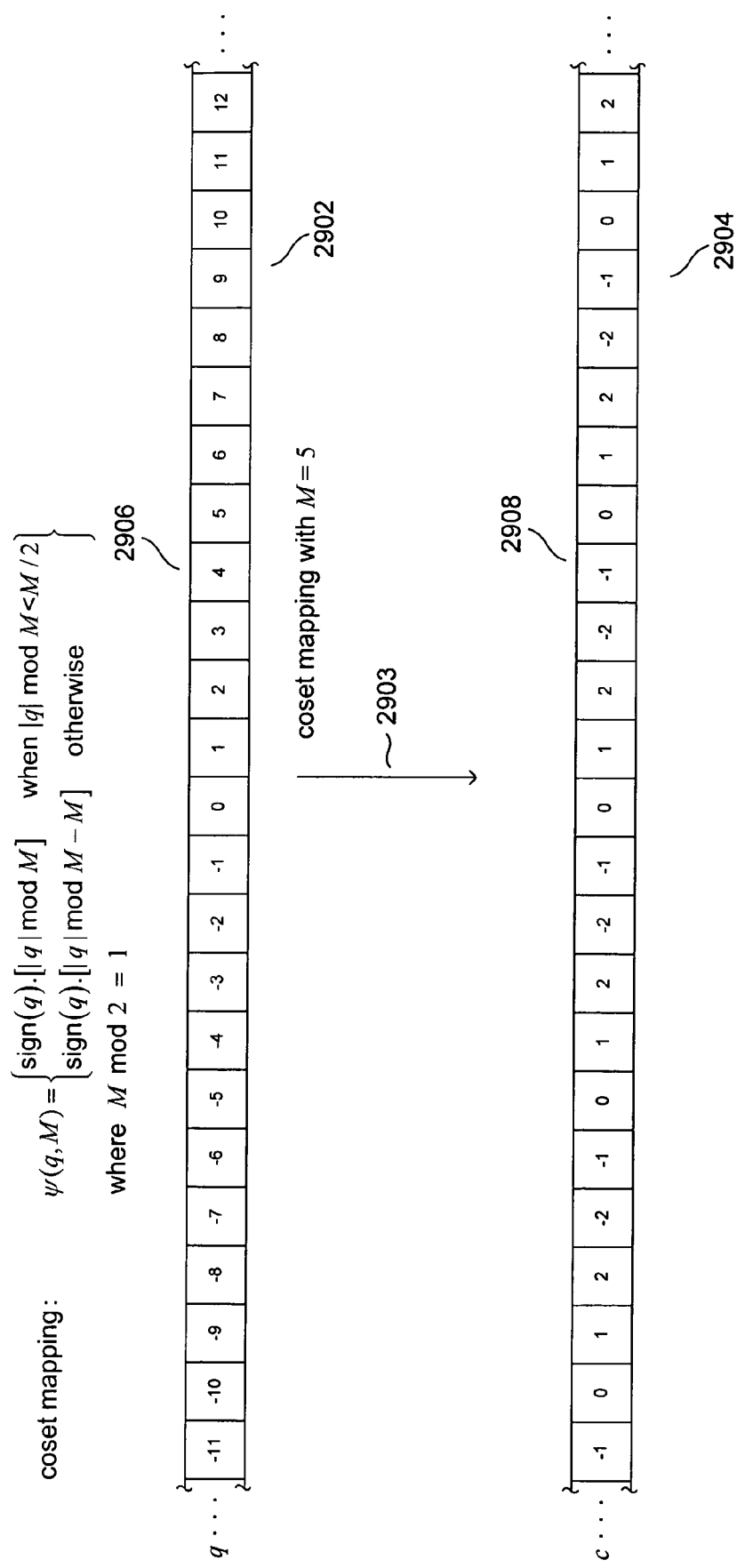
FIG. 29 illustrates coset mapping used in various embodiments of the present invention.

FIG. 29 illustrates coset mapping used in various embodiments of the present invention. In a first vector 2902, the possible values of quantized residual-frame coefficients q are placed in numerical order. In many implementations, q ranges from −127 to 127. Coset mapping of these possible residual-frame quantized coefficient values 2903 by the above-provided expression for $\psi$, with a modulus of 5, produces the corresponding coset values in the vector 2904. Thus, for example, quantized residual-frame coefficient value 4 2906 is mapped to coset value −1 2908. The coset values, when M=5, range from −2 to 2. Because there are fewer coset values than quantized residual-frame coefficient values, a string of cosets can be encoded with a smaller bit rate. However, mapping 256 values to 5 values may introduce ambiguities. For example, when the decoder receives a coset with value −1, the corresponding quantized residual-frame coefficient that generated the coset may have been −11, −6, −1, 4, 9, or other values. Various techniques may be employed to resolve such ambiguities, including using side information, discussed below.

Figure 30:
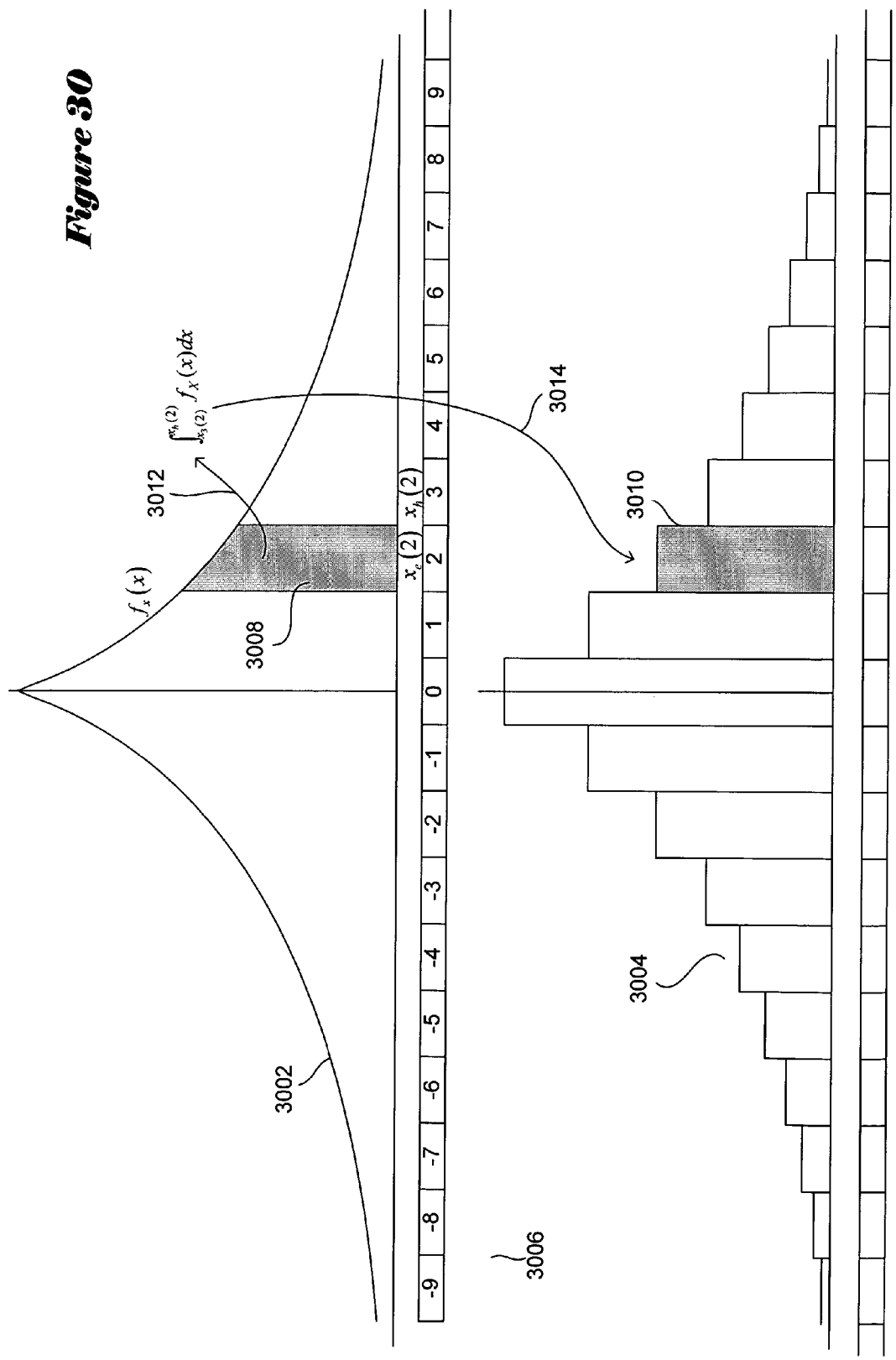
FIG. 30 illustrates determination of the probability distribution of the quantized residual-frame coefficient values from the Laplacian-distributed frequency-domain residual-frame coefficients x.

FIG. 30 illustrates determination of the probability distribution of the quantized residual-frame coefficient values from the Laplacian-distributed frequency-domain residual-frame coefficients x. A plot of the continuous, frequency-domain residual-frame coefficient distribution 3002 is aligned with the quantized residual-frame coefficient distribution 3004 and with the ranges of continuous-coefficient values corresponding to each quantized value 3006. In general, the probability of a quantized coefficient occupying the qth quantization bin is given as:

$$p_C(c) = \sum_{q \in \Omega: \psi(q,M)=c} \int_{x_l(q)}^{x_h(q)} f_X(x) dx$$

For example, computation of the probability of a quantized residual-frame coefficient having the value 2 is shown in FIG. 30 by shaded regions 3008, 3010, and arrows 3012 and 3014. Computation of the probability distribution for coset values is slightly more complex, and expressed as:

$$p_C(c) = \sum_{q \in \Omega: \psi(q,M)=c} \int_{x_l(q)}^{x_h(q)} f_X(x) dx$$

Figure 31:
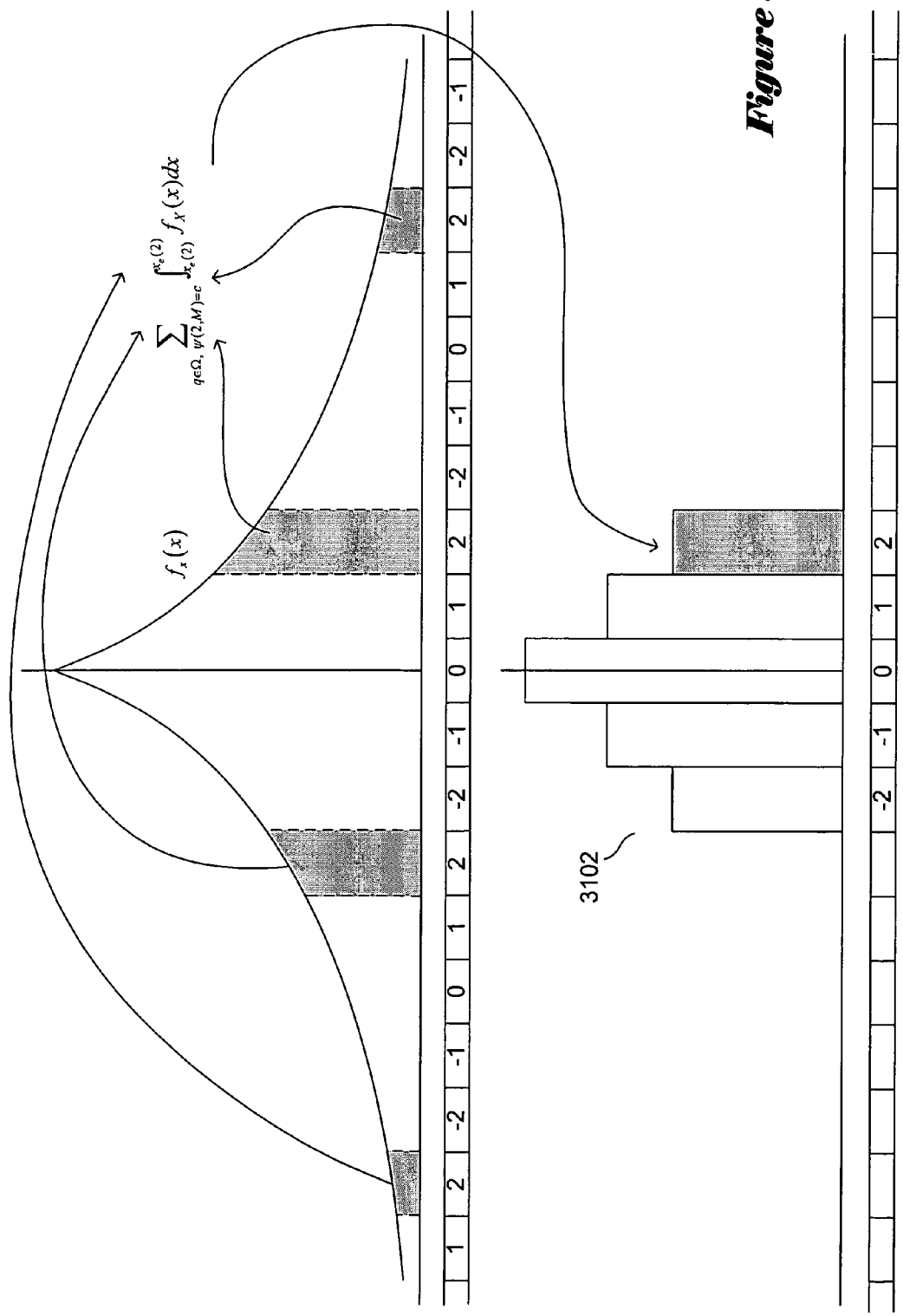
FIG. 31 shows an example of computation of the probability of a coset having the value 2 using the same illustration conventions used in FIG. 30.

FIG. 31 shows an example of computation of the probability of a coset having the value 2 using the same illustration conventions used in FIG. 30. Note that the coset probability distribution 3102 is non-uniform, just as the quantized residual-frame coefficient probability distribution 3004 is non-uniform. This non-uniformity provides an opportunity for entropy encoding of a sequence of cosets generated by coset mapping. Thus, the coset block 2814 in FIG. 28 can be linearized and entropy encoded for transmission to the decoder/decompression functionality. Note also, returning to FIG. 28, that zero-valued quantized residual-frame coefficients are mapped to coset zero. The lower, right-hand triangular portion of the coset block is therefore generally filled with zeroes. Only the upper, left-hand triangular portion of the coset block therefore needs to be encoded and transmitted. Furthermore, even certain of the non-zero, high-frequency coefficients can be omitted, and recovered entirely from site-information generation during the decoding/decompression step. The number of coefficients transmitted in zig-zag scan order for a given coset block denoted n.

Figure 32:
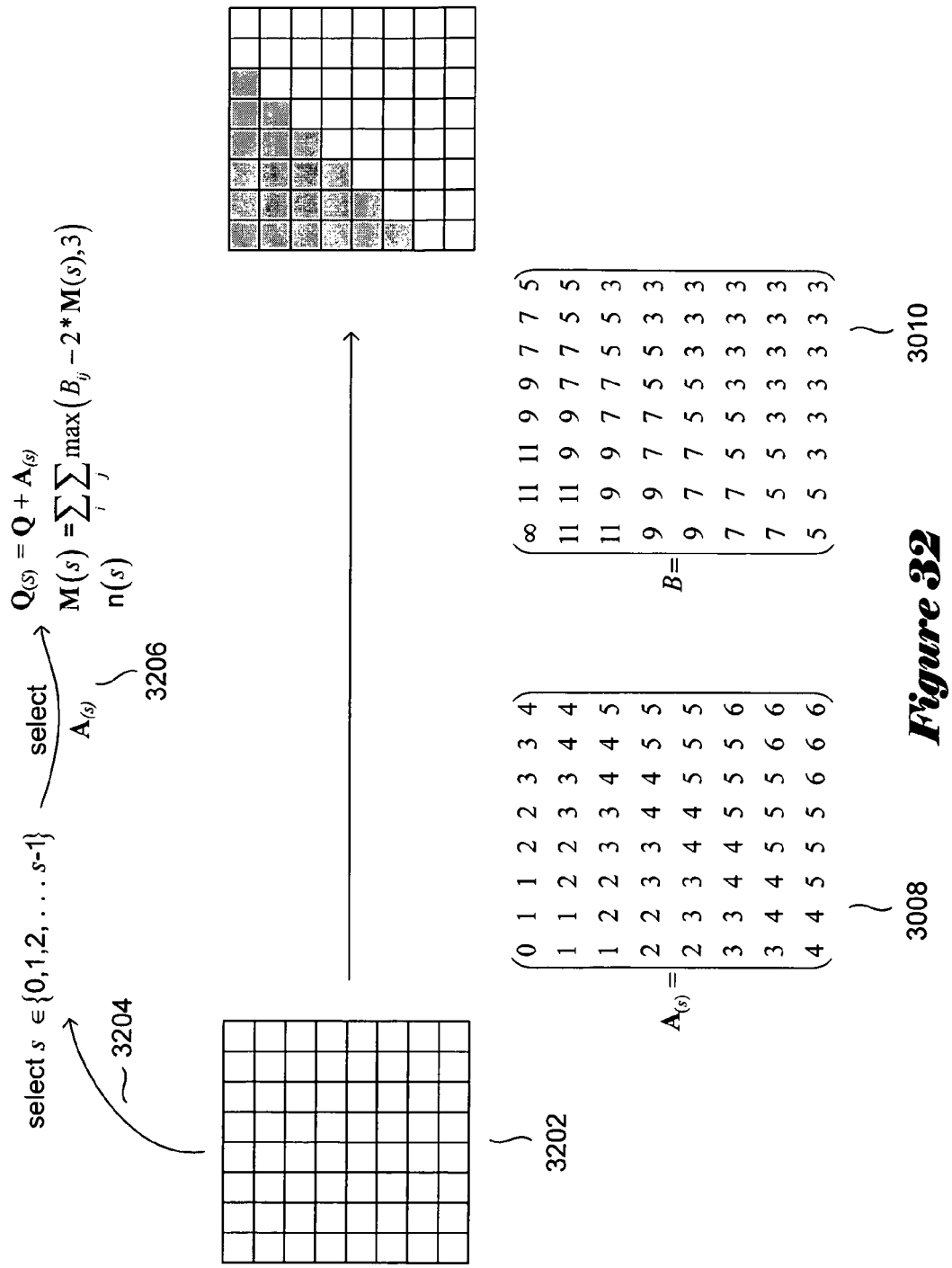
FIG. 32 shows a more detailed presentation of residual-frame frequency-domain coefficient quantization and coset mapping used in various embodiments of the present invention.

A different quantization step size Q and modulus M is used for quantization and coset mapping of each residual-frame frequency-domain coefficient x. FIG. 32 shows a more detailed presentation of residual-frame frequency-domain coefficient quantization and coset mapping used in various embodiments of the present invention. First, an 8×8 block 3202 of frequency-domain residual-frame coefficients x is evaluated and classified as one of S different types 3204. For each type S, a quantization matrix $Q_{(S)}$ and a coset modulus matrix $M_{(S)}$ are selected by:

$$Q_{(S)}=Q+A_{(s)}$$

$$M_{(S)}=\max(B-2m(s),3)$$

where m(s) is a parameter determined by the classification index s. The classification of the 8×8 coefficient block 3202 also determines the number of cosets that are transmitted, $n_{(S)}$ 3206. An exemplary Q-modifying matrix $A_{(S)}$ 3208 and an exemplary $M_{(S)}$-generating matrix B 3010 are shown in FIG. 32. Each coefficient in the coefficient block 3202 is quantized and mapped to a coset using the corresponding values in the $Q_{(S)}$ and $M_{(S)}$ matrices.

Figures 33A, 33B:
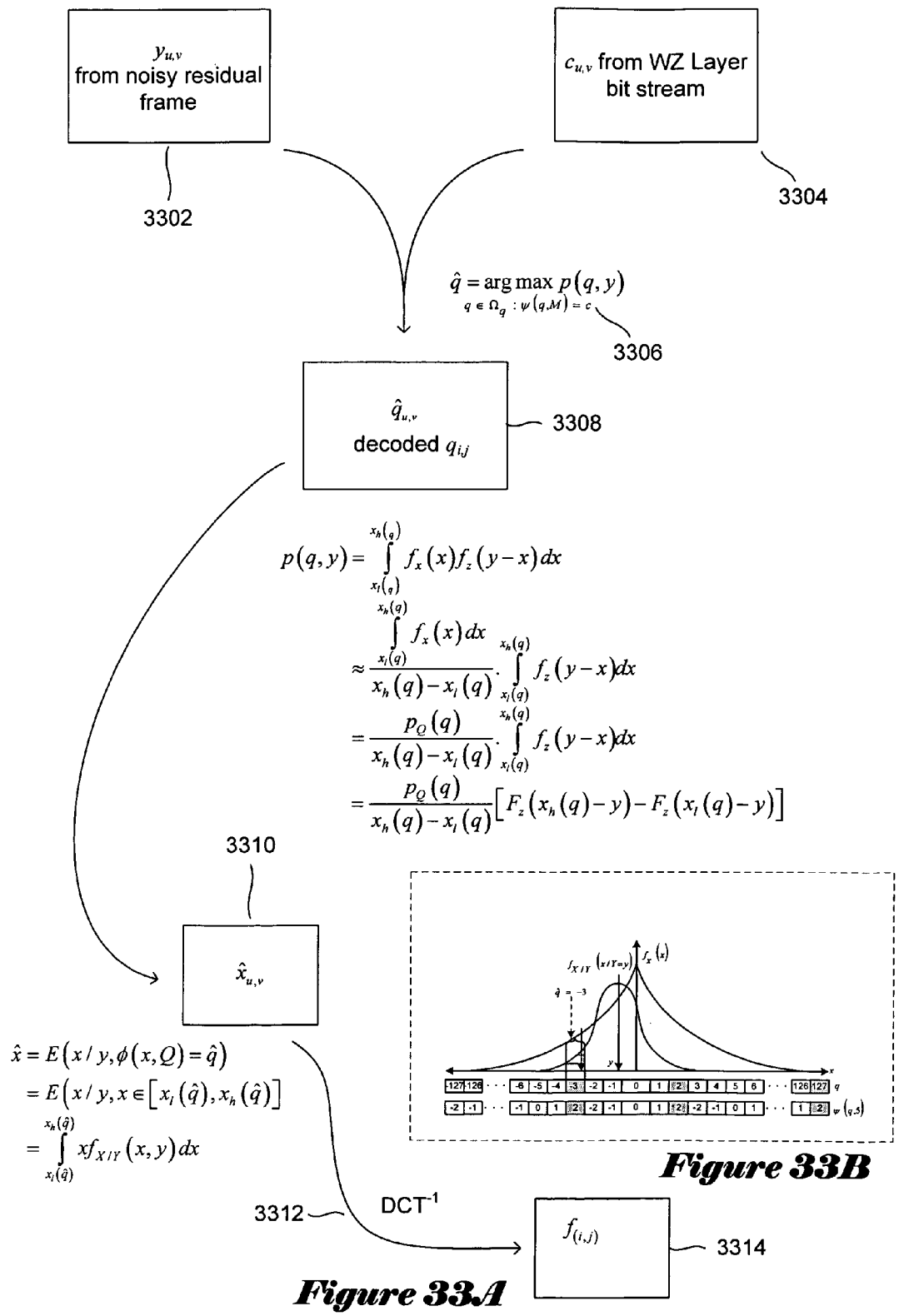
FIG. 33A illustrates the Wyner-Ziv channel decoding process that employs noisy-residual-frame coefficients y and corresponding cosets c obtained from the WZ Layer bit stream used in various embodiments of the present invention.
FIG. 33B illustrates estimation of the frequency-domain residual-frame coefficient used in various embodiments of the present invention.

FIG. 33A illustrates the Wyner-Ziv channel decoding process that employs noisy-residual-frame coefficients y and corresponding cosets c obtained from the WZ Layer bit stream (2624 in FIG. 26B) used in various embodiments of the present invention. The y noisy-frame coefficient 3302 and the corresponding coset c 3304 are used in a Bayesian classifier step 3306 to produce a decoded quantization vector $\hat{q}$ 3308. Note that y is unquantized and has higher precision than quantized coefficients. Each coefficient is associated with a context that includes the class index and the frequency x(ij), yielding the quantization step-size $Q_{ij}(s)$ and coset modulus $M_{ij}(s)$ used during encoding. Further, the class index s and the frequency x(ij) of a coefficient map to a $\{\sigma_x, \sigma_x, p_z, K_z\}$ that is directly used for the decoding process. In particular, the decoded bin $\hat{q}$ is obtained as:

$$\hat{q} = \underset{q \in \Omega_q : \psi(q,M)=c}{\operatorname{argmax}} p(q, y)$$

where p(q, y) is the joint probability of the quantization bin q and the received value y. Applying the approximation below:

$$p(q, y) = \int_{x_i(q)}^{x_h(q)} f_X(x) f_Z(y-x) dx$$

$$\approx \frac{\int_{x_i(q)}^{x_h(q)} f_X(x) dx}{x_h(q) - x_i(q)} \cdot \int_{x_i(q)}^{x_h(q)} f_Z(y-x) dx$$

$$= \frac{p_Q(q)}{x_h(q) - x_i(q)} \cdot \int_{x_i(q)}^{x_h(q)} f_Z(y-x) dx$$

$$= \frac{p_Q(q)}{x_h(q) - x_i(q)} [F_Z(x_h(q) - y) - F_Z(x_i(q) - y)]$$

The cumulative distribution function $F_z(.)$ can be conveniently computed by scaling and interpolation of a pre-computed table for the erf( ) function for Gaussian variables. Likewise, the a priori probability of the qth bin $p_Q(q)$ can be computed based on interpolation of a pre-computed table for the cumulative distribution function of a Laplacian distribution.

Next, the estimated quantization bin $\hat{q}$ can be used to estimate the residual-frame frequency-domain coefficient $\hat{x}$:

$$\hat{x} = E(x/y, \phi(x, Q) = \hat{q})$$

$$= E(x/y, x \in [x_i(\hat{q}), x_h(\hat{q})])$$

$$= \int_{x_i(\hat{q})}^{x_h(\hat{q})} x f_{X/Y}(x, y) dx$$

Note that the exact computation of $\hat{x}$ is complicated since $f_{X/Y}(x, y)$ cannot be directly written in terms of $f_Z(z)$. However, even a gross approximation works better than just using the mid-point of the quantization bin $\hat{q}$ as $\hat{x}$. In particular, assuming $f_{X/Y}(x, y)$ to be a Gaussian with variance equal to the geometric mean of $\sigma_x$ and $\sigma_z$, centered on y, then $\hat{x}$ can be computed based on interpolation of values from a pre-computed table of the first central moments of a Gaussian. FIG. 33B illustrates estimation of the frequency-domain residual-frame coefficient used in various embodiments of the present invention. FIG. 33B shows a specific decoding example where the received coset index is 2. Given the y as shown, the Bayesian classifier decodes $\hat{q}$ as −3. Thereafter, the optimal reconstruction function obtains the final reconstruction $\hat{x}$ within this bin. It turns out that the ability to use this optimal reconstruction function using the side-information y enables use of a quantization step-size that is larger than the target quality, thereby allowing bit-rate savings in the Wyner-Ziv layer. Besides the coefficients transmitted using cosets, there are other coefficients that are not transmitted at all. These coefficients are reconstructed exactly as they appear in the side-information.

Finally, the estimated frequency-domain coefficient $\hat{x}$ can be transformed by a reverse DCT 3312 to produce the original spatial-domain residual-frame intensity value f(i,j) 3314. Thus, a corrected residual frame is produced for, in turn, generating a next restored frame $F_{i+1}$ in the resolution-enhancement loop discussed with reference to FIGS. 26B and 26D.

In the above-discussed Wyner-Ziv encoding method, the distance, in value, between quantization bins with the same index is equal to the coset modulus M. Trellis-encoding methods can be employed to increase the distance, in order to decrease the possible ambiguities, without much additional rate penalty. However, the trellis-encoding needs to preserve the non-uniform distribution of encoded symbols so that the coset values can be encoded by entropy-encoding techniques. FIG. 34 illustrates a trellis-encoding technique used in various embodiments of the present invention. FIG. 34 shows the Laplacian distribution of frequency-domain residual-frame coefficients 3402 aligned with corresponding quantization bins q 3404, coset values 3406 produced by the above-described coset mapping, and symbol function 3408 and base-coset function 3410 symbol pairs produced by trellis encoding. As mentioned above, the distance in quantization bins between two cosets with the same value 3412 in the above-described coset mapping is equal to M, the modulus used for the coset mapping. By instead using symbol function/base coset function pairs, that distance can be extended to $$M^{(k)} = (M-1) \cdot k + 1$$

where k is the number of symbols produced by the symbol function. Trellis coding increases the effective distance is by incorporating dependencies among coding of multiple symbols. The encoding of one symbol then not only depends on the current symbol, but on several other symbols possibly prior to the current. In the Wyner-Ziv coding case however, besides increasing distances between codes, the entropy of the transmitted symbols cannot be artificially flattened, or entropy coding of the coset stream will be ineffective.

A symbol function $\zeta^{(k)}(q, M)$, that yields a k-ary symbol from the quantization bin q, given coset modulus M, is defined as follows:

$$M^{(k)} = (M-1) \cdot k + 1$$

$$q^{(k)} = (|q| \mod M^{(k)})$$

$$\zeta^{(k)}(q, M) = \begin{cases} 0, & q^{(k)} = 0 \\ \lfloor (q^{(k)} - 1)/(M-1) \rfloor, & q > 0 \\ k - 1 - \lfloor (q^{(k)} - 1)/(M-1) \rfloor, & q < 0 \end{cases}$$

Figure 35:
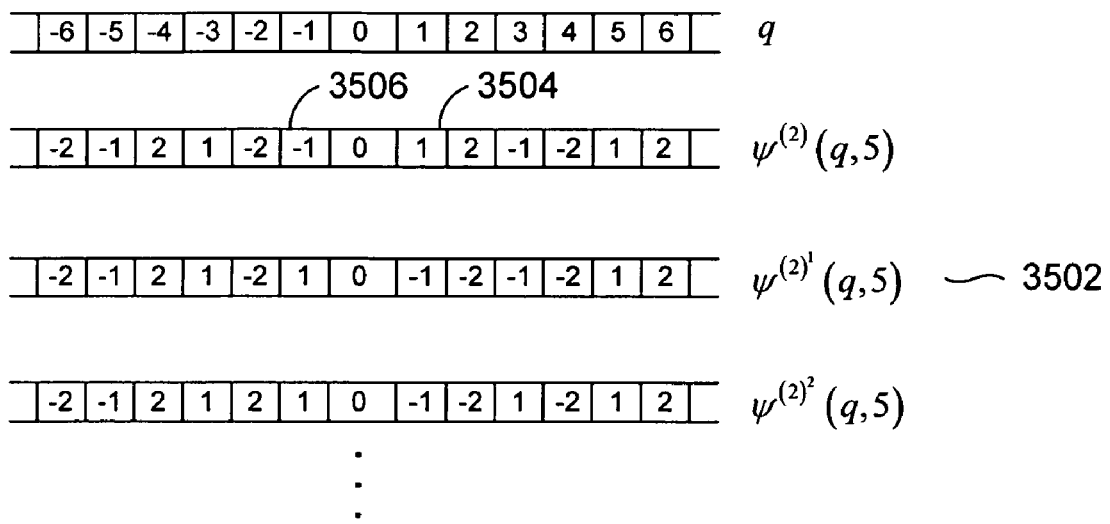
FIG. 35 illustrates generation of a family of base-coset functions $\psi^{(k)}$ by flipping the sign of one or more pairs of base-coset-function coset values symmetrically disposed about the zero value used in various embodiments of the present invention.

A base coset function $\psi^{(k)}(q,M)$ is defined as:

Consider the class of coset functions $\psi'(q, m)$ constructed from the base coset function by flipping the output signs corresponding to one or more values of q, while ensuring the constraint that $\psi'(q, M) = -\psi'(-q, M)$. Each function from the entire class of such functions has exactly the same probability mass function as the base coset function. FIG. 35 illustrates generation of a family of base-coset functions $\psi^{(k)}$ by flipping the sign of one or more pairs of base -coset-function coset values symmetrically disposed about the zero value used in various embodiments of the present invention. For example, a new base-coset function $\psi^{(2)'}$ 3502 can be generated from base-coset function $\psi^{(2)}$ by flipping the sign of the two coefficients 3504 and 3506. FIG. 34 shows an example of results 3412 produced by the function $-\psi^{(k)}(q,M)$ where all output signs from $\psi^{(k)}(q,M)$ are flipped, but the probability mass function still remains the same. Therefore, even if the coset function used to obtain the transmitted coefficient is changed from coefficient to coefficient, as long as they remain within this class, the same entropy coder can be used without any loss in coding efficiency. This property is exploited in coding schemes used in various embodiments of the present invention. For this entire class of functions, the zeroes always remain at the same locations. Because the coding of the zero coset index is already efficient, and the zeroes are already separated by $(M-1).k+1$ quantization bins, only the non-zero base coset indices need be considered for coding. Removing the zero-coset indices for the purpose of coding also ensures that the symbol function yield symbols that are equiprobable for the case k=2, and therefore enable robust channel decoding.

$$M^{(k)} = (M-1) \cdot k + 1$$

$$q^{(k)} = (|q| \bmod M^{(k)})$$

$$m = (M-1)/2$$

$$\psi^{(k)}(q, M) = \begin{cases} 0, & q^{(k)} = 0 \\ \text{sign}(q) \cdot \{(q^{(k)} - 1) \bmod m + 1\}, & \left\lfloor \frac{q^{(k)} - 1}{m} \right\rfloor \text{ is odd} \\ -\text{sign}(q) \cdot ((q^{(k)} - 1) \bmod m + 1), & \left\lfloor \frac{q^{(k)} - 1}{m} \right\rfloor \text{ is even} \end{cases}$$

Examples 3406 and 3408 of symbol strings produced by these functions are shown in FIG. 34 for the typical case of k=2. The zeroes of the coset function have also been placed such that they are separated by the same amount. The objective is to derive a coding and decoding scheme where the symbol function can be recovered by soft decoding based on unquantized y, without explicitly transmitting it.

In particular, the symbol function is applied to each quantized coefficients $q_t$ with non-zero base coset function, to yield a k-ary symbol $b_t$. The sequence of symbols $\{b_t\}$ generated from $\{q_t\}$ drives a state-machine with $N_s$ states. For every quantized coefficient $q_t$ coded, the current state of the state machine $S_t \in \{0, 1, 2, \ldots, N_s-1\}$ determines a particular coset function $\psi_{S_t}^{(k)}(q_t, M_t)$ used to obtain the transmitted symbol $c_t$ from $q_t$. Each $\psi_{S_t}^{(k)}(q_t, M_t)$ is derived from the base coset function by sign modulation. In other words:

$$q_t = \phi(x_t, Q_t), c_t = \psi_{S_t}^{(k)}(q_t, M_t)$$

$$b_t = \zeta^{(k)}(q_t, M_t), S_{t+1} = \eta(S_t, b_t), t=0,1,\ldots,T-1$$

where T is the total number of coefficients to be coded. Note that $Q_t$ and $M_t$ refer to the quantization step-size and the coset modulus corresponding to the tth coefficient $x_t$. $\eta(S_t, b_t)$ is the next state function of the state machine.

Figure 36:
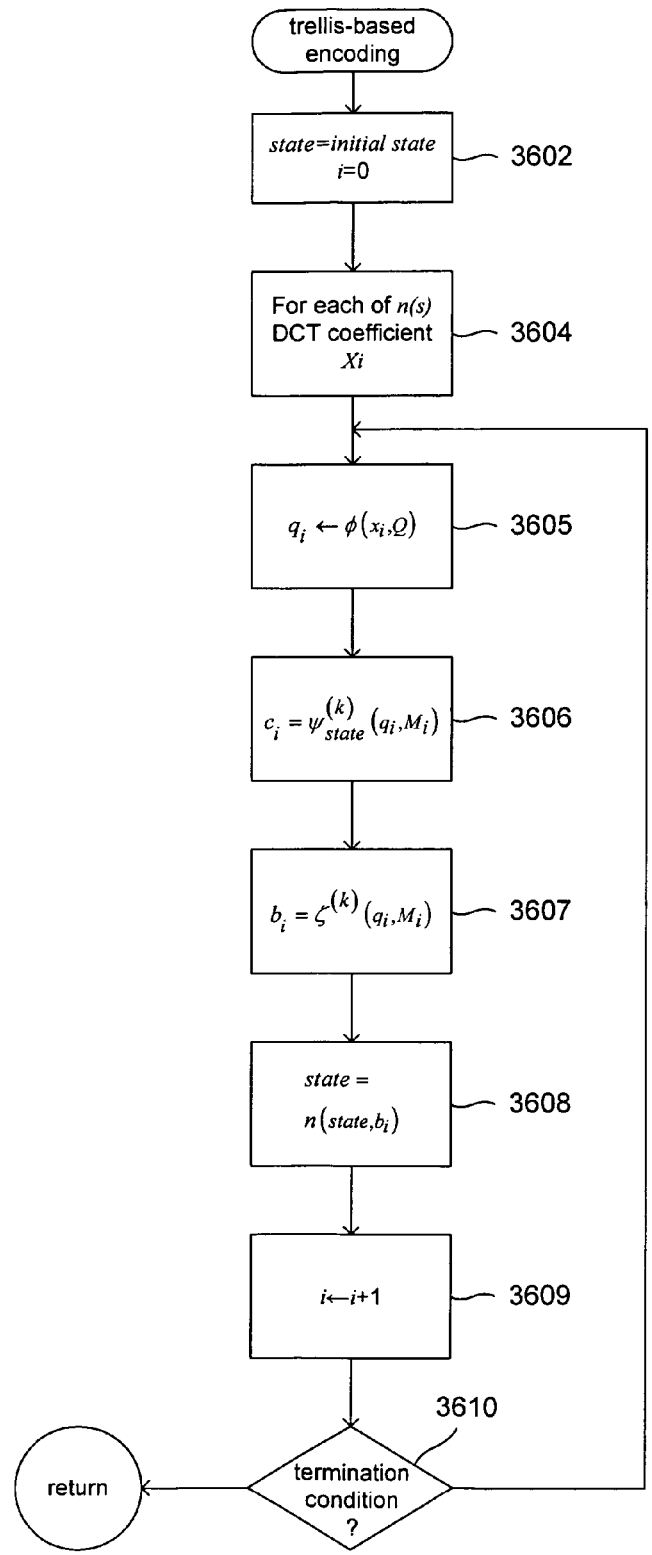
FIG. 36 is a control-flow diagram for trellis-based encoding used in various embodiments of the present invention.

FIG. 36 is a control-flow diagram for trellis-based encoding used in various embodiments of the present invention. Next, in the for-loop of steps 3604-3610, a coset is generated for each residual-frame frequency-domain coefficient $x_i$. In step 3605, the coefficient is quantized. In step 3606, the corresponding coset is produced by using the current quantization bin value $q_i$ and current modulus $M_i$ in the base-coset-function family member $\psi^{(k)}_{state}$, where state is the current state of the state machine. Next, in step 3607, the current symbol $B_i$ is generated from the symbol function $\zeta^{(k)}$. Then, in step 3608, the new state for the state machine is computed from the previous state and current symbol $B_i$. Finally, in step 3609, the loop variable I is incremented. Trellis-based encoding continues until a termination condition arises, as detected in step 3610. The termination condition is somewhat complex, since, in trellis-based encoding, a few dummy cosets may need to be added at the end of a coset sequence. In general, the trellis-based encoding loop terminates when cosets have been generated from $n_{(S)}$ frequency-domain residual-frame coefficients.

One particular case is where the only two coset functions $\psi^{(k)}(q,M)$ and $-\psi^{(k)}(q,M)$ are used. Half of the states from the state machine use $\psi^{(k)}(q,M)$ as the coset function, while the remaining half uses $-\psi^{(k)}(q,M)$. In other words, the sign of the index from the base coset function is either flipped or not flipped depending on the state of the state machine. The state machine can be derived from the shift register in a convolution code. However note that unlike the output function of a convolution code, the coding of the current coefficient $q_t$ does not depend on the current symbol function $b_t$. This is needed to ensure that in each epoch the symbols are maximally separated. As an example, for the most useful case k=2, a practical means for generating such codes is from a rate ½ systematic convolutional code. The next state function for the encoder can be exactly the same as that of the convolutional code. However, if the output function for the parity bit for such a convolutional code is denoted g(S, b), where S is the current state and b is the current input bit, then the bit g(S, 0) can be used during encoding to indicate whether the sign for the base coset function is to be flipped or not.

Figure 37:
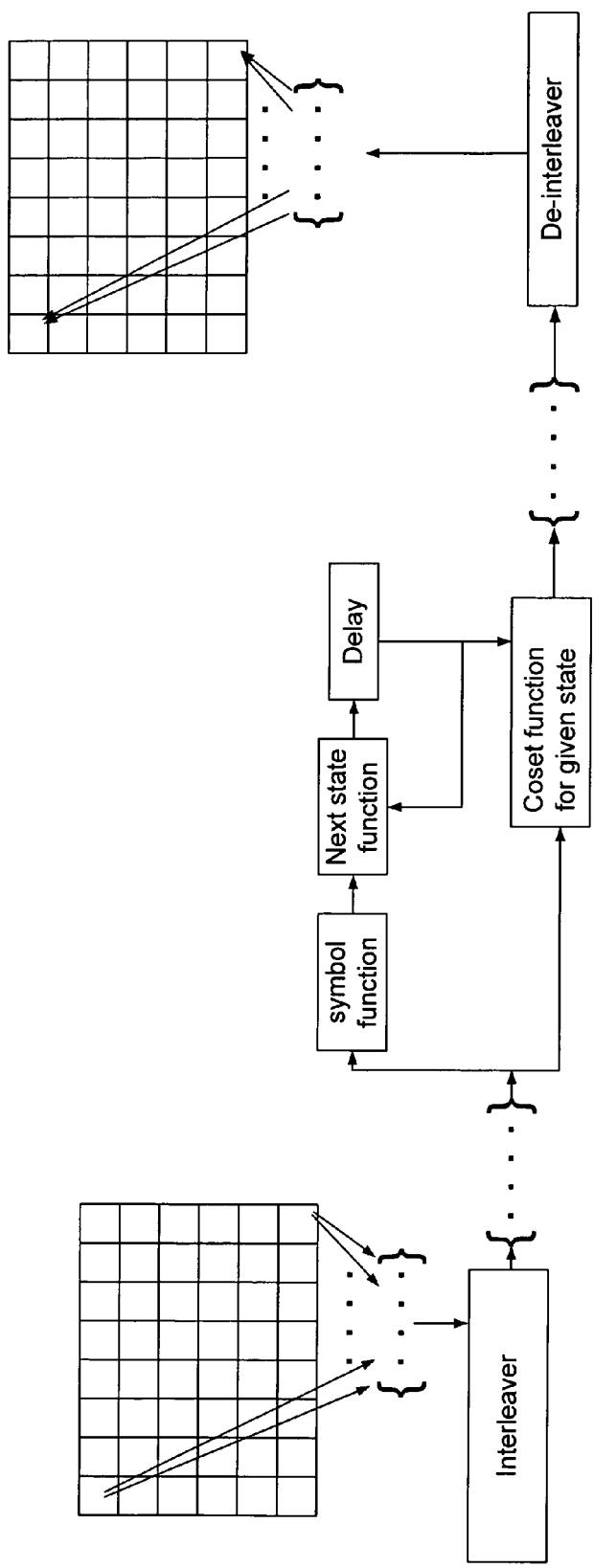
FIG. 37 illustrates the coset-generating state machine for generating cosets by the trellis-encoding method used in various embodiments of the present invention.

FIG. 37 illustrates the coset-generating state machine for generating cosets by the trellis-encoding method used in various embodiments of the present invention. The steps for encoding as shown in FIG. 37 are as follows. After computing the block transform for an entire frame, the coefficients are quantized, and then the base coset function and the symbol functions are computed. If the base coset-function is zero, or if the coefficient is beyond the number of coefficients that are to be transmitted for its block class in zigzag scan order, the coset index transmitted is zero. Coefficients with non-zero base coset function for the entire frame are separated and interleaved. The sequence of interleaved coefficients is next encoded. The coset indices obtained by doing so are de-interleaved, and put back in the corresponding locations in the original blocks they came from. The blocks are next entropy coded as in the regular codec. Note that it is necessary to code all the coefficients from a single frame together in order to ensure that the block size is sufficiently large. Use of NRWZ frames also enable use of codes that span across multiple frames.

Usually trellis codes are initiated in a fixed state $S_0$, and terminated by a few dummy symbols. Termination is necessary to ensure equal protection for the symbols that come at the end. In the case of TCSM, however, there are two ways to ensure proper termination. First, a few bits can be used at the end of every frame to specify explicitly the end state. However, if changing the bit-stream syntax is undesirable, use of tail-biting trellises may be used. In a tail-biting trellis, the starting state and the ending state are constrained to be exactly the same. Use of such trellises ensures that the number of transmitted symbols is exactly the same as the number of coefficients. The common start and end state can be obtained easily from a non-recursive state machine, by running the last $N_{mem}$ symbols through it, where $N_{mem}$ is the constraint length or the size of the memory of the machine.

The purpose of the decoder is to obtain the best estimate of the quantization bins $q_t$ given the transmitted coset index $c_t$, the noisy unquantized coefficients $y_t$, and their contexts. Note that because each sample in the sequence could potentially use a different quantizer a different coset modulus, and a different class index with different noise variances, in the equations following, the subscript t is used wherever appropriate. A Viterbi decoder and a MAP decoder may be employed. Both decoders depend on computation of the branch metric $\gamma_t(i,j)$ defined as:

$$\gamma_t(i,j) = Pr(S_{t+1}=j, c_t, y_t/S_t=i)$$

It can be shown that:

$$\gamma_t(i, j) = \sum_{\substack{q \in \Omega_t: \\ \eta(i, \zeta^{(k)}(q, M_t)) = j \\ \psi_i^{(k)}(q, M_t) = c_t}} [p_t(q, y_t)]$$

where $\Omega_t$ is the set of all quantization bins for the t-th sample, and $p_t(q, y_t)$ is given below:

$$p_t(q, y_t) = \int_{x_{l,t}(q)}^{x_{h,t}(q)} f_{X,t}(x) f_{Z,t}(y_t - x) dx$$

$$\approx \frac{\int_{x_{l,t}(q)}^{x_{h,t}(q)} f_{X,t} dx}{x_{h,t}(q) - x_{l,t}(q)} \cdot \int_{x_{l,t}(q)}^{x_{h,t}(q)} f_{Z,t}(y_t - x) dx$$

$$= \frac{p_{Q,t}(q)}{x_{h,t}(q) - x_{l,t}(q)} \cdot \int_{x_{l,t}(q)}^{x_{h,t}(q)} f_{Z,t}(y_t - x) dx$$

$$= \frac{p_{Q,t}(q)}{x_{h,t}(q) - x_{l,t}(q)} [F_{Z,t}(x_{h,t}(q) - y_t) - F_{Z,t}(x_{l,t}(q) - y_t)]$$

This can be simplified by only considering a few quantization bins of each side of y, instead of all of $\Omega_q$. This definition of the branch metric is used in both the decoders below.

The Viterbi algorithm decodes the most likely state sequence. The steps adapted for Trellis Coded Sign Modulation ("TCSM") are as follow. First initialize:

$$\delta_0(i) = \pi_i, \lambda_0(i) = 0, i = 0, 1, \ldots, N_S - 1$$

where $\pi_i$ is the probability that the initial state $S_0$ is i. If the initial state is known to be k, then $\pi_k = 1$, and $\pi_i = 0$ for $i \neq k$. Then recursively compute:

$$\delta_{t+1}(j) = \max_{i=0,1,\ldots,N_S-1} [\delta_t(i), \gamma_t(i, j)]$$

$$\lambda_{t+1}(j) = \underset{i=0,1,\ldots,N_S-1}{\operatorname{argmax}} [\delta_t(i), \gamma_t(i, j)], t = 0, 1, \ldots, T - 1$$

T being the total number of symbols in the sequence. Terminate the trellis:

$$S_T^* = \underset{i=0,1,\ldots,N_S-1}{\operatorname{argmax}} [\delta_T(i)]$$

and backtrack for $t = T-1, T-2, \ldots, 0$:

$$S_t^* = \lambda_{t+1}(S_{t+1}^*)$$

For tail-biting trellises, the Viterbi algorithm has been modified in various ways by many researchers. As one example, assume the initial state to be an arbitrary state k and initialize accordingly. Make one decoding pass through the sequence and find the final state of the best path. Check if the start state is the same as the best end state. If yes, stop decoding. If not, check if the previous best ending state has been used before as the initial state. If so, pick another arbitrary initial state not used before and redo the decoding pass. If not, use the previous best ending state as the initial state and redo decoding. Continue the process until the initial and final states match, or if all initial states have been tried, the algorithm simply outputs the best path so far. Typically, the initial and final states match in two passes.

Once the decoded state sequence is known, there is still an additional step needed to obtain the best quantization bin, since multiple quantization bins can lead to the same state transitions. Note that given that a state transition i to j occurred in epoch t and side information $y_t$ and coset index $c_t$ are received, the posteriori probability of quantization bin q is given by:

$$\mu_t(q, i, j) = \frac{p_t(q, y_t)}{\gamma_t(i, j)}, \quad \begin{array}{l} \eta(i, \zeta^{(k)}(q, M_t)) = j \\ \psi_i^{(k)}(q, M_t) = c_t \end{array}$$

$$= 0, \quad \text{otherwise}$$

Given the decoded state sequence, the decoding rule is then to choose the q that maximizes $\mu_t(q, i^*, j^*)$ for decoded state transition $i^*$ to $j^*$ in epoch t, which is equivalent to:

$$\hat{q}_t = \underset{\substack{q \in \Omega_t: \\ \eta(i^*, \zeta^{(k)}(q, M_t)) = j^* \\ \psi_{i^*}^{(k)}(q, M_t) = c_t}}{\operatorname{argmax}} [p_t(q, y_t)]$$

Once the decoded quantization bins have been obtained, optimal reconstruction for $\hat{x}$ are used.

The MAP decoder, also known as the BCJR algorithm, decodes using the most likely state transitions at every epoch. While the decoded sequence may not be consistent with the trellis constraints, this decoder minimizes the probability of errors. The steps of the algorithm adapted for the TCSM trellis are as follows. First conduct the forward pass:

Initialization $\alpha_0(i) = \pi_i, i = 0, 1, \ldots, N_S - 1$

Induction: For $t = 0, 1, \ldots, T - 2, T - 1$ $$\alpha'_{t+1}(i) = \sum_{j=0}^{N_S-1} \alpha_t(j) \cdot \gamma_t(j, i), i = 0, 1, \ldots, N_S - 1$$

$$\alpha_{t+1}(i) = \alpha'_{t+1}(i) \Big/ \sum_{j=0}^{N_S-1} \alpha'_{t+1}(j), i = 0, 1, \ldots, N_S - 1$$

where $\pi_i$ is the probability distribution of the initial state. Next conduct the backward pass:

Initialization $\beta_T(i) = \theta_i, i = 0, 1, \ldots, N_S - 1$

Induction: For $t = T - 1, T - 2, \ldots 1, 0$ $$\beta'_t(i) = \sum_{j=0}^{N_S-1} \beta_{t+1}(j) \cdot \gamma_t(i, j), i = 0, 1, \ldots, N_S - 1$$

$$\beta_t(i) = \beta'_t(i) \Big/ \sum_{j=0}^{N_S-1} \beta'_t(j), i = 0, 1, \ldots, N_S - 1$$

where $\theta_i$ is the probability distribution of the final state. If the initial and/or final states are known, the $\pi_i$ and the $\theta_i$ are chosen to be 1 for these states and 0 otherwise. If they are unknown, the corresponding distributions are assumed to be uniform.

For the case of tail-biting trellises, assume the $\pi_i$ and the $\theta_i$ to be uniform distributions. The forward and backward inductions are then continued in a circular fashion until the distributions of $\alpha_t(i)$ and $\beta_t(i)$ converge. Specifically for the forward induction, once the final distribution $\alpha_T(i)$ is obtained, it may be assigned to the initial distribution and induction continued again. The process is continued until the initial and final distributions converge. In fact, the method need not wait until the end of a pass to decide if the distributions match. As long as the distribution $\alpha_t(i)$ at an intermediate epoch t is found to be sufficiently close to the distribution in the previous pass, based on a suitable threshold, convergence can be considered to have been achieved. The most recent distributions at each t are then taken as final. A similar method is used for the backward pass. Usually, the distributions converge in less than two full passes.

Once the forward and backward distributions have been obtained, the a posteriori probabilities $\sigma_t(i,j)$ of state transition i to j in epoch t are computed as:

$$\sigma_t(i,j) = \frac{1}{k} \cdot \alpha_t(i) \cdot \gamma_t(i,j) \cdot \beta_{t+1}(j)$$

$$k = \sum_{i=0}^{N_S-1} \sum_{j=0}^{N_S-1} \alpha_t(i) \cdot \gamma_t(i,j) \cdot \beta_{t+1}(j)$$

For every t, the (i, j) pair that maximizes the above probabilities is regarded as the most likely state transition. However, the posteriori probability of the quantization bin q is obtained by averaging over all possible state transitions:

$$\eta_t(q) = \sum_{i=0}^{N_A-1} \sum_{j=0}^{N_A-1} \sigma_t(i,j)\mu_t(q,i,j)$$

where $\mu_t(q, i, j)$ and $\sigma_t(i,j)$ are provided above. The decoding rule is simply to choose the q than maximizes $\eta_t(q)$:

$$\hat{q}_t = \arg\max_{q \in \Omega_t}[\eta_t(q)]$$

Once the decoded quantization bins have been obtained, optimal reconstruction for $\hat{x}$ is used.

The TCSM methodology can be readily extended to parallel concatenation. In this case, there are two parallel TCSM encoders, with the second being applied after a permutation of the original samples. Such codes are termed sign-modulated turbo codes, because of their connection with Turbo codes. The decoding operation strongly parallels the iterative decoding procedure used for regular binary Turbo codes. The soft quantization bin posteriori output probabilities are used as priors after permutation through $P_{Q,t}(q)$ while decoding the second code. The decoding process iterates over the two codes for multiple iterations each time updating the quantization bin probabilities, until convergence happens.

The principles behind trellis-coded sign-modulation can be readily applied to code an arbitrary block of samples based on a binary systematic linear block code. Consider a block of N samples to be coded together. Apply a k-ary symbol function with $k=2^b$, to each sample to obtain bN symbol bits. These bN bits are input to a rate b/(b+1) (bN+N, bN) systematic block code to obtain N parity bits, each of which is then considered to correspond to one data sample, after an arbitrary permutation. Then, compute the base coset function for each of the N original samples, and transmit either that or the negative of that depending on the value of the corresponding parity bit. The most useful case is one where k=2 (b=1), where the underlying block code is rate ½. If the block length is not too large, then even decoding by full enumeration search is not too impractical. Otherwise, since all linear codes have a trellis representation, trellis decoding can be used.

The principle above can be readily applied to create sign-modulated LDPC codes. The advantage of such codes is that N can be variable, and the parity check matrix can be designed randomly on-the-fly for a given number of symbols to be coded for each frame. An adaptation of iterative message passing algorithms typically used for LDPC codes can then be used to decode such codes. Initial investigations on sign-modulated codes reveal that it is advisable for the permutation operation in such codes to be designed in a way that each parity bit sign-modulates a sample whose symbol function is not used in any of the parity check equations involving the same parity bit.

Although the present invention has been described in terms of particular embodiments, it is not intended that the invention be limited to these embodiments. Modifications within the spirit of the invention will be apparent to those skilled in the art. For example, an almost limitless number of different implementations of codecs that represent embodiments of the present invention are possible. These codecs can be implemented in any number of different programming languages and machine-level languages and firmware instructions, and may employ any of many different modular organizations, control structures, data structures, and various other common programming variations. Codecs that represent embodiments of the present invention may be implemented entirely in software, entirely in hardware logic circuits, in firmware, or in any combination of software, logic circuits, and firmware. Although a general implementation of one embodiment of the present invention is described, above, many other possible embodiments can be devised by using different types of Wyner-Ziv encoding, in addition to the channel coding and trellis-based coding discussed above, by using different quantization and coset mapping schemes, by choosing different frames for Wyner-Ziv encoding, including reference frames in certain embodiments, and many other variations. Each of the decoder and encoder portions of a codec may be separately implemented in separate software modules or devices. For example, the encoder portion of a codec may be separately implemented in an expensive recording device that does not include a decoder.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A codec that adjusts a division of a total computational complexity of compression and decompression between encoding and decoding the codec comprising:
   an encoder that encodes a received signal at a selectable level of computational complexity, wherein the encoder encodes a first portion of the received signal at full resolution by temporal, spatial, and entropy coding techniques to produce a high-resolution encoded signal that can be subsequently used to reconstruct a high-resolution signal, and encodes a second portion of the received signal at lower resolution to produce, for the second portion of the signal a lower-resolution encoded signal and additional compressed information that can be subsequently used in combination with the lower-resolution encoded signal to reconstruct a near-high-resolution signal; and a decoder that decodes a received, encoded signal at a selectable level of computational complexity, wherein the decoder decodes the high-resolution encoded signal to reconstruct a high-resolution signal, decodes the lower-resolution encoded signal with additional compressed information to reconstruct a near-high-resolution signal, and decodes the lower-resolution encoded signal without using additional compressed information to reconstruct a lower-resolution signal;

wherein the division of computational complexity can be adjusted from a first asymmetrical division, in which the encoder bears a greater computational burden than the decoder by encoding the entire received signal at full resolution and the decoder decodes a portion of the high-resolution encoded signal to reconstruct the signal, to a second asymmetrical division in which the encoder bears a smaller computational burden than the decoder by encoding the first portion of the received signal at full resolution and the second portion of the signal at lower resolution and the decoder decodes the lower-resolution encoded signal without using the additional compressed information to reconstruct a lower-resolution signal.

2. The codec of claim 1 wherein the division of computational complexity can be adjusted to intermediate divisions between the first asymmetrical division and second asymmetrical division by one or more of:

increasing the second portion of the signal portion encoded at lower resolution relative to the first portion of the signal encoded at full resolution;

using different information, and different amounts of information, by the encoder to produce the additional compressed information; and decoding only a first portion of the lower-resolution signal with additional compressed information to reconstruct a near-high-resolution signal, decoding a second portion of the lower-resolution signal without using additional compressed information, and deceasing the first portion from the entire lower-resolution encoded signal to none of the lower-resolution encoded signal.

3. A codec that adjusts a division of a total computational complexity of compression and decompression between encoding and decoding the codec comprising:

an encoder that encodes a received signal at a selectable level of computational complexity, wherein the signal is a frame-based and sixel-based video signal and the encoder encodes a first portion of the received signal at full resolution by temporal, spatial, and entropy coding techniques to produce a high-resolution encoded signal that can be subsequently used to reconstruct a high-resolution signal, and encodes a second portion of the received signal at lower resolution to produce, for the second ortion of the signal a lower-resolution encoded sinal and additional compressed information that can be subsequently used in combination with the lower-resolution encoded signal to reconstruct a near-high-resolution signal; and a decoder that decodes a received, encoded signal at a selectable level of computational complexity, wherein the decoder decodes the high-resolution encoded signal to reconstruct a high-resolution signal, decodes the lower-resolution encoded signal with additional compressed information to reconstruct a near-high-resolution signal, and decodes the lower-resolution encoded signal without using additional compressed information to reconstruct a lower-resolution signal;

wherein the encoder encodes a first portion of the received signal at full resolution by temporal, spatial, and entropy coding techniques and encodes a second portion of the received signal at lower resolution to produce, for the second portion of the signal, a lower-resolution encoded signal and additional compressed information by partitioning the video signal into consecutive groups of frames, for each group of frames, selecting a number of reference frames and a number of non-reference frames, spatially encoding the reference frames, spatially and temporally encoding a first number of the non-reference frames at full resolution, spatially and temporarily encoding a second number non-reference frames at lower resolution while producing additional compressed information, and entropy encoding the spatially encoded reference frames, the first number of non-reference frames spatially and temporally encoded at full resolution, and the second number of non-reference frames spatially and temporally encoded at lower resolution along with the additional compressed information to produce a compressed bit stream.

4. The codec of claim 3 in which the first number of non-reference frames encoded at full resolution ranges from none of the non-reference frames to all of the reference frames.

5. The codec of claim 3 wherein the decoder decodes a high-resolution encoded signal to reconstruct a high-resolution signal by:

entropy decoding the entropy-encoded bit stream to recover spatially and temporally encoded non-reference frames and spatially encoded reference frames;

spatially decoding the spatially decoded reference frames; and temporally and spatially decoding the temporally and spatially encoded non-reference frames.

6. The codec of claim 3 wherein spatially and temporarily encoding a second number of non-reference frames at lower resolution while producing additional information further includes:

decimating the second number of non-reference frames, and reference frames used in encoding the non-reference frames;

spatially and temporally encoding the decimated second number of non-reference frames;

interpolating reconstructed versions of the second number of non-reference frames;

computing a residual frame for each of the second number of non-reference frames from the original, unencoded second number of non-reference frames and the interpolated, reconstructed versions of the second number of non-reference frames; and compressing the residual frames by a source-coding-with-side-information technique to produce the additional compressed information.

7. The codec of claim 6 wherein compressing the residual frames by a source-coding-with-side-information technique to produce the additional compressed information further includes:
for each block of the residual frame,
transforming the block to a frequency domain;
quantizing the frequency-domain block; and
coset-mapping the quantized frequency-domain block to produce a coset-mapped block.

8. The codec of claim 7 wherein the coset-mapping is defined by:

$$\psi(q, M) = \begin{cases} \text{sign}(q) \cdot [(|q| \bmod M)], & |q| \bmod M < M/2 \\ \text{sign}(q) \cdot [(|q| \bmod M) - M], & |q| \bmod M > M/2 \end{cases}$$

where M is the modulus used for the coset mapping.

9. The codec of claim 8 wherein each coset c in a coset-mapped block is decoded by:
selecting a corresponding value y from a noisy residual frame;
employing a Bayesian classifier to produce a decoded quantization bin $\hat{q}$;
estimating a residual-frame frequency-domain coefficient $\hat{x}$ from the decoded quantization bin $\hat{q}$: and transforming the residual-frame frequency-domain coefficient $\hat{x}$ to the spatial domain.

10. The codec of claim 9 wherein employing a Bayesian classifier to produce a decoded quantization bin $\hat{q}$ further comprises:

$$\hat{q} = \arg\max_{q \in \Omega_q : \psi(q,M) = c} p(q, y)$$

where p(q, y) is the joint probability of the quantization bin q and the value y obtained as $$p(q, y) = \int_{x_l(q)}^{x_h(q)} f_X(x) f_Z(y-x) dx$$

$$\approx \frac{\int_{x_l(q)}^{x_h(q)} f_X(x) dx}{x_h(q) - x_l(q)} \cdot \int_{x_l(q)}^{x_h(q)} f_Z(y-x) dx$$

$$= \frac{p_Q(q)}{x_h(q) - x_l(q)} \cdot \int_{x_l(q)}^{x_h(q)} f_Z(y-x) dx$$

$$= \frac{p_Q(q)}{x_h(q) - x_l(q)} [F_Z(x_h(q) - y) - F_Z(x_l(q) - y)].$$

11. The codec of claim 9 wherein estimating a residual-frame frequency-domain coefficient $\hat{x}$ from the decoded quantization bin $\hat{q}$ further comprises:

$$\hat{x} = E(x/y, \phi(x, Q) = \hat{q})$$
$$= E(x/y, x \in [x_l(\hat{q}), x_h(\hat{q})]$$

$$= \int_{x_l(\hat{q})}^{x_h(\hat{q})} x f_{X/Y}(x, y) dx.$$

12. The codec of claim 7 wherein coset-mapping is carried out using a trellis-based coset-mapping technique.

13. The codec of claim 6 wherein the decoder decodes a lower-resolution encoded signal without using additional compressed information to reconstruct a lower-resolution signal by:
entropy decoding the entropy-encoded bit stream to recover spatially and temporally encoded low-resolution non-reference frames and spatially encoded 1 reference frames; and
spatially decoding the spatially decoded reference frames.

14. The codec of claim 6 wherein the decoder decodes a lower-resolution encoded signal with additional compressed information to reconstruct a near-high-resolution signal by:
entropy decoding the entropy-encoded bit stream to recover spatially and temporally encoded low-resolution non-reference frames and the additional information;
spatially and temporally decoding the spatially and temporally encoded low-resolution non-reference frames to produce low-resolution reconstructed frames;
interpolating the low-resolution reconstructed frames to produce low-resolution interpolated frames; and
iteratively enhancing the low-resolution interpolated frames to produce near-high-resolution reconstructed frames by using the additional compressed information.

15. The codec of claim 14 wherein iteratively enhancing a low-resolution interpolated frame to produce a near-high-resolution reconstructed frame by using the additional compressed information further comprises:
setting a current near-high-resolution reconstructed frame equal to the low-resolution interpolated frame;
iteratively
applying, to the current near-high-resolution reconstructed frame, motion-based semi-super resolution processing to generate a higher-resolution estimated frame;
subtracting the higher-resolution estimated frame from the low-resolution interpolated frame to produce a noisy residual frame;
channel decoding the additional compressed information using the noisy residual frame as side information to produce a corrected residual frame; and
setting the current near-high-resolution reconstructed frame equal to a combination of the low-resolution interpolated frame and the corrected residual frame.

16. The codec of claim 15 wherein motion-based semi-super resolution processing further comprises:
low-pass filtering reconstructed reference frames to produce filtered reconstructed reference frames; and
for each block in the current near-high-resolution reconstructed frame,
when matching blocks can be found in the filtered reconstructed reference frames, inserting a replacement block for the block, generated by combining together equivalent matching blocks extracted from the reconstructed reference frames, into the higher-resolution estimated frame at a position in the higher-resolution estimated frame equivalent to the position of the block in the current near-high-resolution reconstructed frame; and when no matching blocks can be found in the filtered reconstructed reference frames, copying the block into the higher-resolution estimated frame at a position in the higher-resolution estimated frame equivalent to the position of the block in the current near-high-resolution reconstructed frame.

17. The codec of claim 16 wherein the replacement block is generated by adding a first equivalent matching block scaled by a scaler α to a second equivalent matching block scaled by 1−α.

18. The codec of claim 17 wherein α is determined by an optimization process.

19. Apparatus, comprising:
an encoder that encodes a received signal at a selectable level of computational complexity, wherein the encoder
encodes a first portion of the received signal at full resolution by temporal, spatial, and entropy coding techniques to produce a high-resolution encoded signal that can be subsequently used to reconstruct a high-resolution signal, and
encodes a second portion of the received signal at lower resolution to produce, for the second portion of the signal, a lower-resolution encoded signal and additional compressed information that can be subsequently used in combination with the lower-resolution encoded signal to reconstruct a near-high-resolution signal; and
a decoder that decodes a received, encoded signal at a selectable level of computational complexity, wherein the decoder
decodes the high-resolution encoded signal to reconstruct a high-resolution signal,
decodes the lower-resolution encoded signal with additional compressed information to reconstruct a near-high-resolution signal, and
decodes the lower-resolution encoded signal without using additional compressed information to reconstruct a lower-resolution signal;
wherein the division of computational complexity can be adjusted from a first asymmetrical division, in which the encoder bears a greater computational burden than the decoder by encoding the entire received signal at full resolution and the decoder decodes a portion of the high-resolution encoded signal to reconstruct the signal, to a second asymmetrical division in which the encoder bears a smaller computational burden than the decoder by encoding the first portion of the received signal at full resolution and the second portion of the signal at lower resolution and the decoder decodes the lower-resolution encoded signal without using the additional compressed information to reconstruct a lower-resolution signal.

20. A method, comprising:
encoding a received signal at a selectable level of computational complexity, wherein the encoding comprises
encoding a first portion of the received signal at full resolution by temporal, spatial, and entropy coding techniques to produce a high-resolution encoded signal that can be subsequently used to reconstruct a high-resolution signal, and
encoding a second portion of the received signal at lower resolution to produce, for the second portion of the signal, a lower-resolution encoded signal and additional compressed information that can be subsequently used in combination with the lower-resolution encoded signal to reconstruct a near-high-resolution signal; and
decoding a received, encoded signal at a selectable level of computational complexity, wherein the decoding comprises
decoding the high-resolution encoded signal to reconstruct a high-resolution signal,
decoding the lower-resolution encoded signal with additional compressed information to reconstruct a near-high-resolution signal, and
decoding the lower-resolution encoded signal without using additional compressed information to reconstruct a lower-resolution signal;
wherein the division of computational complexity can be adjusted from a first asymmetrical division, in which the encoding bears a greater computational burden than the decoding by encoding the entire received signal at full resolution and the decoding comprises decoding a portion of the high-resolution encoded signal to reconstruct the signal, to a second asymmetrical division in which the encoding bears a smaller computational burden than the decoding by encoding the first portion of the received signal at full resolution and the second portion of the signal at lower resolution and the decoding comprises decoding the lower-resolution encoded signal without using the additional compressed information to reconstruct a lower-resolution signal.

21. Apparatus, comprising:
an encoder that encodes a received signal at a selectable level of computational complexity, wherein the signal is a frame-based and pixel-based video signal and the encoder
encodes a first portion of the received signal at full resolution by temporal, spatial, and entropy coding techniques to produce a high-resolution encoded signal that can be subsequently used to reconstruct a high-resolution signal, and
encodes a second portion of the received signal at lower resolution to produce, for the second portion of the signal, a lower-resolution encoded signal and additional compressed information that can be subsequently used in combination with the lower-resolution encoded signal to reconstruct a near-high-resolution signal; and
a decoder that decodes a received, encoded signal at a selectable level of computational complexity, wherein the decoder
decodes the high-resolution encoded signal to reconstruct a high-resolution signal,
decodes the lower-resolution encoded signal with additional compressed information to reconstruct a near-high-resolution signal, and
decodes the lower-resolution encoded signal without using additional compressed information to reconstruct a lower-resolution signal;
wherein the encoder encodes a first portion of the received signal at full resolution by temporal, spatial, and entropy coding techniques and encodes a second portion of the received signal at lower resolution to produce, for the second portion of the signal, a lower-resolution encoded signal and additional compressed information by
partitioning the video signal into consecutive groups of frames,
for each group of frames, selecting a number of reference frames and a number of non-reference frames,
spatially encoding the reference frames,
spatially and temporally encoding a first number of the non-reference frames at full resolution, spatially and temporarily encoding a second number non-reference frames at lower resolution while producing additional compressed information, and entropy encoding the spatially encoded reference frames, the first number of non-reference frames spatially and temporally encoded at full resolution, and the second number of non-reference frames spatially and temporally encoded at lower resolution along with the additional compressed information to produce a compressed bit stream.

22. A method, comprising:

encoding a received signal at a selectable level of computational complexity, wherein the signal is a frame-based and pixel-based video signal and the encoding comprises encoding a first portion of the received signal at full resolution by temporal, spatial, and entropy coding techniques to produce a high-resolution encoded signal that can be subsequently used to reconstruct a high-resolution signal, and encoding a second portion of the received signal at lower resolution to produce, for the second portion of the signal, a lower-resolution encoded signal and additional compressed information that can be subsequently used in combination with the lower-resolution encoded signal to reconstruct a near-high-resolution signal; and decoding a received, encoded signal at a selectable level of computational complexity, wherein the decoding comprises decoding the high-resolution encoded signal to reconstruct a high-resolution signal, decoding the lower-resolution encoded signal with additional compressed information to reconstruct a near-high-resolution signal, and decoding the lower-resolution encoded signal without using additional compressed information to reconstruct a lower-resolution signal;

wherein the encoding encodes a first portion of the received signal at full resolution by temporal, spatial, and entropy coding techniques and encodes a second portion of the received signal at lower resolution to produce, for the second portion of the signal, a lower-resolution encoded signal and additional compressed information by partitioning the video signal into consecutive groups of frames, for each group of frames, selecting a number of reference frames and a number of non-reference frames, spatially encoding the reference frames, spatially and temporally encoding a first number of the non-reference frames at full resolution, spatially and temporarily encoding a second number non-reference frames at lower resolution while producing additional compressed information, and entropy encoding the spatially encoded reference frames, the first number of non-reference frames spatially and temporally encoded at full resolution, and the second number of non-reference frames spatially and temporally encoded at lower resolution along with the additional compressed information to produce a compressed bit stream.

* * * * *

UNITED STATES PATENT AND TRADEMARK OFFICE
CERTIFICATE OF CORRECTION

PATENT NO. : 8,184,712 B2
APPLICATION NO. : 11/415258
DATED : May 22, 2012
INVENTOR(S) : Debargha Mukherjee It is certified that error appears in the above-identified patent and that said Letters Patent is hereby corrected as shown below:

In column 13, line 40, after "codec." insert -- It should be noted that Figure 20 is not derived from actual implementation data, but is instead intended to illustrate division of computational burden graphically and very approximately. --.

In column 13, line 50, delete "functionality." and insert -- functionality, although not necessarily continuously, since different methods may need to be employed for different divisions. --, therefor.

In column 13, line 60, before "the extremes," delete "complexity allocations, but, at".

In column 13, line 63, delete "decoding/decompression." and
insert -- decoding/decompression under the constraints of a desired fidelity of
reconstruction and compression rate. --, therefor.

In column 30, line 63, in Claim 1, delete "decoding" and insert -- decoding, --, therefor.

In column 31, line 6, in Claim 1, before "a" delete "signal" and insert -- signal, --, therefor.

In column 31, line 49, in Claim 2, delete "deceasing" and insert -- decreasing --, therefor.

In column 31, line 54, in Claim 3, delete "decoding" and insert -- decoding, --, therefor.

In column 31, line 57, in Claim 3, delete "sixel-based" and insert -- pixel-based --, therefor.

In column 31, line 65, in Claim 3, delete "ortion" and insert -- portion --, therefor.

In column 31, line 66, in Claim 3, delete "signal" and insert -- signal, --, therefor.

In column 31, line 66, in Claim 3, delete "sinal" and insert -- signal --, therefor.

Signed and Sealed this
Twelfth Day of March, 2013

Teresa Stanek Rea
*Acting Director of the United States Patent and Trademark Office*

In column 32, line 28, in Claim 3, after "number" insert -- of the --.

In column 37, line 1, in Claim 21, after "number" insert -- of the --.

In column 38, line 20, in Claim 22, after "number" insert -- of the --.